(12) United States Patent
Mostafalu et al.

(10) Patent No.: US 11,062,679 B2
(45) Date of Patent: Jul. 13, 2021

(54) IMAGING DEVICES AND IMAGING APPARATUSES, AND METHODS FOR THE SAME

(71) Applicant: Sony Semiconductor Solutions Corporation, Kanagawa (JP)

(72) Inventors: Pooria Mostafalu, Penfield, NY (US); Sungin Hwang, Pittsford, NY (US); Frederick Brady, Webster, NY (US)

(73) Assignee: Sony Semiconductor Solutions Corporations, Kanagawa (JP)

( * ) Notice: Subject to any disclaimer, the term of this patent is extended or adjusted under 35 U.S.C. 154(b) by 0 days.

(21) Appl. No.: 16/563,548

(22) Filed: Sep. 6, 2019

(65) Prior Publication Data
US 2021/0074241 A1    Mar. 11, 2021

(51) Int. Cl.
G09G 5/12    (2006.01)
G09G 3/36    (2006.01)
G09G 3/3258  (2016.01)

(52) U.S. Cl.
CPC ............ *G09G 5/12* (2013.01); *G09G 3/3258* (2013.01); *G09G 3/3696* (2013.01); *G09G 2310/0289* (2013.01)

(58) Field of Classification Search
None
See application file for complete search history.

(56) References Cited

U.S. PATENT DOCUMENTS

| 9,853,085 | B2* | 12/2017 | Imoto | H01L 27/14612 |
| 2016/0329375 | A1* | 11/2016 | Imoto | H01L 27/1463 |
| 2017/0017285 | A1* | 1/2017 | Kurokawa | G06G 7/00 |
| 2018/0152644 | A1 | 5/2018 | Kondo et al. | |
| 2018/0220086 | A1* | 8/2018 | Hynecek | H04N 5/3592 |
| 2018/0308895 | A1 | 10/2018 | Kim et al. | |
| 2020/0244900 | A1* | 7/2020 | Hynecek | H04N 5/3559 |

FOREIGN PATENT DOCUMENTS

WO    WO 2019/135304    7/2019

* cited by examiner

*Primary Examiner* — James M Hannett
(74) *Attorney, Agent, or Firm* — Sheridan Ross P.C.

(57) ABSTRACT

An imaging device includes a first pixel. The first pixel includes a first photoelectric conversion region disposed in a first substrate and that converts incident light into first electric charges. The first pixel includes a first readout circuit including a first converter that converts the first electric charges into a first logarithmic voltage signal. The imaging device includes at least one bonding pad on the first substrate and in electrical contact with the first converter. The at least one bonding pad overlaps at least part of the first pixel.

19 Claims, 53 Drawing Sheets

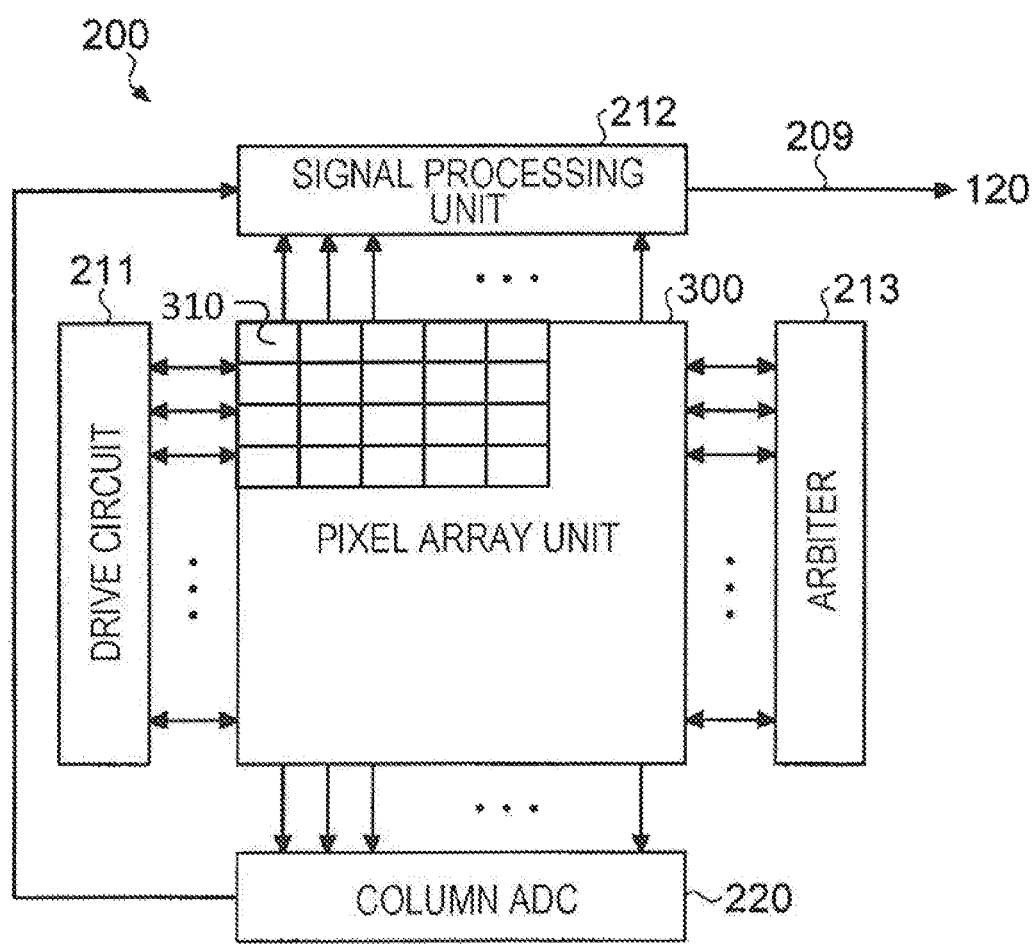

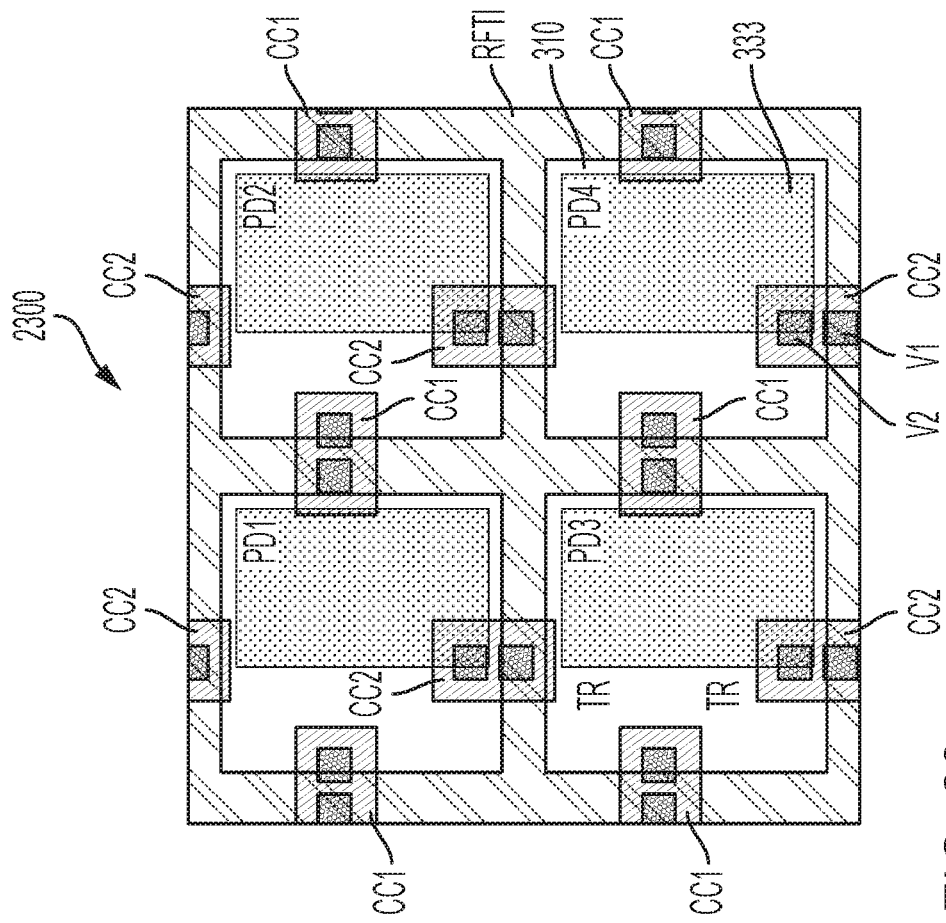
FIG. 23
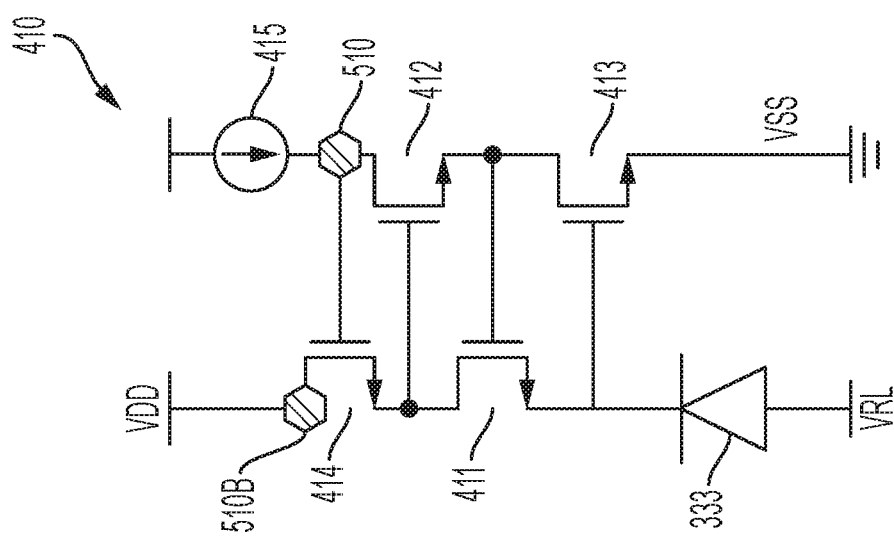

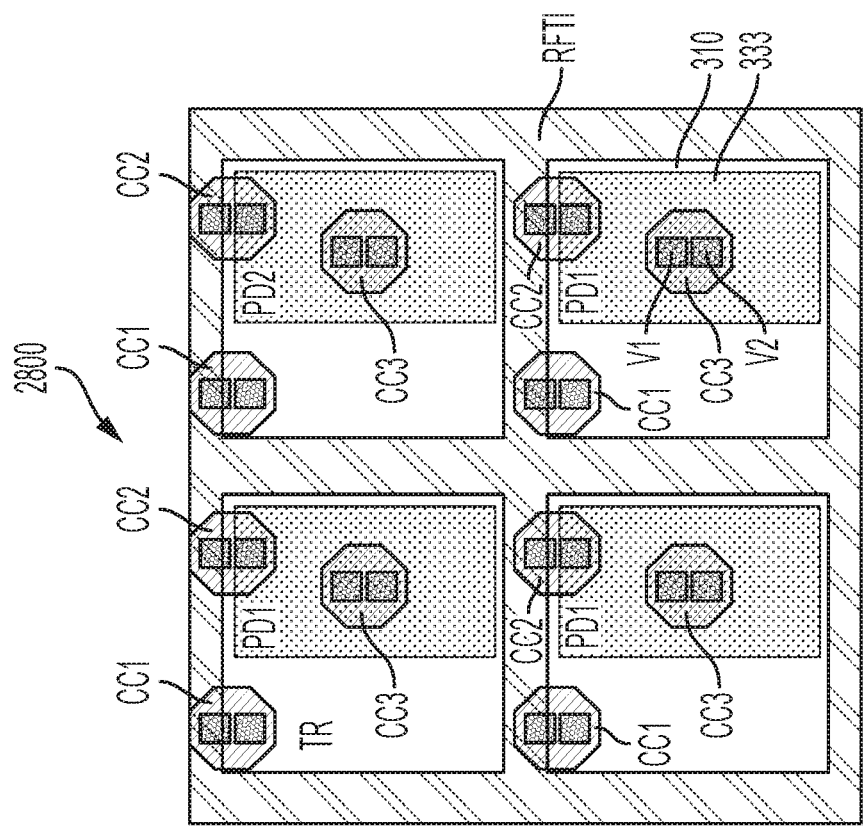
FIG. 28
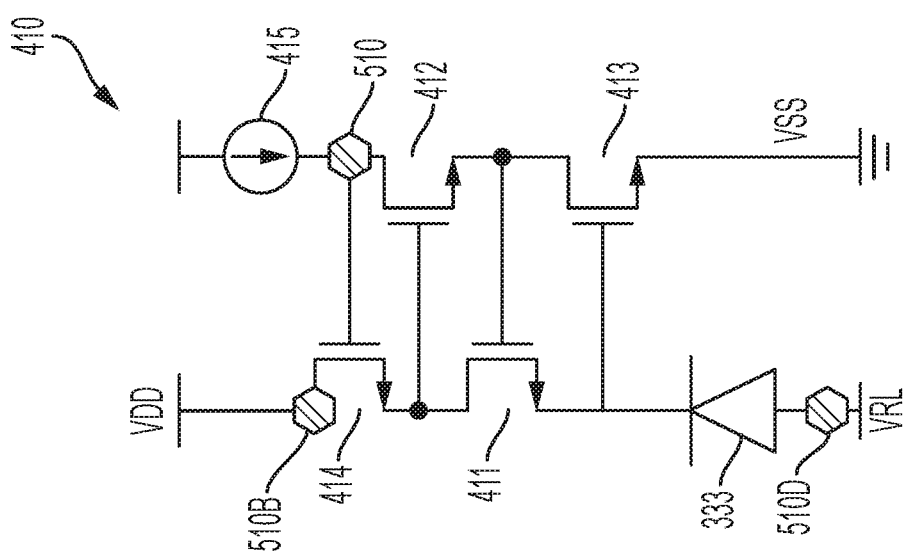

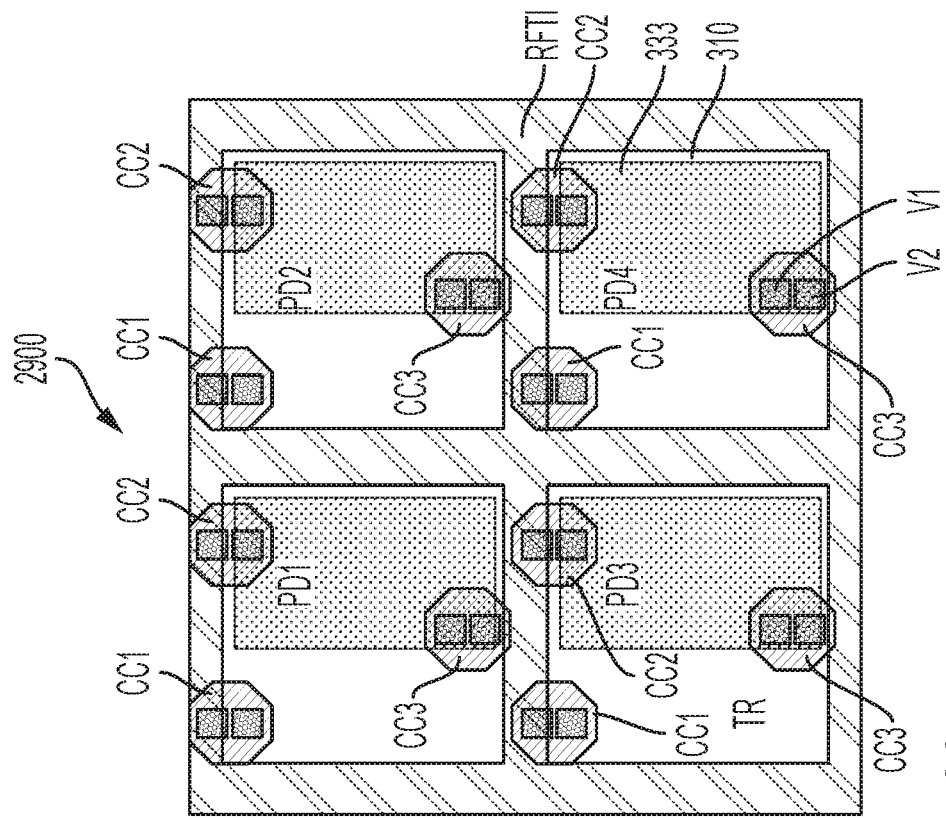
FIG. 29
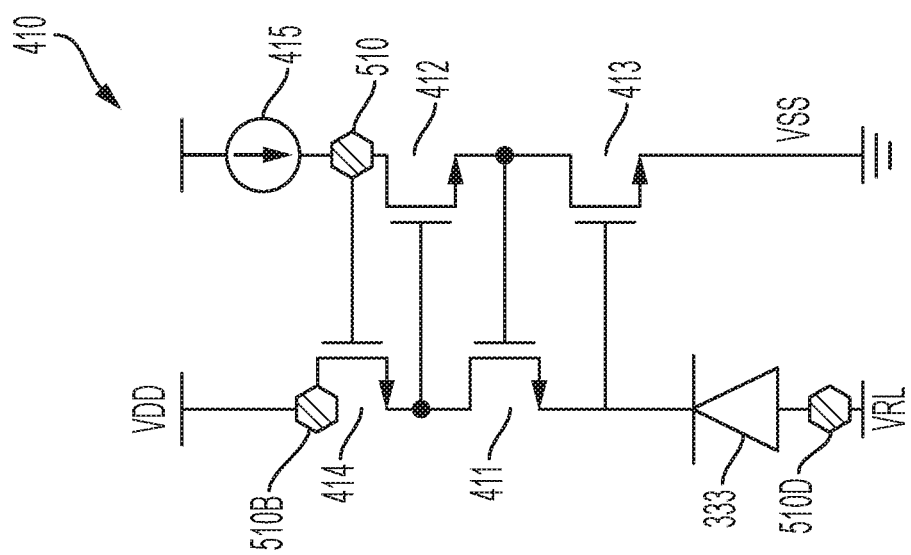

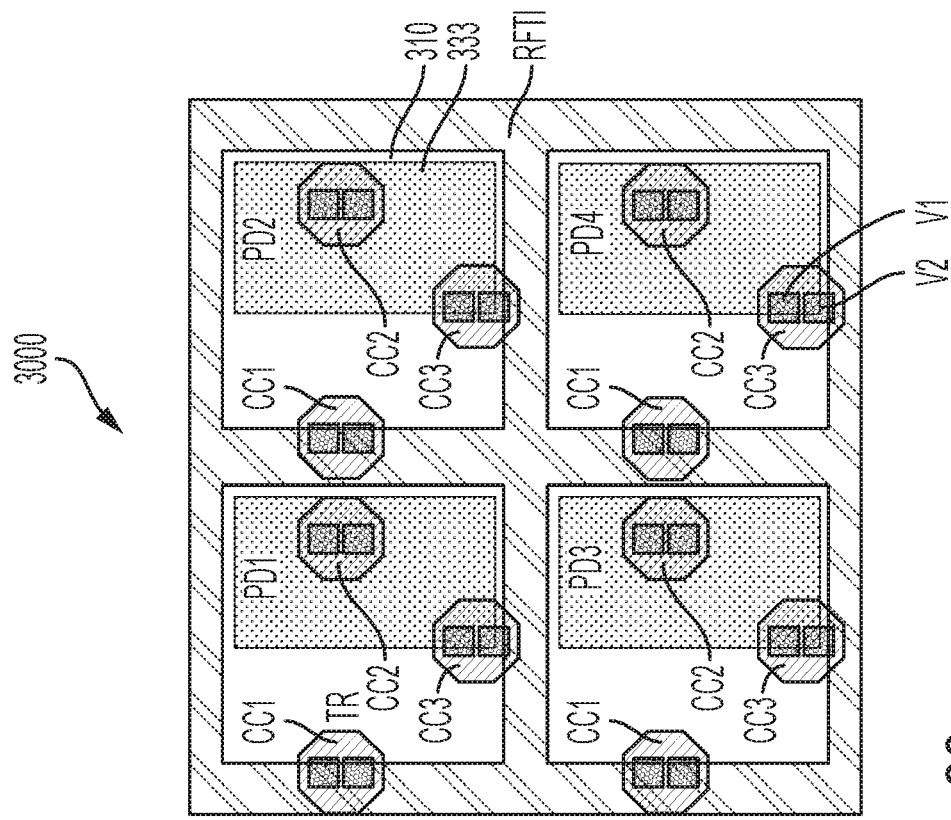
FIG. 30
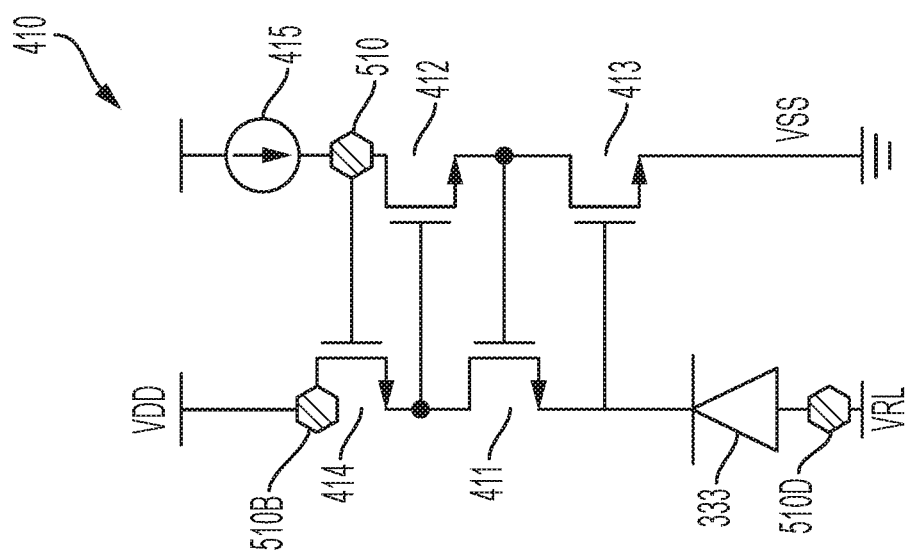

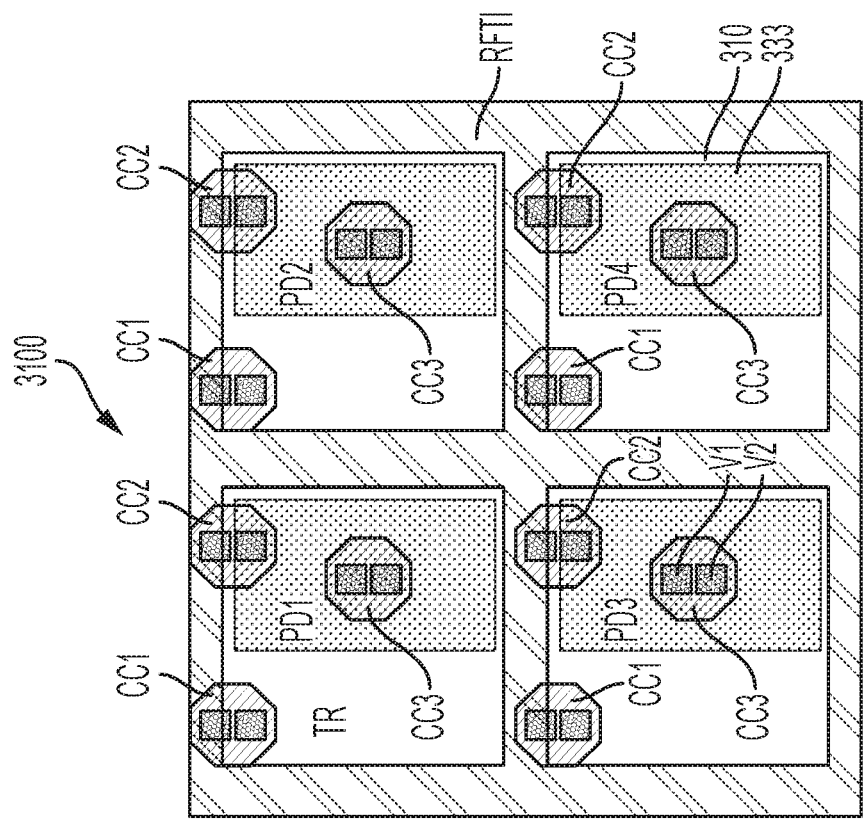
FIG. 31
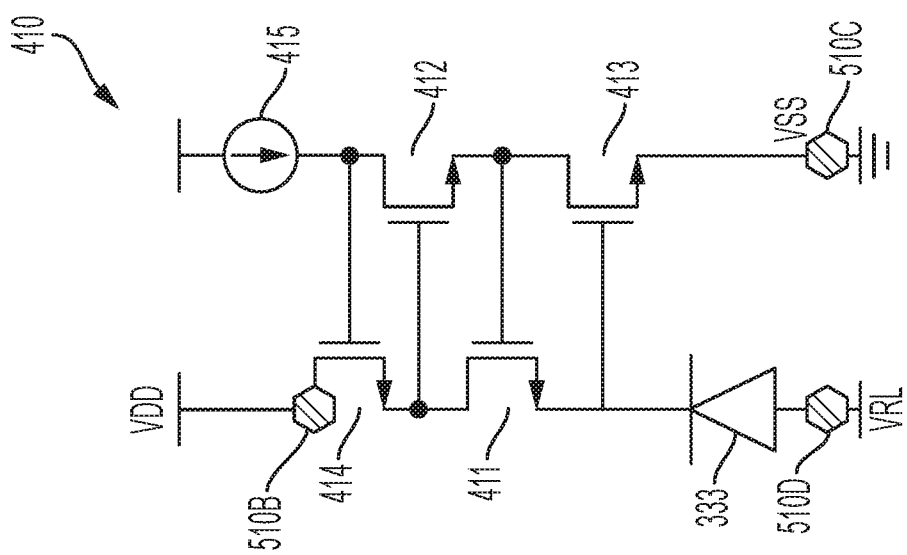

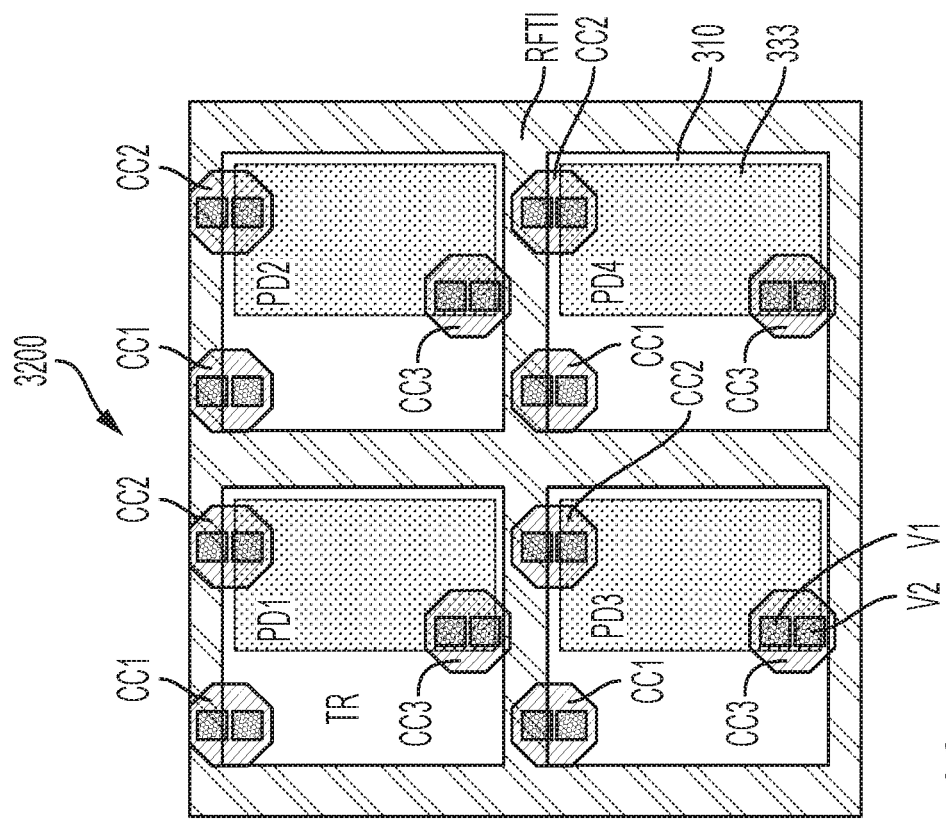
FIG. 32
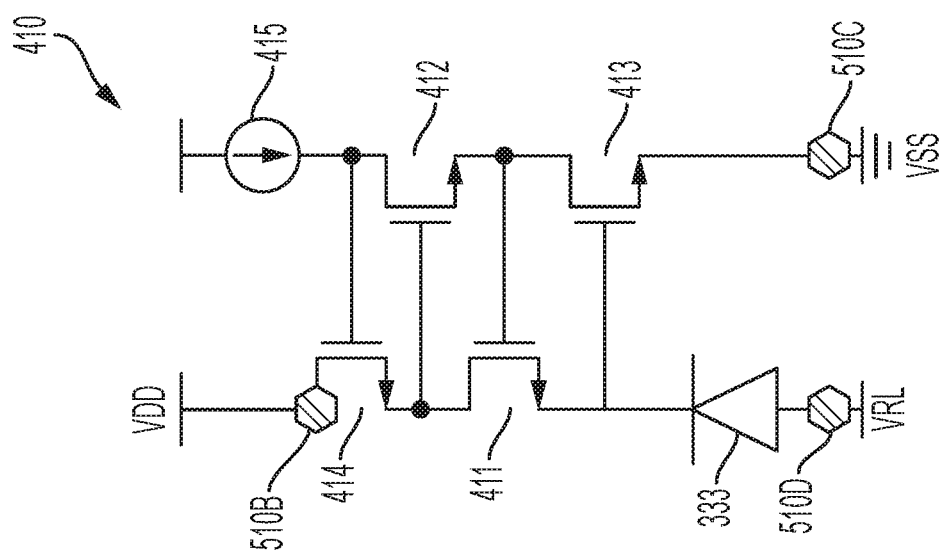

IMAGING DEVICES AND IMAGING APPARATUSES, AND METHODS FOR THE SAME

TECHNICAL FIELD

The present disclosure relates to an imaging device with dynamic vison sensor capabilities.

BACKGROUND

In the related art, a synchronization-type imaging device that captures image data in synchronization with a synchronization signal such as a vertical synchronization signal has been used in an imaging device and the like. In the typical synchronization-type imaging device, it is difficult to acquire image data for every period of the synchronization signal (for example, for every 1/60 seconds), and thus it is difficult to cope with cases in which relatively high-speed processing is demanded, such as in fields demanding high speed (e.g. real time) processing, such as autonomous vehicles, robotics, and the like.

SUMMARY

Technical Problem

At least one example embodiment provides a non-synchronization-type imaging device in which a detection circuit is provided for every pixel to detect a situation in which a light contrast exceeds a threshold value as an address event in real time. The non-synchronization-type imaging device that detects the address event for every pixel is also referred to as a dynamic vision sensor (DVS). A DVS system uses a circuit configuration for detecting the address event in addition to a circuit configuration for reading out a pixel signal of a voltage value corresponding to a light-reception amount, and thus an occupation ratio of a light-receiving element on a light-receiving surface decreases because these two circuit configurations are formed in the same substrate as the light-receiving element. Such 2-D architecture results in bottlenecks due to wiring congestion that causes reduced design flexibility, increased dark noise, and/or limited sensitivity and speed.

Therefore, example embodiments provide imaging devices which are capable of reducing noise, providing more design flexibility, and/or improving sensitivity and speed.

Solution to Problem

At least one example embodiment is directed to an imaging device including a first pixel including a first photoelectric conversion region disposed in a first substrate and that converts incident light into first electric charges, and a first readout circuit including a first converter that converts the first electric charges into a first logarithmic voltage signal. The imaging device includes at least one bonding pad on the first substrate and in electrical contact with the first converter, and the at least one bonding pad overlaps at least part of the first pixel.

In at least one example embodiment, the first converter includes a first portion disposed in the first substrate, and the first portion includes a transistor coupled to the first photoelectric conversion region. In a plan view, a source of the transistor is wider than a drain of the transistor.

In at least one example embodiment, the imaging device includes a second substrate bonded to the first substrate via the at least one bonding pad. The first converter includes a second portion disposed in the second substrate.

In at least one example embodiment, the first portion includes a node coupled to the photoelectric conversion region. The second portion includes a plurality of transistors coupled to the node through the at least one first bonding pad.

In at least one example embodiment, the imaging device includes a plurality of vias disposed in the first substrate and in electrical contact with the at least one bonding pad and the first converter.

In at least one example embodiment, the first converter is disposed in the first substrate. The at least one bonding pad includes a first bonding pad in electrical contact with a first node of the first converter, and a second bonding pad in electrical contact with a second node of the first converter.

In at least one example embodiment, the first node is a power supply node of the first converter that receives a power supply signal, and the second node is an output node of the first converter that outputs an output signal to another component of the first readout circuit.

In at least one example embodiment, the at least one bonding pad includes a third bonding pad in electrical contact with a third node of the first converter. The third node is an anode of the photoelectric conversion region or a ground node of the first converter that receives a ground signal or a common signal.

In at least one example embodiment, the first node is an anode of the photoelectric conversion region, and the second node is a ground node of the first converter that receives a ground signal or a common signal.

In at least one example embodiment, the at least one bonding pad includes a third bonding pad in electrical contact with a third node of the first converter. The third node is power supply node of the first converter that receives a power supply signal or an output node of the first converter that outputs an output signal to another component of the first readout circuit.

In at least one example embodiment, the at least one bonding pad includes a third bonding pad in electrical contact with a third node of the first converter, and a fourth bonding pad in electrical contact with a fourth node of the first converter.

In at least one example embodiment, the third node is a power supply node of the first converter that receives a power supply voltage. The fourth node is output node of the first converter that outputs an output signal to another component of the first readout circuit.

In at least one example embodiment, the imaging device further includes a second readout circuit. The first readout circuit controls the second readout circuit.

At least one example embodiment is directed to an imaging device including a first pixel. The first pixel includes a first photoelectric conversion region disposed in a first substrate and that converts incident light into first electric charges, and a first readout circuit including a first converter that converts the first electric charges into a first logarithmic voltage signal. The imaging device includes at least one first bonding pad on the first substrate and in electrical contact with the first converter, and the at least one first bonding pad overlaps at least part of the first pixel. The imaging device includes a second pixel adjacent to the first pixel. The second pixel includes a second photoelectric conversion region disposed in the first substrate and that converts incident light into second electric charges, and a second readout circuit including a second converter that converts the second electric charges into a second logarithmic voltage signal. The imaging device includes at least one second bonding pad on the first substrate and in electrical contact with the second converter, and the at least one second bonding pad overlaps at least part of the second pixel.

In at least one example embodiment, the imaging device further includes an isolation region disposed in the first substrate between the first pixel and the second pixel.

In at least one example embodiment, the at least one first bonding pad includes a first plurality of bonding pads electrically connected to respective first nodes of the first converter. The at least one second bonding pad includes a second plurality of bonding pads electrically connected to respective second nodes of the second converter.

In at least one example embodiment, one of the second plurality of bonding pads overlaps the at least part of the second pixel and the isolation region.

In at least one example embodiment, the one of the second plurality of bonding pads overlaps part of the first pixel.

At least one example embodiment is directed to an imaging device including a first pixel. The first pixel includes a first photoelectric conversion region disposed in a first substrate and that converts incident light into first electric charges, and a first readout circuit including a first converter that converts the first electric charges into a first logarithmic voltage signal. The imaging device includes a plurality of first bonding pads on the first substrate and in electrical contact with respective nodes of the first converter, each of the plurality of first bonding pads overlapping at least part of the first pixel.

In at least one example embodiment, the respective nodes of the first converter include two or more of a power supply node that receives a power supply voltage, an output node that outputs an output signal to another component of the first readout circuit, an anode of the first photoelectric conversion region, and a ground node that receives a ground signal or a common signal.

BRIEF DESCRIPTION OF DRAWINGS

FIG. 3A is a block diagram illustrating a functional configuration example of an imaging device according to at least one example embodiment.

FIG. 23 illustrates an example schematic of the converter in FIG. 5B and an example layout of a bonding pad configuration to electrically connect circuitry in the logic chip to each pixel according to at least one example embodiment.

FIG. 28 illustrates an example schematic of the converter in FIG. 5B and an example layout of a bonding pad configuration to electrically connect circuitry in the logic chip to each pixel according to at least one example embodiment.

FIG. 29 illustrates an example schematic of the converter in FIG. 5B and an example layout of a bonding pad configuration to electrically connect circuitry in the logic chip to each pixel according to at least one example embodiment.

FIG. 30 illustrates an example schematic of the converter in FIG. 5B and an example layout of a bonding pad configuration to electrically connect circuitry in the logic chip to each pixel according to at least one example embodiment.

FIG. 31 illustrates an example schematic of the converter in FIG. 5B and an example layout of a bonding pad configuration to electrically connect circuitry in the logic chip to each pixel according to at least one example embodiment.

FIG. 32 illustrates an example schematic of the converter in FIG. 5B and an example layout of a bonding pad configuration to electrically connect circuitry in the logic chip to each pixel according to at least one example embodiment.

DESCRIPTION OF EMBODIMENTS

Figure 1:
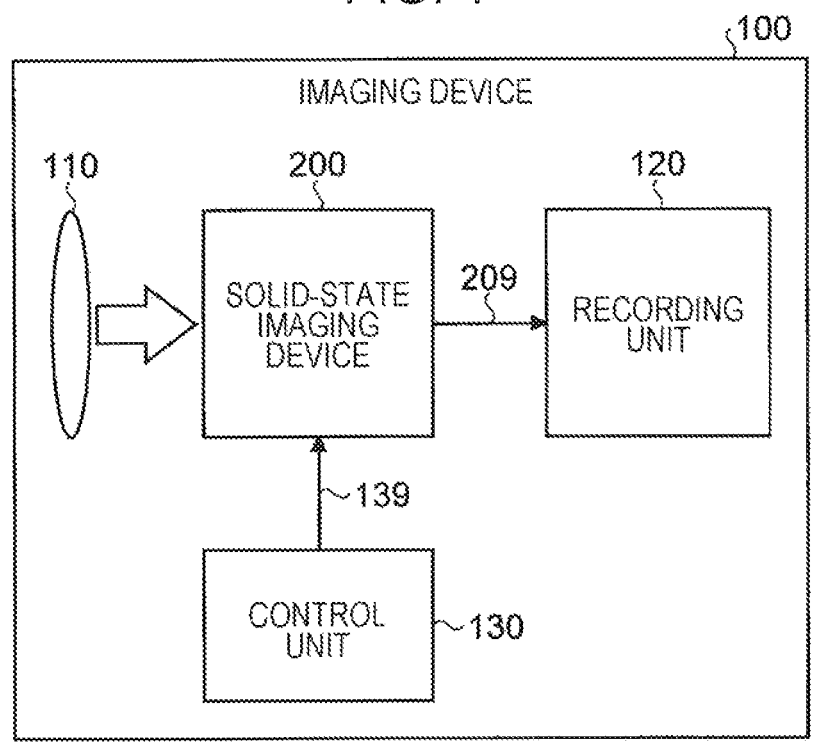
FIG. 1 is a block diagram illustrating a schematic configuration example of an imaging device according to at least one example embodiment.

Hereinafter, an embodiment of the present disclosure will be described in detail on the basis of the accompanying drawings. Furthermore, in the following embodiments, the same reference numeral will be given to the same portion, and redundant description thereof will be omitted.

A typical dynamic vision sensor (DVS) employs a so-called event-driven type driving method in which the existence or nonexistence of address event ignition is detected for every unit pixel, and a pixel signal is read out from a unit pixel in which the address event ignition is detected.

Furthermore, the unit pixel in this description represents a minimum unit of a pixel including one photoelectric conversion element (also referred to as "light-receiving element"), and can correspond to each dot in image data that is read out from an image sensor as an example. In addition, the address event represents an event that occurs for every address that is allocable to each of a plurality of the unit pixels which are arranged in a two-dimensional lattice shape. An example of an address event includes an event in which a current value of a photocurrent based on a charge generated in the photoelectric conversion element or a variation amount thereof exceeds a desired constant threshold value. That is, a DVS device may respond to changes in intensity of light asynchronously. The change in intensity of light is correlated with a change in photocurrent, and if the change in photocurrent exceeds a desired threshold, an event may be detected.

FIG. 1 is a block diagram illustrating a schematic configuration example of an imaging device according to at least some embodiments of the present disclosure. As illustrated in FIG. 1, for example, a device 100 includes an imaging lens 110, a solid-state imaging device (or imaging device) 200, a recording unit (or memory) 120, and a control unit (or controller) 130. As examples, the device 100 can be provided as or as part of a camera that is mounted in an industrial robot, an in-vehicle camera, and the like are assumed.

The imaging lens 110 can include an optical system that condenses incident light and images an image of the incident light on a light-receiving surface of the imaging device 200. The light-receiving surface is a surface on which photoelectric conversion elements in the imaging device 200 are arranged. The imaging device 200 photoelectrically converts the incident light to generate image data. In addition, the imaging device 200 can execute predetermined signal processing such as noise removal and white balance adjustment with respect to the generated image data. A result obtained by the signal processing and a detection signal indicating the existence or nonexistence of an address event ignition (or event) is output to the recording unit 120 through a signal line 209. Furthermore, a method of generating the detection signal indicating the existence or nonexistence of the address event ignition will be described later.

The recording unit 120 is, for example, constituted by a flash memory, a dynamic random access memory (DRAM), a static random access memory (SRAM), or the like, and records data input from the imaging device 200.

The control unit 130 is, for example, constituted by a central processing unit (CPU) and the like, and outputs various instructions through a signal line 139 to control respective units such as the imaging device 200 in the device 100.

Next, a configuration example of the imaging device 200 will be described in detail with reference to the accompanying drawings.

Figure 2:
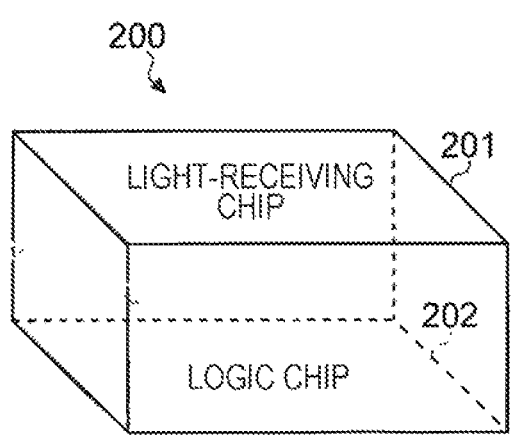
FIG. 2 is a view illustrating a lamination structure example of an imaging device according to according to at least one example embodiment.

FIG. 2 is a view illustrating a lamination structure example of an imaging device in accordance with at least some embodiments of the present disclosure. As illustrated in FIG. 2, the imaging device 200 can have a structure in which a light-receiving chip (or substrate) 201 and a logic chip (or substrate) 202 are vertically laminated. In joining of the light-receiving chip 201 and the logic chip 202, for example, so-called direct joining in which joining surfaces of the chips are planarized, and the chips are laminated with an inter-electron force can be used. However, there is no limitation thereto, and for example, so-called Cu—Cu joining in which copper (Cu) electrode pads formed on joining surfaces are bonded, bump joining, and the like can also be used.

In addition, the light-receiving chip 201 and the logic chip 202 are electrically connected to each other, for example, through a connection portion such as a through-silicon via (TSV) that penetrates through a semiconductor substrate. In the connection using the TSV, for example, a so-called twin TSV method in which two TSVs including a TSV that is formed in the light-receiving chip 201 and a TSV that is formed from the light-receiving chip 201 to the logic chip 202 are connected to each other on chip external surfaces, a so-called shared TSV method in which the light-receiving chip 201 and the logic chip 202 are connected with a TSV that penetrates through both the chips, and the like can be employed.

However, in the case of using the Cu—Cu joining or the bump joining in the joining of the light-receiving chip 201 and the logic chip 202, both the light-receiving chip 201 and the logic chip 202 are electrically connected to each other through a Cu—Cu joint or a bump joint.

FIG. 3A is a block diagram illustrating a functional configuration example of the imaging device according to at least some embodiments of the present disclosure. As illustrated in FIG. 3A, the imaging device 200 includes a drive circuit 211, a signal processing unit (or signal processor) 212, an arbiter 213, a column ADC 220, and a pixel array unit 300.

A plurality of unit cells or unit pixels (or pixels) 310 are arranged in the pixel array unit (or pixel array) 300 in a two-dimensional lattice shape. Details of the unit pixels 310 will be described later. For example, each of the unit pixels 310 includes a photoelectric conversion element (or photoelectric conversion region) such as a photodiode, and a circuit that generates a pixel signal of a voltage value corresponding to the amount of charges generated in the photoelectric conversion element (hereinafter, referred to as a pixel circuit or a pixel imaging signal generation readout circuit). Here, the pixel circuit may be shared by a plurality of photoelectric conversion elements. In this case, the unit pixels 310 each includes one photoelectric conversion element and a pixel circuit that is shared.

The plurality of unit pixels 310 are arranged in the pixel array unit 300 in a two-dimensional lattice shape. The plurality of unit pixels 310 may be grouped into a plurality pixel blocks, each including a desired number of unit pixels. Hereinafter, an assembly of unit pixels which are arranged in a horizontal direction is referred to as "row", and an assembly of unit pixels which are arranged in a direction orthogonal to the row is referred to as "column".

Each of the unit pixels 310 generates charges corresponding to an amount of light received at the respective photoelectric conversion element. In addition, the unit pixels 310, alone or in combination with one or more other unit pixels 310 in the same group, can be operated to detect the existence or nonexistence of address event ignition on the basis of whether or not a value of a current (hereinafter, referred to as a photocurrent) by charges generated in the photoelectric conversion element or a variation amount thereof exceeds a predetermined threshold value. In addition, when the address event is ignited, a request for reading out a pixel signal of a voltage value corresponding to the light-reception amount of the photoelectric conversion element is output to the arbiter 213.

The drive circuit 211 drives each of the unit pixels 310, and allows each of the unit pixels 310 to output a pixel signal to the column ADC 220.

The arbiter 213 arbitrates a request from each of the unit pixels, and transmits a predetermined response to the unit pixel 310 which issues the request on the basis of the arbitration result. The unit pixel 310 which receives the response supplies a detection signal indicating the existence or nonexistence of the address event ignition (hereinafter, simply referred to as "address event detection signal") to the drive circuit 211 and the signal processing unit 212.

For every unit pixel 310 column, the column ADC 220 converts an analog pixel signal from the column into a digital signal. In addition, the column ADC 220 supplies a digital signal generated through the conversion to the signal processing unit 212.

The signal processing unit 212 executes predetermined signal processing such as correlated double sampling (CDS) processing (noise removal) and white balance adjustment with respect to the digital signal transmitted from the column ADC 220. In addition, the signal processing unit 212 supplies a signal processing result and an address event detection signal to the recording unit 120 through the signal line 209.

In the configuration illustrated in FIG. 3A, for example, the pixel array unit 300 is constituted by an assembly of unit pixels which receive wavelength components to reconstruct a color. For example, in the case of reconstructing a color on the basis of three primary colors of RGB, in the pixel array unit 300, a unit pixel 310 that receives light of a red (R) color, a unit pixel 310 that receives light of a green (G) color, and a unit pixel 310 that receives light of a blue (B) color are arranged in a predetermined color filter array.

Examples of the color filter array include various arrays such as a Bayer array of 2×2 pixels, a color filter array of 3×3 pixels which is employed in an X-Trans (registered trademark) CMOS sensor (hereinafter, also referred to as "X-Trans (registered trademark) type array"), a Quad Bayer array of 4×4 pixels (also referred to as "Quadra array"), and a color filter of 4×4 pixels in which a white RGB color filter is combined to the Bayer array (hereinafter, also referred to as "white RGB array"). Here, in the following description, a case where the Bayer Array is employed as the color filter array will be exemplified. However, example embodiments are not limited to the pixel array unit 300 having color filters. For example, in the event that color detection is not desired, color filters may be omitted from the pixels 310. In this case, the imaging device 200 may be used for detecting events without color information (see FIG. 3B). In at least one example embodiment, the pixels 310 may include a different type of optical filter, such as an infrared (IR) cut filter.

Figure 3B:
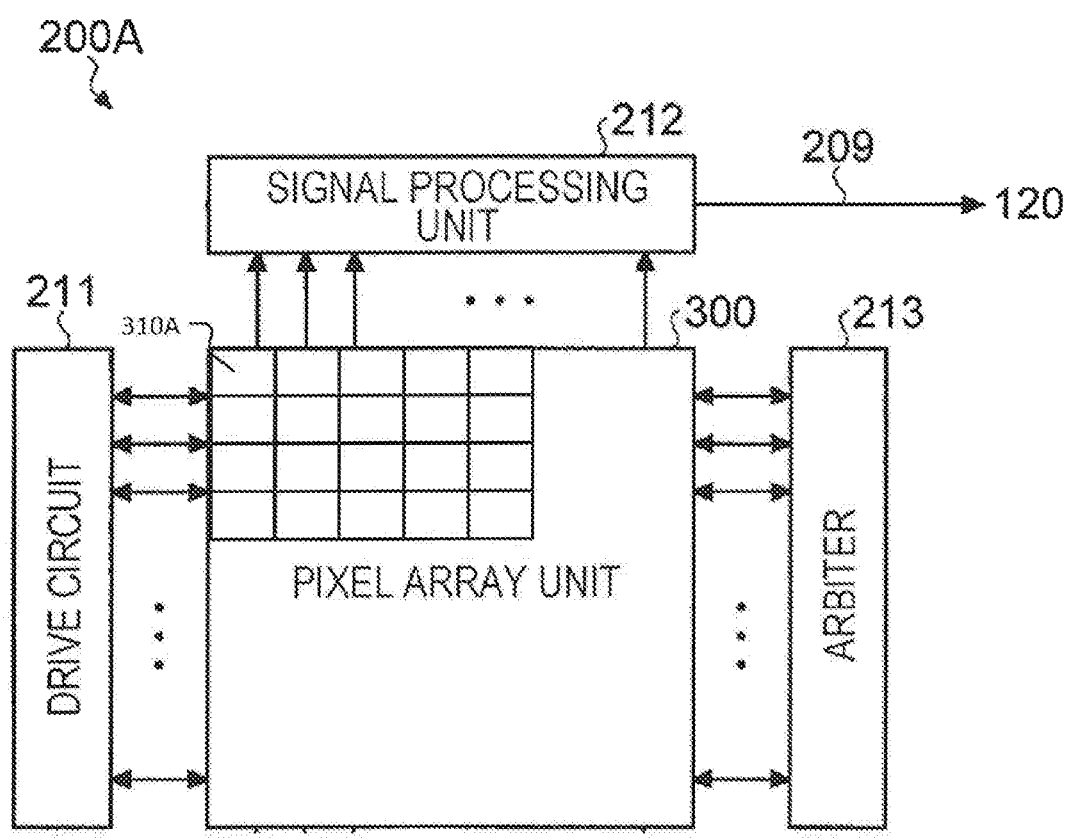
FIG. 3B is a block diagram illustrating a functional configuration example of an imaging device according to at least one example embodiment.
Figure 5A:
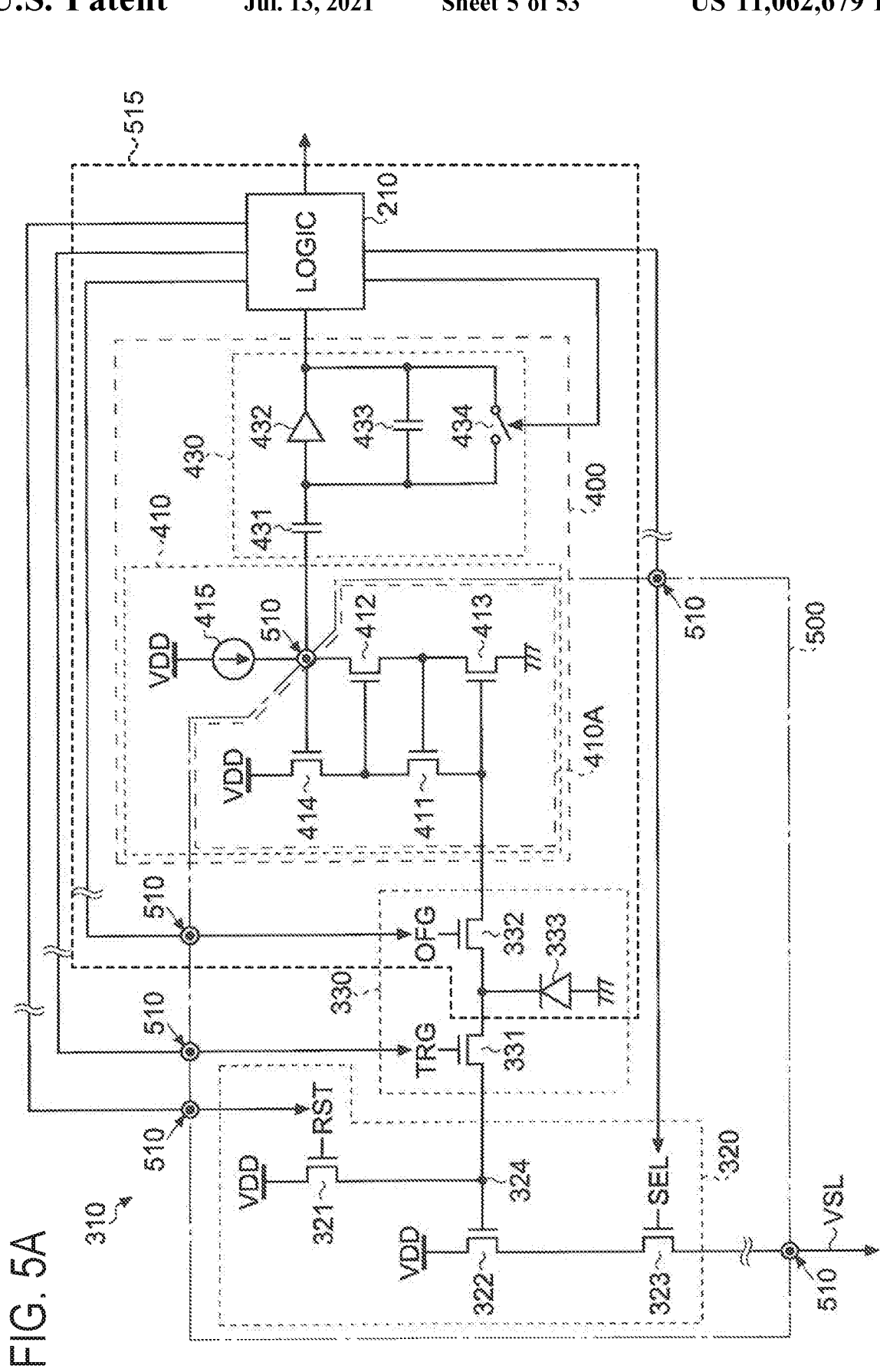
FIG. 5A is a circuit diagram illustrating a schematic configuration example of a unit pixel according to at least one example embodiment.
Figure 5B:
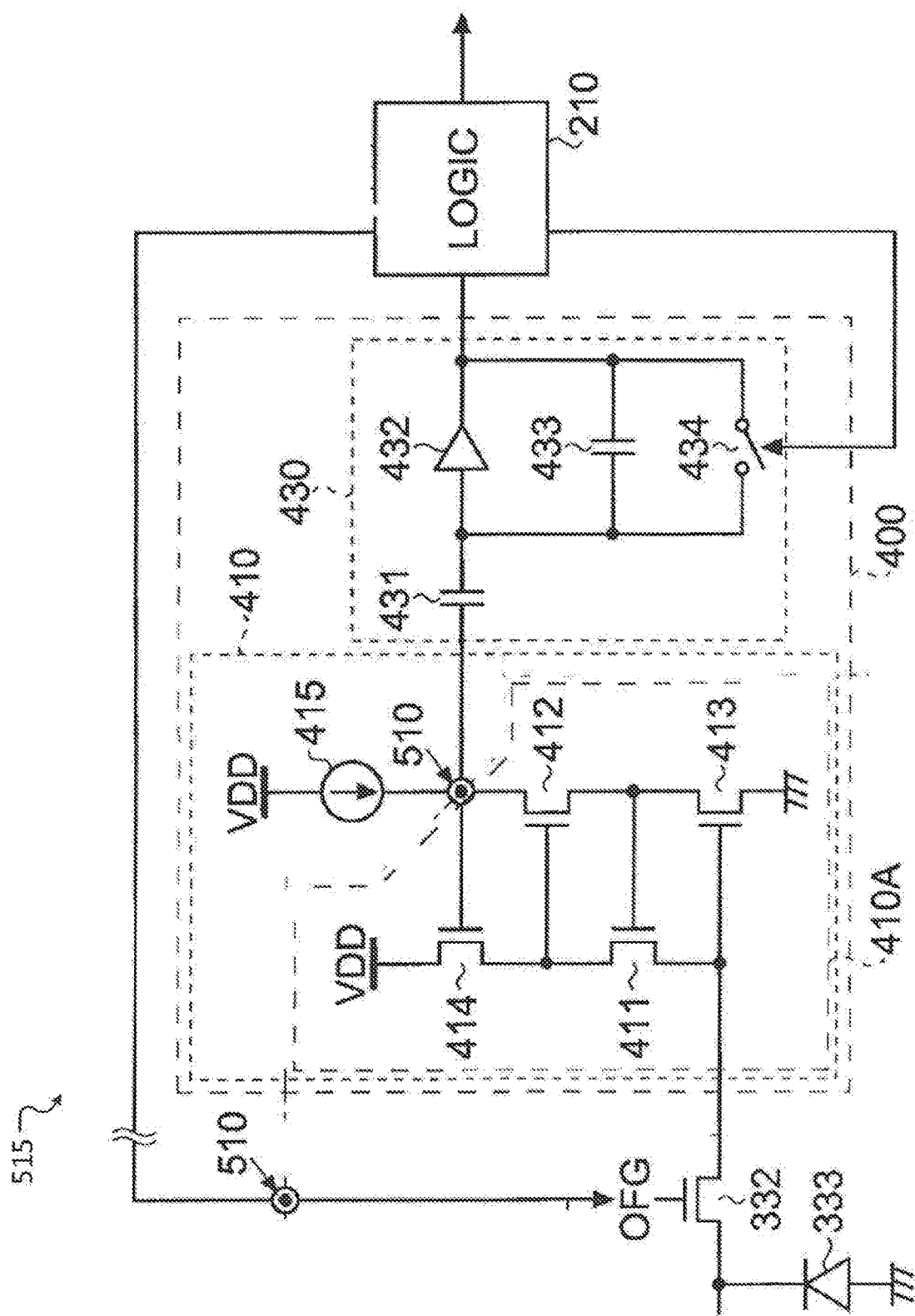
FIG. 5B is a circuit diagram illustrating a schematic configuration example of a unit pixel according to at least one example embodiment.
Figure 10A:
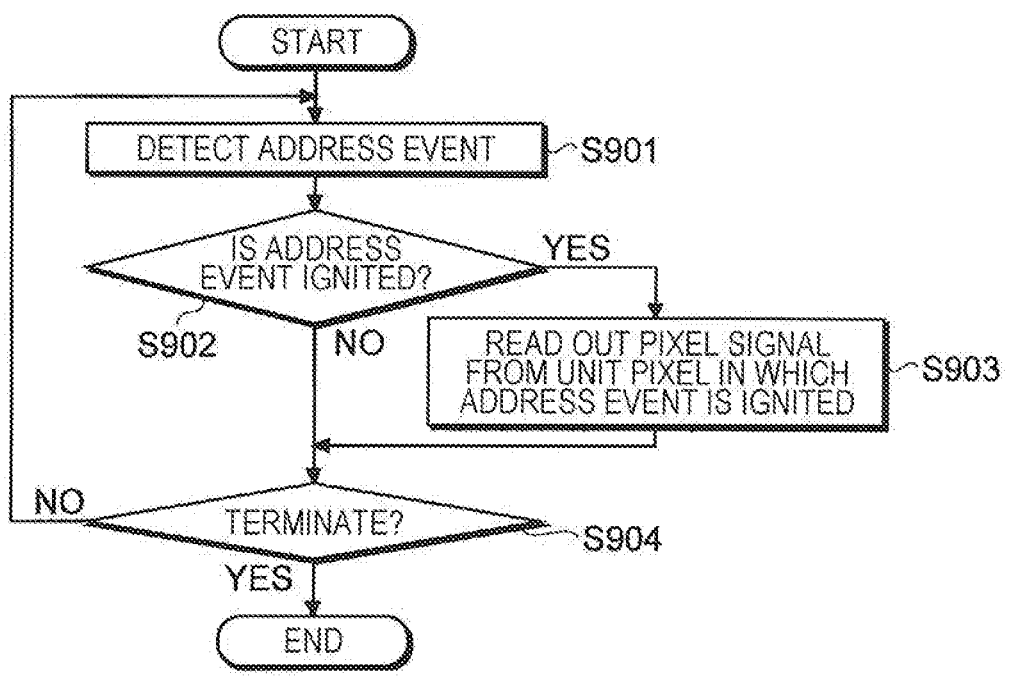
FIG. 10A is a flowchart illustrating an example of the operation of an imaging device according to at least one example embodiment.
Figure 10B:
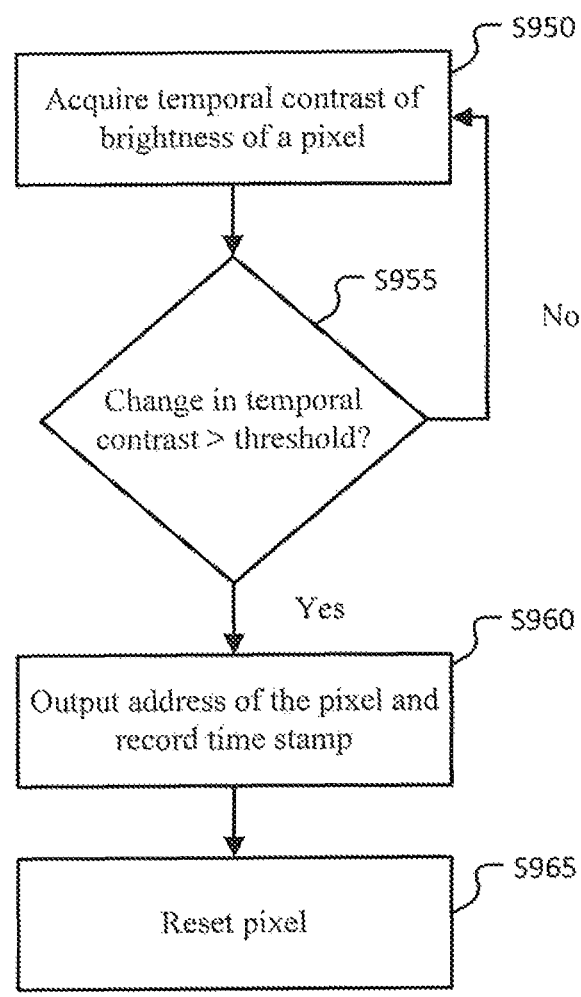
FIG. 10B is a flowchart illustrating an example of the operation of an imaging device according to at least one example embodiment.

FIG. 3B is a block diagram illustrating a functional configuration example of an imaging device 200A according to at least one example embodiment. The imaging device 200A in FIG. 3B is the same as or similar to the imaging device 200 FIG. 3A except that FIG. 3B does not include the column ADC 220. As such, FIG. 3B may be useful for event detection only applications (i.e., applications where color detection is not desired). FIG. 5B illustrates circuitry for a pixel 310A in FIG. 3B, and FIG. 10B illustrates example operations for the imaging device 200A.

Figure 4:
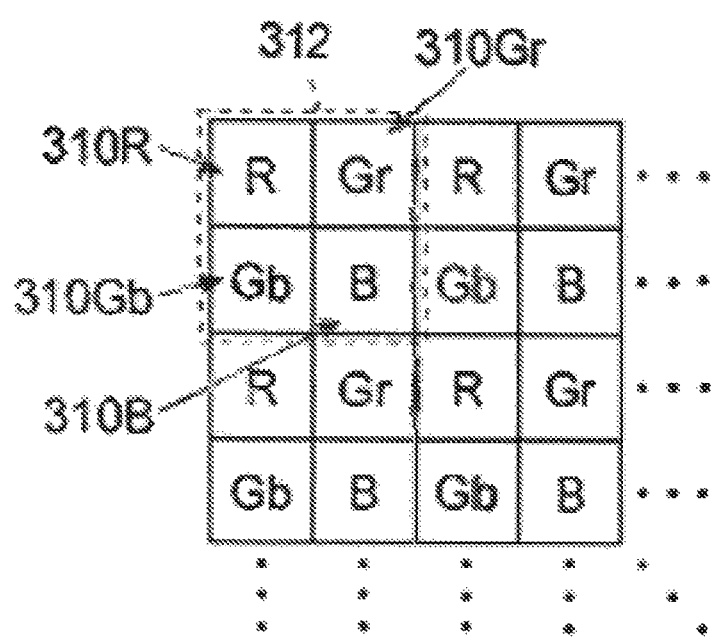
FIG. 4 is a schematic view illustrating an array example of unit pixels according to at least one example embodiment in a case of employing a Bayer array in a color filter array.

FIG. 4 is a schematic view illustrating an array example of unit pixels in the case of employing the Bayer array in the color filter array. As illustrated in FIG. 4, in the case of employing the Bayer array as the color filter array, in the pixel array unit 300, a basic pattern 312 including a total of four unit pixels of 2×2 pixels is repetitively arranged in a column direction and a row direction. For example, the basic pattern 312 is constituted by a unit pixel 310R including a color filter of a red (R) color, a unit pixel 310Gr including a color filter of a green (Gr) color, a unit pixel 310Gb including a color filter of a green (Gb) color, and a unit pixel 310B including a color filter of a blue (B) color.

Next, a configuration example of a unit pixel 310 will be described. FIG. 5A is a circuit diagram illustrating a schematic configuration example of the unit pixel 310 according to at least some embodiments of the present disclosure. As illustrated in FIG. 5A, the unit pixel 310 includes, for example, a pixel imaging signal generation unit (or readout circuit) 320, a light-receiving unit 330, and an address event detection unit (or readout circuit) 400. According to at least one example embodiment, the readout circuit 400 is configured to control the readout circuit 320 based on charge generated by a photoelectric conversion element (or photoelectric conversion region) 333. Furthermore, the logic circuit 210 in FIG. 5A is a logic circuit including, for example, the drive circuit 211, the signal processing unit 212, and the arbiter 213 in FIG. 3A.

For example, the light-receiving unit 330 includes a transmission transistor (first transistor) 331, an overflow gate (OFG) transistor (fifth transistor) 332, and a photoelectric conversion element 333. A transmission signal TRG transmitted from the drive circuit 211 is supplied to a gate of the transmission transistor 331 of the light-receiving unit 330, and a control signal OFG transmitted from the drive circuit 211 is supplied to a gate of the OFG transistor 332. An output through the transmission transistor 331 of the light-receiving unit 330 is connected to the pixel signal generation unit 320, and an output through the OFG transistor 332 is connected to the address event detection unit 400.

For example, the pixel signal generation unit 320 includes a reset transistor (second transistor) 321, an amplification transistor (third transistor) 322, a selection transistor (fourth transistor) 323, and a floating diffusion layer (FD) 324.

The transmission transistor 331 and the OFG transistor 332 of the light-receiving unit 330 are constituted, for example, by using an N-type metal-oxide-semiconductor (MOS) transistor (hereinafter, simply referred to as "NMOS transistor"). Similarly, the reset transistor 321, the amplification transistor 322, and the selection transistor 323 of the pixel signal generation unit 320 are each constituted, for example, by using the NMOS transistor. Here, it should be appreciated that the OFG transistor 332 may be omitted if desired, for example, if color detection is not desired. In this case, an electrical short replaces the OFG transistor 332.

For example, the address event detection unit 400 includes a current-voltage conversion unit (or converter) 410 and a subtractor 430. However, the address event detection unit 400 is further provided with a buffer (e.g., buffer 420 in FIG. 6), a quantizer, and a transmission unit. Details of the address event detection unit 400 will be described in the following description by using FIG. 6 and the like.

In the configuration, the photoelectric conversion element 333 of the light-receiving unit 330 photoelectrically converts incident light to generate a charge. The transmission transistor 331 transmits a charge generated in the photoelectric conversion element 333 to the floating diffusion layer 324 in accordance with the transmission signal TRG. The OFG transistor 332 supplies an electric signal (photocurrent)

based on the charge generated in the photoelectric conversion element 333 to the address event detection unit 400 in accordance with the control signal OFG.

The floating diffusion layer 324 accumulates charges transmitted from the photoelectric conversion element 333 through the transmission transistor 331. The reset transistor 321 discharges (initializes) the charges accumulated in the floating diffusion layer 324 in accordance with a reset signal transmitted from the drive circuit 211. The amplification transistor 322 allows a pixel signal of a voltage value corresponding to a charge amount of charges accumulated in the floating diffusion layer 324 to appear in a vertical signal line (VSL). The selection transistor 323 switches connection between the amplification transistor 322 and the VSL in accordance with a selection signal SEL transmitted from the drive circuit 211. Furthermore, the analog pixel signal that appears in the VSL is read out by the column ADC 220, and is converted into a digital pixel signal.

When an instruction for address event detection initiation is given by the control unit 130, the drive circuit 211 in the logic circuit 210 outputs the control signal OFG for setting the OFG transistor 332 of all light-receiving units 330 in the pixel array unit 300 to an ON-state. With this arrangement, a photocurrent generated in the photoelectric conversion element 333 of the light-receiving unit 330 is supplied to the address event detection unit 400 of each unit pixel 310 through the OFG transistor 332.

When detecting address event ignition on the basis of the photocurrent from the light-receiving unit 330, the address event detection unit 400 of each unit pixel 310 outputs a request to the arbiter 213. With respect to this, the arbiter 213 arbitrates the request transmitted from each of the unit pixels 310, and transmits a response to the unit pixel 310 that issues the request on the basis of the arbitration result. The unit pixel 310 that receives the response supplies a detection signal indicating the existence or nonexistence of the address event ignition (hereinafter, referred to as "address event detection signal") to the drive circuit 211 and the signal processing unit 212 in the logic circuit 210.

The drive circuit 211 sets the OFG transistor 332 in the unit pixel 310 that is a supply source of the address event detection signal to an OFF-state. With this arrangement, supply of the photocurrent from the light-receiving unit 330 to the address event detection unit 400 in the unit pixel 310 is stopped.

Next, the drive circuit 211 sets the transmission transistor 331 in the light-receiving unit 330 of the unit pixel 310 to an ON-state by the transmission signal TRG. With this arrangement, a charge generated in the photoelectric conversion element 333 of the light-receiving unit 330 is transmitted to the floating diffusion layer 324 through the transmission transistor 331. In addition, a pixel signal of a voltage value corresponding to a charge amount of charges accumulated in the floating diffusion layer 324 appears in the vertical signal line VSL that is connected to the selection transistor 323 of the pixel signal generation unit 320.

As described above, in the imaging device 200, a pixel signal SIG is output from the unit pixel 310 in which the address event ignition is detected to the column ADC 220.

Furthermore, for example, the light-receiving unit 330, the pixel signal generation unit 320, and two log (LG) transistors (sixth and seventh transistors) 411 and 414 and two amplification transistors (eighth and ninth transistors) 412 and 413 in the current-voltage conversion unit 410 of the address event detection unit 400 are disposed, for example, in the light-receiving chip 201 illustrated in FIG. 2, and other configurations (e.g., logic 210) are disposed, for example, in the logic chip 202 that is joined to the light-receiving chip 201 through the Cu—Cu joining or bonding. However, example embodiments are not limited thereto, and the transistors 411, 412, 413, and 414 may be located in the logic chip 202 if desired (see FIG. 21, for example). FIG. 5A illustrates nodes 510, which indicate points of electrical contact made between the nodes 510 and bonding pads (e.g., copper bonding pads). Here, it should be appreciated that FIG. 5A illustrates a schematic where both event detection and color detection are desired. However, if only event detection is desired, then the schematic of FIG. 5A may be altered to include only event detection components 515 (see FIG. 5B). That is, circuitry related to color detection may be omitted from the schematic of FIG. 5A or bypassed if detecting color information is not desired for the application.

FIG. 5B is a circuit diagram illustrating a schematic configuration example of the unit pixel (or pixel) 310A according to at least some embodiments of the present disclosure. For example, FIG. 5B shows event detection components 515 in FIG. 5A. It should be appreciated that FIG. 5B may be employed when color detection is not desired. That is, FIG. 5B relates to event detection only. FIG. 5B illustrates the inclusion of OFG transistor 332, however, the OFG transistor 332 may be omitted if desired so that the photoelectric conversion element 333 is coupled directly to transistors 411 and 413 (see, e.g., FIGS. 11-18). In this case, the signal line from logic 210 to OFG transistor 332 may also be omitted.

As in FIG. 5A, FIG. 5B shows an example node 510 which represents a location of electrical contact to a bonding pad. FIGS. 19A-52 illustrate various examples of nodes 510 for the converter 410 and bonding pad configurations for bonding pads CC.

Figure 11:
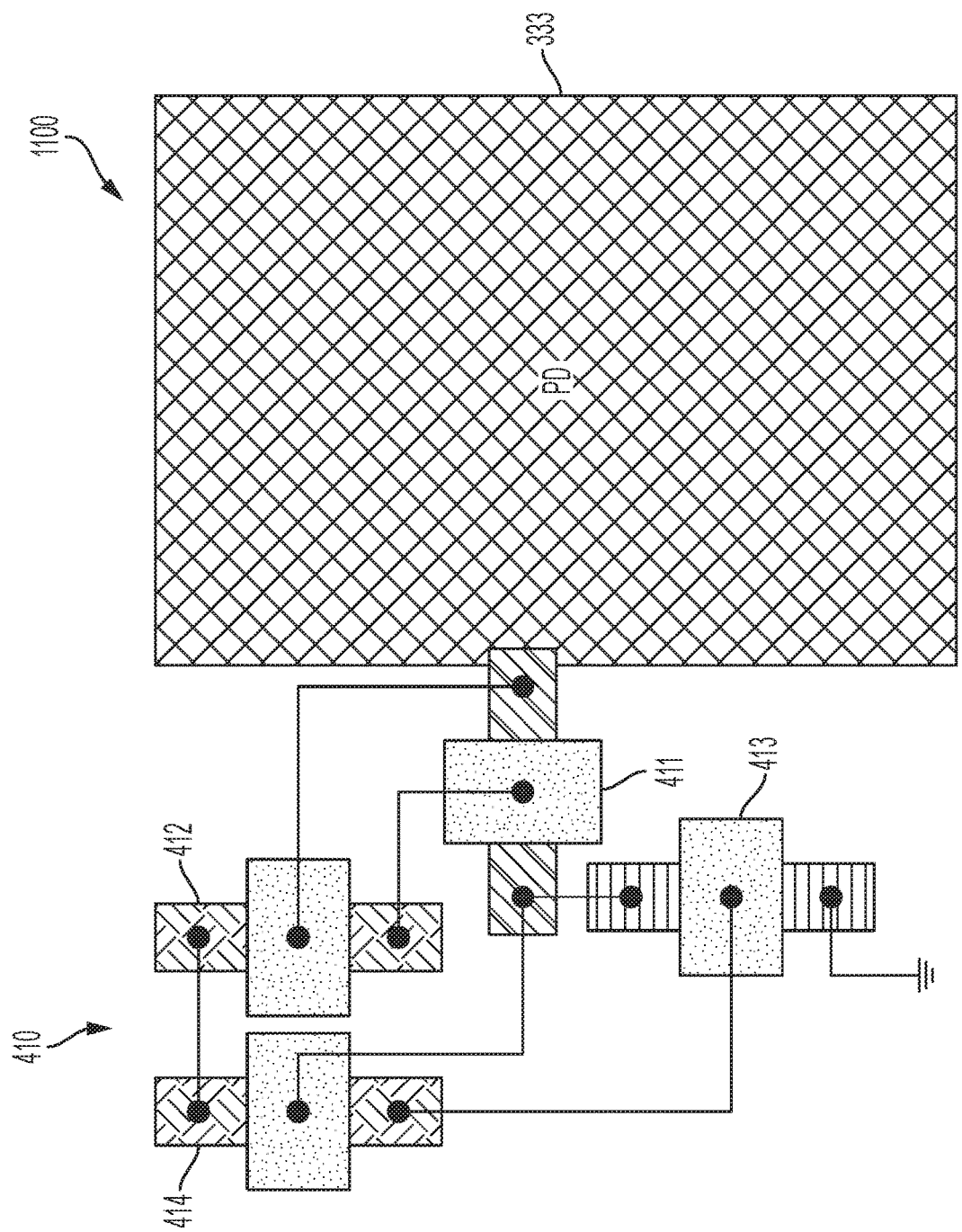
FIG. 11 is a plan view of an example layout for a portion of the converter and the photoelectric conversion region according to at least one example embodiment.
Figure 12:
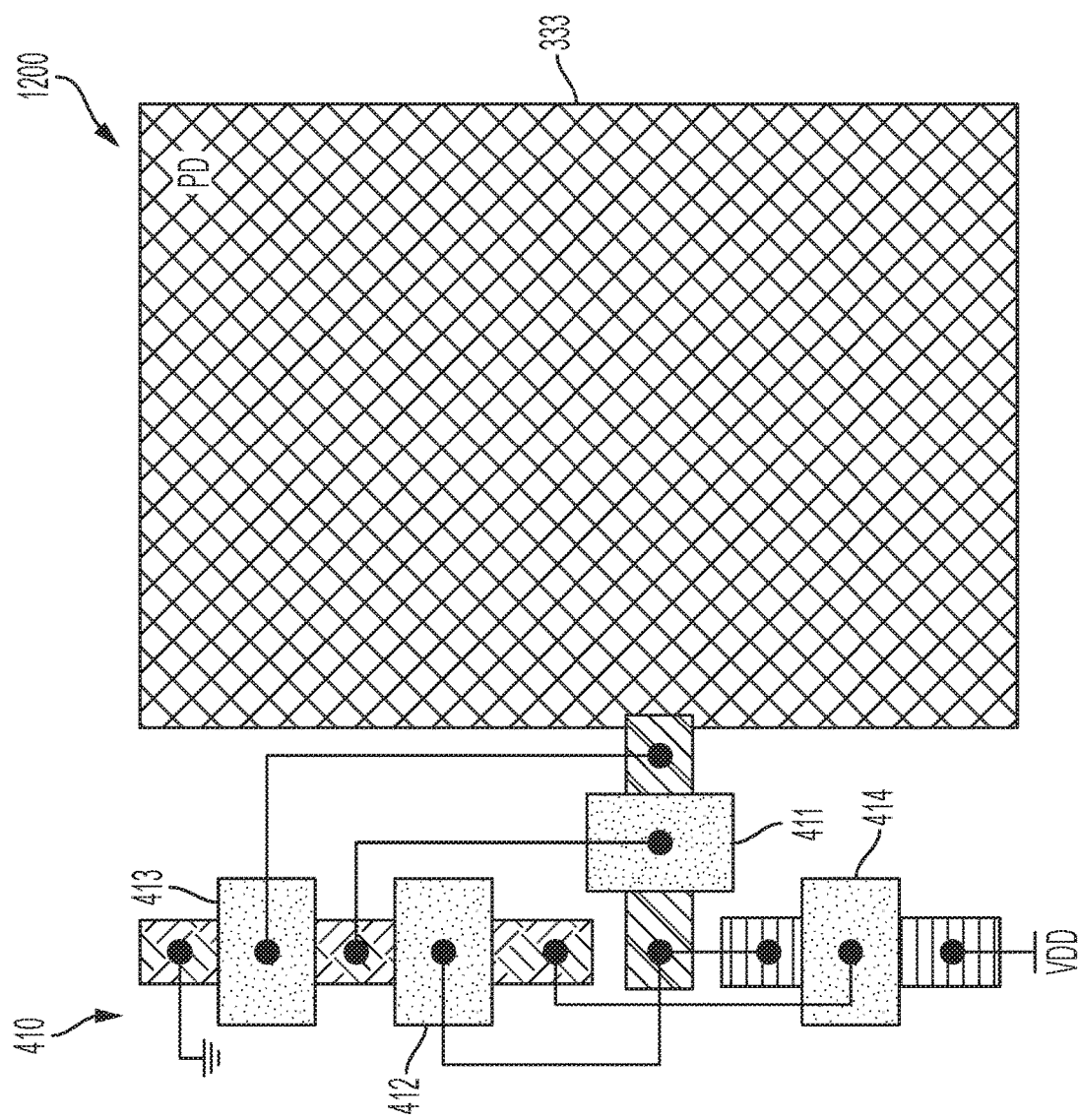
FIG. 12 is a plan view of an example layout for a portion of the converter 410 and the photoelectric conversion region according to at least one example embodiment.
Figure 13:
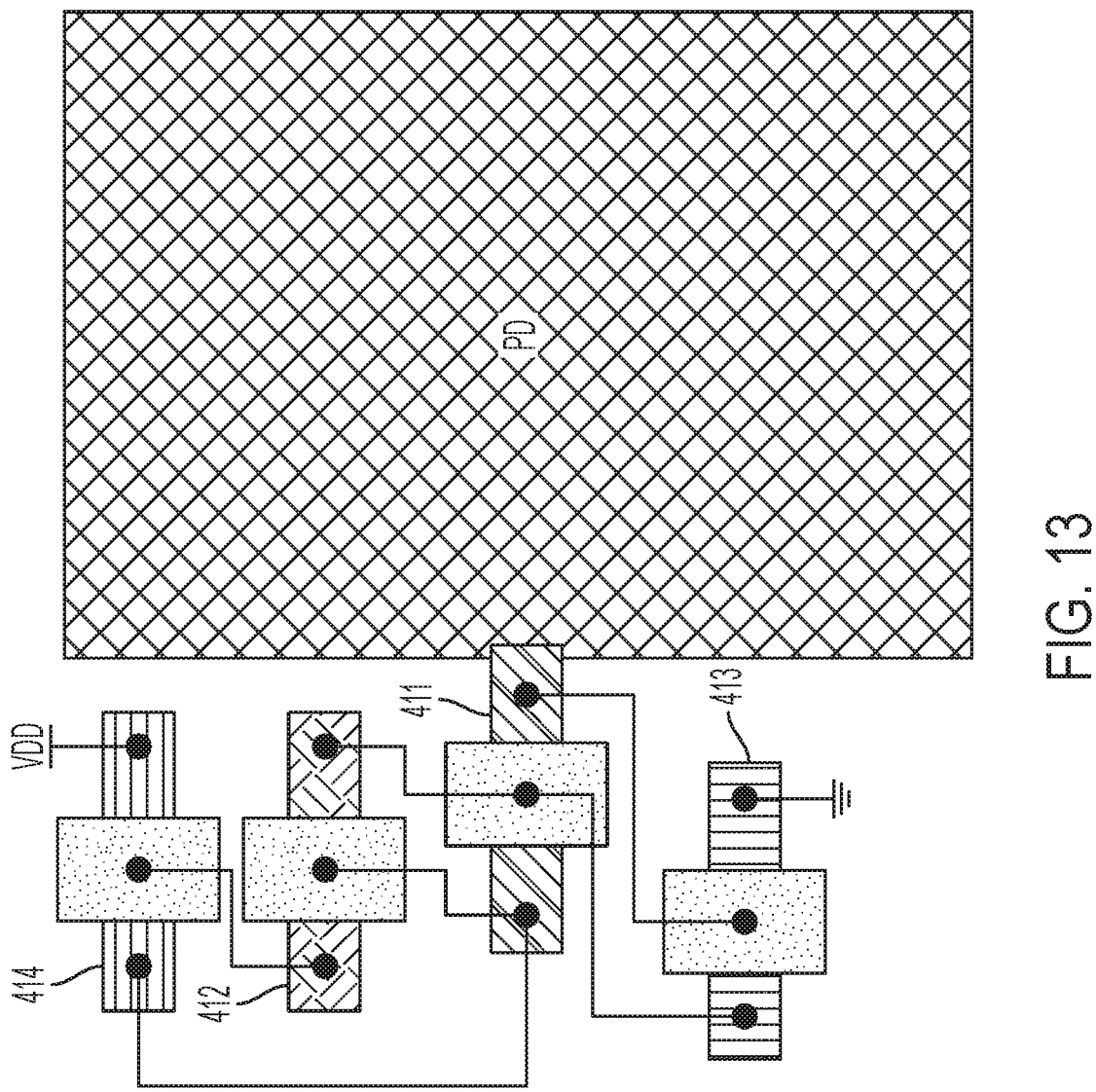
FIG. 13 is a plan view of an example layout for a portion of the converter 410 and the photoelectric conversion region according to at least one example embodiment.

Here, it should also be appreciated that FIGS. 5A and 5B illustrate a four transistor (4T) configuration of the converter 410. FIGS. 11-13 illustrate example layouts of the 4T configuration in further detail. However, example embodiments are not limited thereto. For example, in at least one example embodiment, transistors 414 and 412 may be omitted to form a two transistor (2T) configuration. The 2T configuration may reduce an overall footprint of each unit pixel 310. In a 2T configuration, transistor 411 is coupled to the power supply terminal VDD instead of transistor 414, and transistor 413 is coupled to constant-current circuit 415 instead of transistor 412. FIGS. 14-18 illustrate example layouts of the 2T configuration in more detail.

Figure 6:
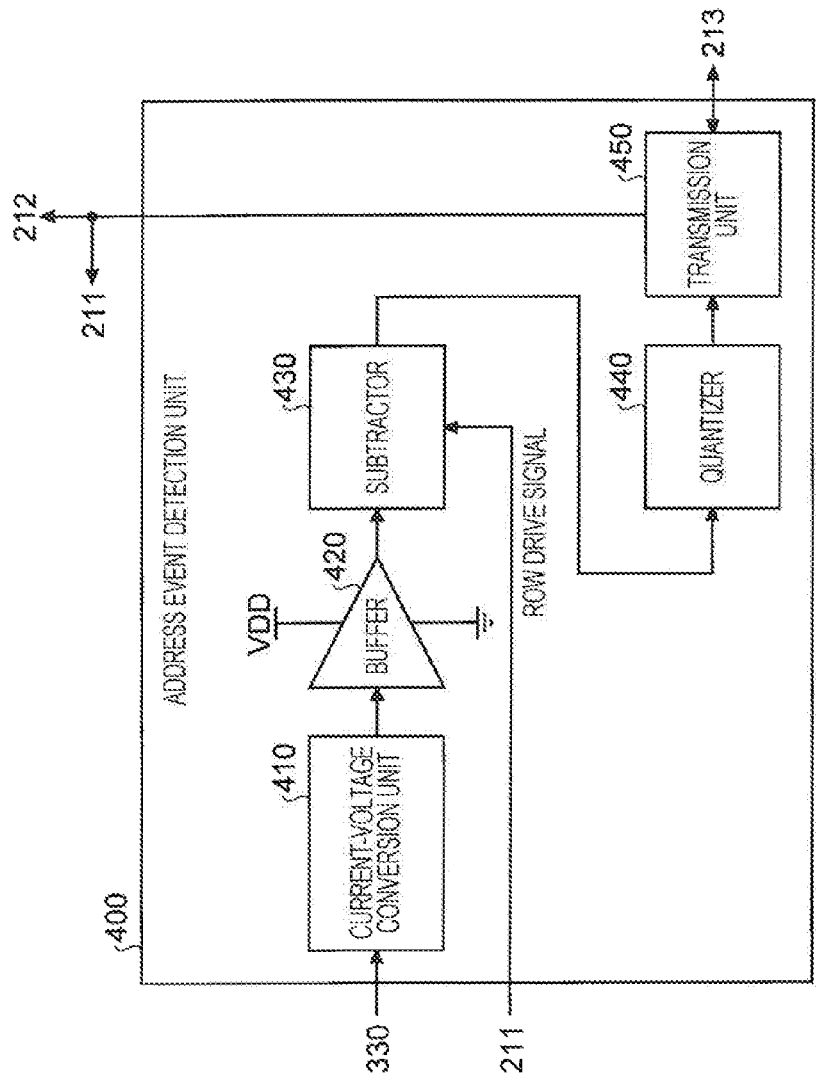
FIG. 6 is a block diagram illustrating a schematic configuration example of an address event detection unit according to at least one example embodiment.

FIG. 6 is a block diagram illustrating a schematic configuration example of the address event detection unit according to at least some embodiments of the present disclosure. As illustrated in FIG. 6, the address event detection unit 400 includes a current-voltage conversion unit 410, a buffer 420, a subtractor 430, a quantizer 440, and a transmission unit 450.

The current-voltage conversion unit 410 converts the photocurrent from the light-receiving unit 330 into a voltage signal in a logarithm thereof, and supplies the voltage signal generated through the conversion to the buffer 420.

The buffer 420 corrects the voltage signal transmitted from the current-voltage conversion unit 410, and outputs a voltage signal after correction to the subtractor 430.

The subtractor 430 lowers a voltage level of the voltage signal transmitted from the buffer 420 in accordance with a row drive signal transmitted from the drive circuit 211 and, supplies the lowered voltage signal to the quantizer 440.

The quantizer 440 quantizes the voltage signal transmitted from the subtractor 430 into a digital signal, and outputs the digital signal generated through the quantization to the transmission unit 450 as a detection signal.

The transmission unit 450 transmits the detection signal transmitted from the quantizer 440 to the signal processing unit 212 and the like. For example, when address event ignition is detected, the transmission unit 450 supplies a request for transmission of an address event detection signal from the transmission unit 450 to the drive circuit 211 and the signal processing unit 212 to the arbiter 213. In addition, when receiving a response with respect to the request from the arbiter 213, the transmission unit 450 supplies the detection signal to the drive circuit 211 and the signal processing unit 212.

For example, the current-voltage conversion unit 410 in the configuration illustrated in FIG. 6 has a 4T configuration that includes the two LG transistors 411 and 414, the two amplification transistors 412 and 413, and a constant-current circuit 415 as illustrated in FIG. 5.

For example, a source of the LG transistor 411 and a gate of the amplification transistor 413 are connected to a drain of the OFG transistor 332 of the light-receiving unit 330. In addition, for example, a drain of the LG transistor 411 is connected to a source of the LG transistor 414 and a gate of the amplification transistor 412. For example, a drain of the LG transistor 414 is connected to a power supply terminal VDD.

In addition, for example, a source of the amplification transistor 413 is grounded, and a drain thereof is connected to a gate of the LG transistor 411 and a source of the amplification transistor 412. For example, a drain of the amplification transistor 412 is connected to a power supply terminal VDD through the constant-current circuit 415. For example, the constant-current circuit 415 is constituted by a load MOS transistor such as a p-type MOS transistor.

In this connection relationship, a loop-shaped source follower circuit is constructed. With this arrangement, a photocurrent from the light-receiving unit 330 is converted into a voltage signal in a logarithmic value corresponding to a charge amount thereof. Furthermore, the LG transistors 411 and 414, and the amplification transistors 412 and 413 may be each constituted, for example, by an NMOS transistor.

Figure 7:
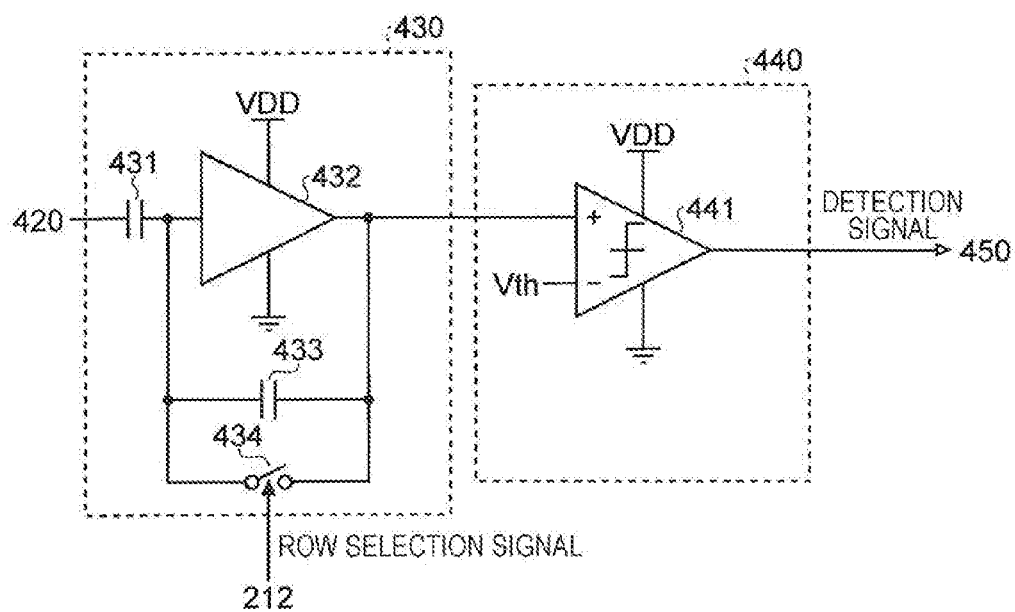
FIG. 7 is a circuit diagram illustrating a schematic configuration example of a subtractor and a quantizer according to at least one example embodiment.

FIG. 7 is a circuit diagram illustrating a schematic configuration example of the subtractor and the quantizer according to at least some embodiments of the present disclosure. As illustrated in FIG. 7, the subtractor 430 includes capacitors 431 and 433, an inverter 432, and a switch 434. In addition, the quantizer 440 includes a comparator 441.

One end of the capacitor 431 is connected to an output terminal of the buffer 420, and the other end is connected to an input terminal of the inverter 432. The capacitor 433 is connected to the inverter 432 in parallel. The switch 434 opens or closes a route connecting both ends of the capacitor 433 in accordance with a row drive signal.

The inverter 432 inverts a voltage signal that is input through the capacitor 431. The inverter 432 outputs an inverted signal to a non-inverting input terminal (+) of the comparator 441.

When the switch 434 is closed, a voltage signal Vinit is input to a buffer 420 side of the capacitor 431. In addition, the opposite side becomes a virtual ground terminal. A potential of the virtual ground terminal is set to zero for convenience. At this time, when a capacity of the capacitor 431 is set as C1, a potential Qinit that is accumulated in the capacitor 431 is expressed by the following Expression (1).

On the other hand, both ends of the capacitor 433 are short-circuited, and thus an accumulated charge thereof becomes zero.

$$Q\text{init} = C1 \times V\text{init} \tag{1}$$

Next, when considering a case where the switch 434 is turned off, and a voltage of the capacitor 431 on the buffer 420 side varies and reaches Vafter, a charge Qafter accumulated in the capacitor 431 is expressed by the following Expression (2).

$$Q\text{after} = C1 \times V\text{after} \tag{2}$$

On the other hand, when an output voltage is set as Vout, a charge Q2 accumulated in the capacitor 433 is expressed by the following Expression (3).

$$Q2 = -C2 \times V\text{out} \tag{3}$$

At this time, a total charge amount of the capacitors 431 and 433 does not vary, and thus the following Expression (4) is established.

$$Q\text{init} = Q\text{after} + Q2 \tag{4}$$

When Expression (1) to Expression (3) are substituted for Expression (4), the following Expression (5) is obtained.

$$V\text{out} = -(C1/C2) \times (V\text{after} - V\text{init}) \tag{5}$$

Expression (5) represents a subtraction operation of a voltage signal, and a gain of the subtraction result becomes C1/C2. Typically, it is desired to maximize (or alternatively, improve) the gain, and thus it is preferable to make a design so that C1 becomes large and C2 becomes small. On the other hand, when C2 is excessively small, kTC noise increases, and thus there is a concern that noise characteristics deteriorate. Accordingly, a reduction in the capacity of C2 is limited to a range capable of permitting noise. In addition, since the address event detection unit 400 including the subtractor 430 is mounted for every unit pixel 310, a restriction on an area is present in capacities C1 and C2. Values of the capacities C1 and C2 are determined in consideration of the restriction.

The comparator 441 compares a voltage signal transmitted from the subtractor 430 and a predetermined threshold voltage Vth that is applied to an inverting input terminal (−). The comparator 441 outputs a signal indicating the comparison result to the transmission unit 450 as a detection signal.

In addition, when a conversion gain by the current-voltage conversion unit 410 is set as $CG_{log}$, and a gain of the buffer 420 is set to "1", a gain A of the entirety of the address event detection unit 400 is expressed by the following Expression (6).

[Mathematical Formula 1]

$$A = \frac{CG_{log} \cdot C1}{C2} \sum_{n=1}^{N} i_{photo\_n} \tag{6}$$

In Expression (6), $i_{photo\_n}$ represents a photocurrent of an nth unit pixel 310, and a unit thereof is, for example, an ampere (A). N represents the number of the unit pixels 310 in a pixel block, and is "1" in this embodiment.

Figure 8:
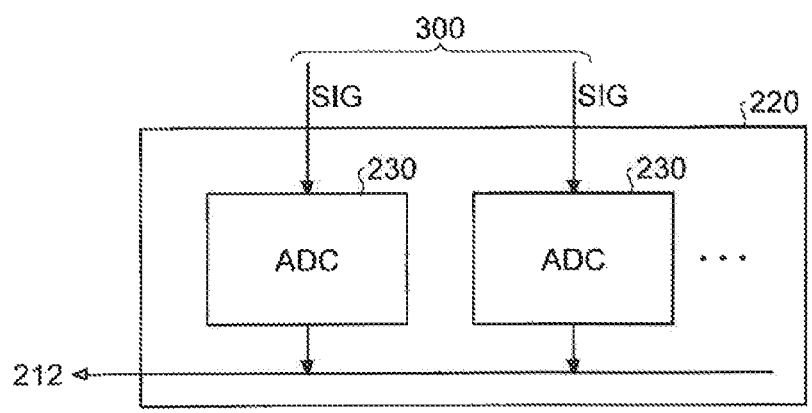
FIG. 8 is a block diagram illustrating a schematic configuration example of a column ADC according to at least one example embodiment.

FIG. 8 is a block diagram illustrating a schematic configuration example of the column ADC according to at least some embodiments of the present disclosure. The column ADC 220 includes a plurality of ADCs 230 which are provided for every column of the unit pixels 310.

Each of the ADCs 230 converts an analog pixel signal that appears in the vertical signal line VSL into a digital signal. For example, the pixel signal is converted into a digital signal in which a bit length is greater than that of a detection signal. For example, when the detection signal is set to two bits, the pixel signal is converted into a digital signal of three or greater bits (16 bits and the like). The ADC 230 supplies a generated digital signal to the signal processing unit 212. Here, it should be appreciated that the column ADC 220 may be omitted (as in FIG. 3B) or unused if, for example, color detection is not desired.

Next, an operation of the imaging device 200 according to at least embodiments of the present disclosure will be described in detail with reference to the accompanying drawings.

Figure 9:
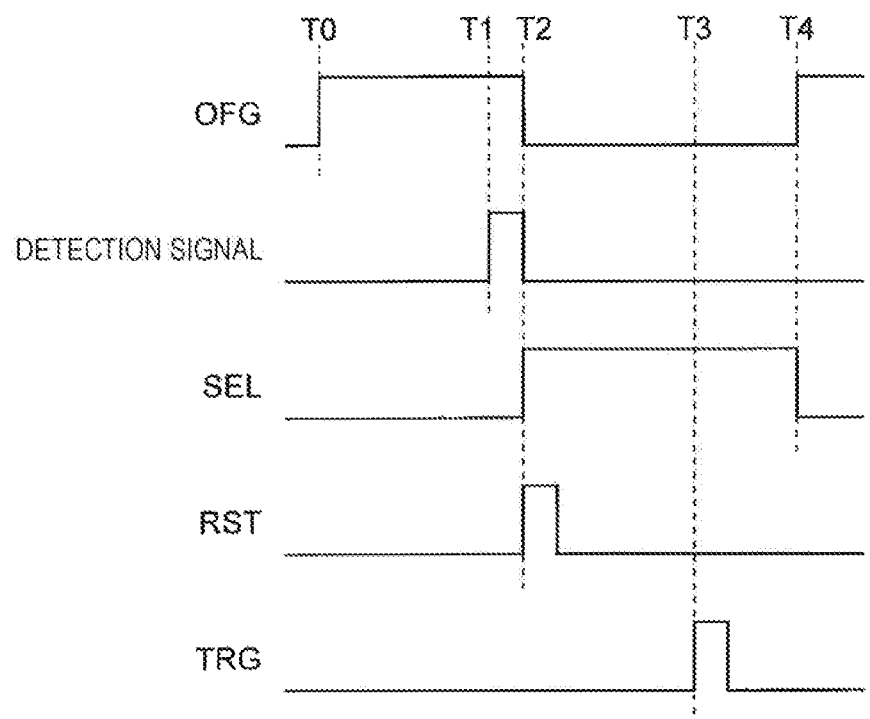
FIG. 9 is a timing chart illustrating an example of an operation of an imaging device according to at least one example embodiment.

First, an example of the operation of the imaging device 200 will be described by using a timing chart. FIG. 9 is a timing chart illustrating an example of the operation of the imaging device according to the first embodiment.

As illustrated in FIG. 9, at a timing T0, when an instruction for address event detection initiation is given by the control unit 130, the drive circuit 211 raises the control signal OFG applied to the gate of the OFG transistor 332 of all of the light-receiving units 330 in the pixel array unit 300 to a high level. With this arrangement, a plurality of the OFG transistors 332 of all of the light-receiving units 330 enter an ON-state, and a photocurrent based on a charge generated in the photoelectric conversion element 333 of each of the light-receiving units 330 is supplied from each the light-receiving units 330 to each of a plurality of the address event detection units 400.

In addition, in a period in which the control signal OFG is in a high level, all of the transmission signals TRG applied to the gate of the transmission transistor 331 in each of the light-receiving units 330 are maintained in a low level. Accordingly, in this period, a plurality of the transmission transistors 331 in all of the light-receiving units 330 are in an OFF-state.

Next, a case where the address event detection unit 400 of an arbitrary unit pixel 310 detects address event ignition in a period in which the control signal OFG is in a high level will be assumed. In this case, the address event detection unit 400 that detects the address event ignition transmits a request to the arbiter 213. With respect to this, the arbiter 213 arbitrates the request, and returns a response for the request to the address event detection unit 400 that issues the request.

The address event detection unit 400 that receives the response raises a detection signal that is input to the drive circuit 211 and the signal processing unit 212 to a high level, for example, in a period of a timing T1 to a timing T2. Furthermore, in this description, it is assumed that the detection signal is a one-bit signal The drive circuit 211 to which a high-level detection signal is input from the address event detection unit 400 at the timing T1 lowers all control signals OFG to a low level at a subsequent timing T2. With this arrangement, supply of a photocurrent from all of the light-receiving units 330 of the pixel array unit 300 to the address event detection unit 400 is stopped.

In addition, at the timing T2, the drive circuit 211 raises a selection signal SEL that is applied to a gate of the selection transistor 323 in the pixel imaging signal generation unit 320 of the unit pixel 310 in which the address event ignition is detected (hereinafter, referred to as "reading-out target unit pixel") to a high level, and raises a reset signal RST that is applied to a gate of the reset transistor 321 of the same pixel imaging signal generation unit 320 to a high level for a constant pulse period, thereby discharging (initializing) charges accumulated in the floating diffusion layer 324 of the pixel imaging signal generation unit 320. In this manner, a voltage, which appears in the vertical signal line VSL in a state in which the floating diffusion layer 324 is initialized, is read out by the ADC 230 connected to the vertical signal line VSL in the column ADC 220 as a reset-level pixel signal (hereinafter, simply referred to as "reset level"), and is converted into a digital signal.

Next, at a timing T3 after reading out the reset level, the drive circuit 211 applies a transmission signal TRG of a constant pulse period to the gate of the transmission transistor 331 of the light-receiving unit 330 in the reading-out target unit pixel 310. With this arrangement, a charge generated in the photoelectric conversion element 333 of the light-receiving unit 330 is transmitted to the floating diffusion layer 324 in the pixel signal generation unit 320, and a voltage corresponding to charges accumulated in the floating diffusion layer 324 appears in the vertical signal line VSL. In this manner, the voltage that appears in the vertical signal line VSL is read out by the ADC 230 connected to the vertical signal line VSL in the column ADC 220 as a signal-level pixel signal of the light-receiving unit 330 (hereinafter, simply referred to as "signal level") of the light-receiving unit 330, and is converted into a digital value.

The signal processing unit 212 executes CDS processing in which a difference between the reset level and the signal level which are read out as described above is obtained as a net pixel signal corresponding to a light-reception amount of the photoelectric conversion element 333.

Next, at a timing T4, the drive circuit 211 lowers the selection signal SEL that is applied to the gate of the selection transistor 323 in the pixel imaging signal generation readout circuit 320 of the reading-out target unit pixel 310 to a low level, and raises the control signal OFG that is applied to the gate of the OFG transistor 332 of all of the light-receiving units 330 in the pixel array unit 300 to a high level. With this arrangement, address event ignition detection in all of the light-receiving units 330 in the pixel array unit 300 is restarted.

Next, an example of the operation of the imaging device 200 will be described by using a flowchart. FIG. 10A is a flowchart illustrating an example of the operation of the imaging device according to at least some embodiments of the present disclosure. For example, this operation is initiated when a predetermined application for detecting an address event is executed.

As illustrated in FIG. 10A, in this operation, first, each of the unit pixels 310 in the pixel array unit 300 detects existence or nonexistence of address event ignition (step S901). In addition, the drive circuit 211 determines whether or not address event ignition is detected in any one of the unit pixels 310 (step S902).

In a case where the address event ignition is not detected (NO in step S902), this operation proceeds to step S904. On the other hand, in a case where the address event ignition is detected (YES in step S902), the drive circuit 211 executes reading-out of a pixel signal with respect to the unit pixel 310 in which the address event ignition is detected (step S903), and proceeds to step S904.

In step S904, it is determined whether or not to terminate this operation. In a case where this operation is not terminated (NO in step S904), this operation returns to step S901, and the subsequent operations are repeated. On the other hand, in a case where this operation is terminated (YES in step S904), this operation is terminated.

FIG. 10B is a flowchart illustrating an example of the operation of the imaging device 200A in FIG. 3B according to at least some embodiments of the present disclosure. FIG. 10B illustrates operations for event detection only, for example, by the imaging device 200A.

In step S950, the temporal contrast of brightness of a pixel (e.g., a pixel 310A) is monitored. For example, a change in light intensity of the pixel is monitored by the event detection components 515 in accordance with the description provided above. In this case, transistor 332 (if included) and transistors 411, 412, 413, and 414 are all simultaneously on in order to monitor the change in light intensity.

In step S955, it is determined whether a change in the temporal contrast is greater than a threshold. If not, the method returns to step S950. If so, the method proceeds to step S960 where an event is detected so that the address of the pixel is output and a time stamp of when the event occurred is recorded.

In step S965, the pixel is reset (e.g., by closing switch 434).

FIGS. 11-18 illustrate various example layouts for the photoelectric conversion region 333 and the converter 410. Although not explicitly shown, it should be understood that the transistors (e.g., the source/drain regions) of the converter 410 and the photoelectric conversion region 333 are formed in a semiconductor substrate, for example, a semiconductor substrate having p-type conductivity or a p-well. In addition, it should be further appreciated that FIGS. 11-18 have omitted the OFG transistor 332 between the photoelectric conversion region 333 and the transistor 411. However, the OFG transistor 332 may be included if desired.

FIG. 11 is a plan view of an example layout 1100 for a portion of the converter 410 and the photoelectric conversion region 333 according to at least one example embodiment. As shown in FIG. 11, a source of the transistor 411 may be coupled to a central region of one side of the photoelectric conversion region 333. The transistor 411 may extend in a first direction (e.g., a horizontal direction). As further shown, transistor 413 is formed on one side of the drain of the transistor 413 and extends in a second direction (e.g., a vertical direction) that is perpendicular to the first direction. Transistors 412 and 414 are adjacent to one another and located on the other side of the drain of the transistor 413 The layout illustrated in FIG. 11 may be useful for applications that desire smaller footprints for the pixels 310 so as to improve resolution.

FIG. 12 is a plan view of an example layout 1200 for a portion of the converter 410 and the photoelectric conversion region 333 according to at least one example embodiment. As shown, the transistor 411 is coupled to the photoelectric conversion region 333 in a region that is offset from (e.g., below) a central region of the photoelectric conversion region 333. In addition, transistor 414 is located at one side of the drain of transistor 411 while transistors 412 and 413 are located at another side of the drain of transistor 411. As shown, transistors 412 and 413 share a source/drain region, and the transistors 412, 413, and 414 extend in the second direction and are aligned with one another in the second direction. The layout illustrated in FIG. 12 may be useful for applications that are tailored for larger footprints for the pixels 310, or larger photoelectric conversion regions where higher quality images and/or better contrast sensitivity is desired.

FIG. 13 is a plan view of an example layout 1300 for a portion of the converter 410 and the photoelectric conversion region 333 according to at least one example embodiment. As shown in FIG. 13, the transistor 411 is coupled to the photoelectric conversion region 333 at a central region of one side of the photoelectric conversion region 333. As also shown, transistor 413 is on one side of the drain of the transistor 411 while transistors 412 and 414 are on another side of the drain of the transistor 411. The transistors 411, 412, 413, and 414 all extend in a first direction, and transistors 412/414 are aligned with one another in a second direction. Although not explicitly shown, it should be appreciated that transistor 413 may also be aligned with transistors 412/414 if desired. FIG. 13 may be useful for applications that desire to reduce coupling between gates of the transistors 411, 412, 413, and 414.

In FIGS. 11-13, the transistor 411 may have the structure described with reference to FIG. 49 in order to reduce dark current.

Figure 14:
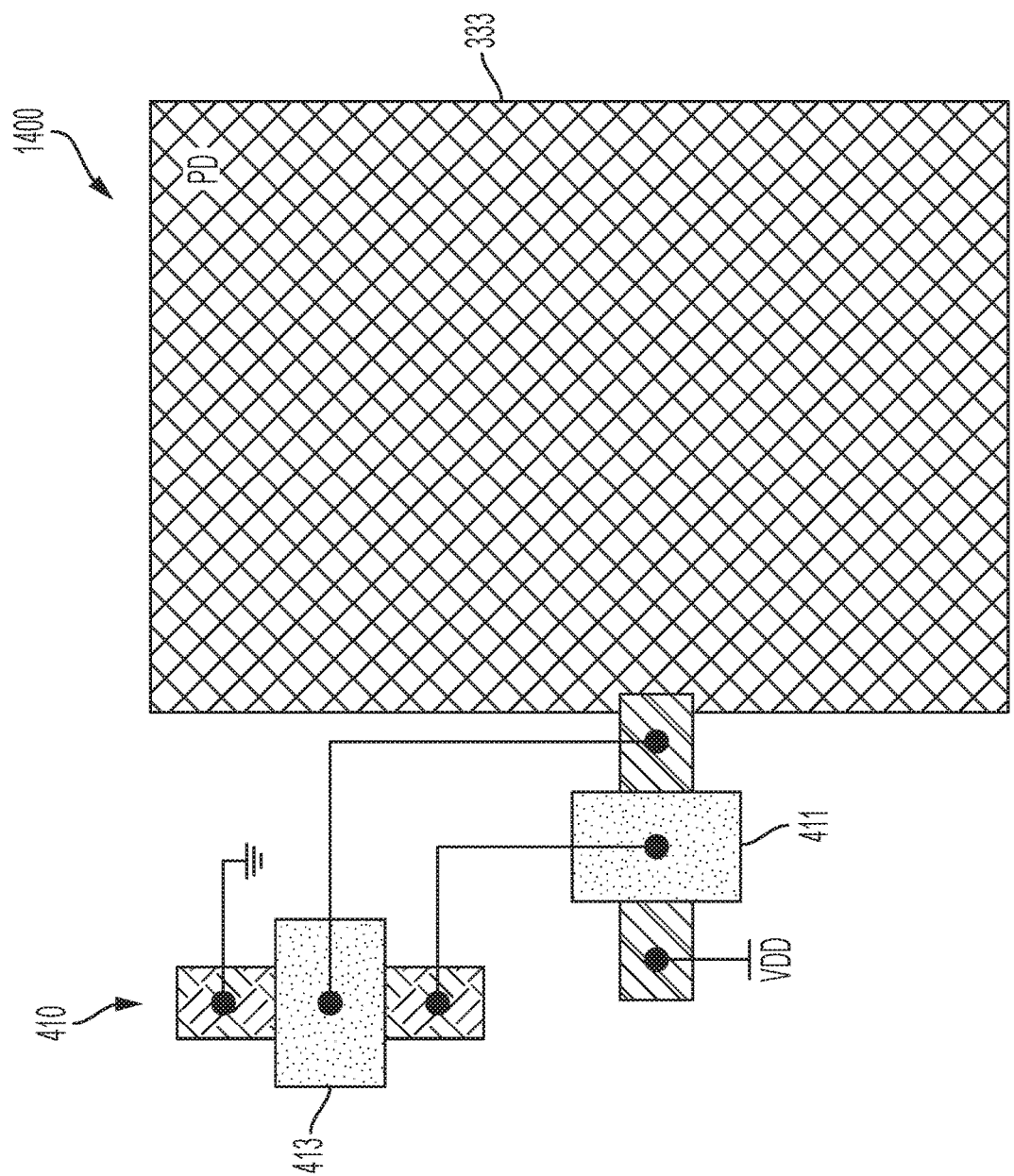
FIG. 14 is a plan view of an example layout for a portion of the converter and the photoelectric conversion region according to at least one example embodiment.

FIG. 14 is a plan view of an example layout 1400 for a portion of the converter 410 and the photoelectric conversion region 333 according to at least one example embodiment. Here, it should be appreciated that FIG. 14 illustrates a 2T configuration for the converter 410 where transistors 412 and 414 are omitted, as described above. As shown, transistor 411 is coupled to one side of the photoelectric conversion region 333 and located at a region that is offset from (e.g., below) a central region of the photoelectric conversion region 333 while transistor 413 is formed on one side of transistor 411 and extends in the second direction. The layout in FIG. 14 may be useful for applications that desire smaller pixels 310. In this case, transistor 411 may have the structure illustrated in FIG. 49.

Figure 15:
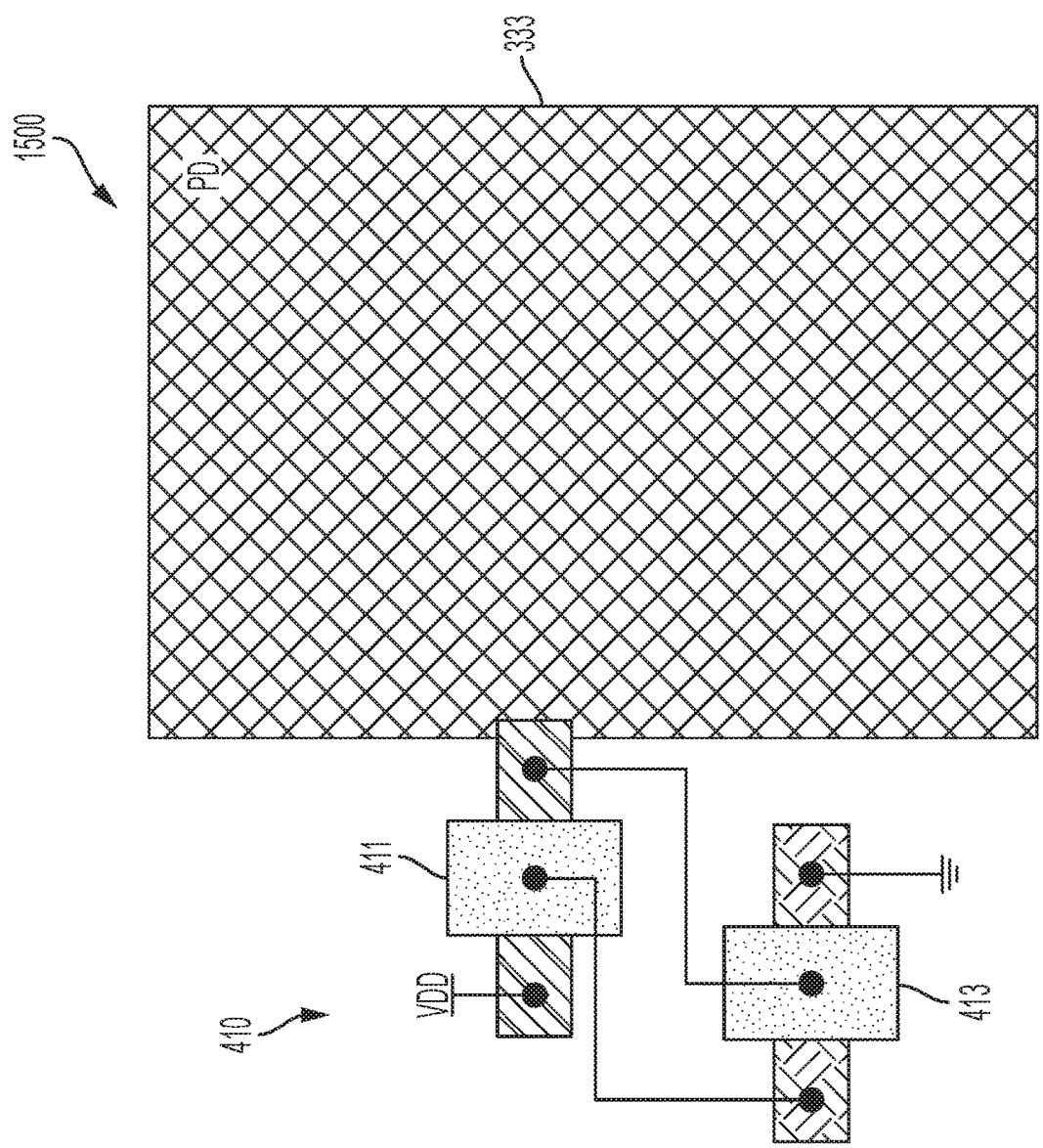
FIG. 15 is a plan view of an example layout for a portion of the converter and the photoelectric conversion region according to at least one example embodiment.

FIG. 15 is a plan view of an example layout 1500 for a portion of the converter 410 and the photoelectric conversion region 333 according to at least one example embodiment. Like FIG. 14, FIG. 15 has a 2T configuration for the converter 410. In FIG. 15, transistor 411 is coupled to one side of the photoelectric conversion region 333 at a location that is offset from (e.g., above) a central region of the photoelectric conversion region 333. The transistor 413 is formed on one side of the transistor 411 and extends in the first direction. The layout in FIG. 15 may be useful for applications that desire flexibility in the metal wirings that make electrical connections to the transistors 411/413 and other components of the pixel 310. In this case, transistor 411 may have the structure illustrated in FIG. 49.

Figure 16:
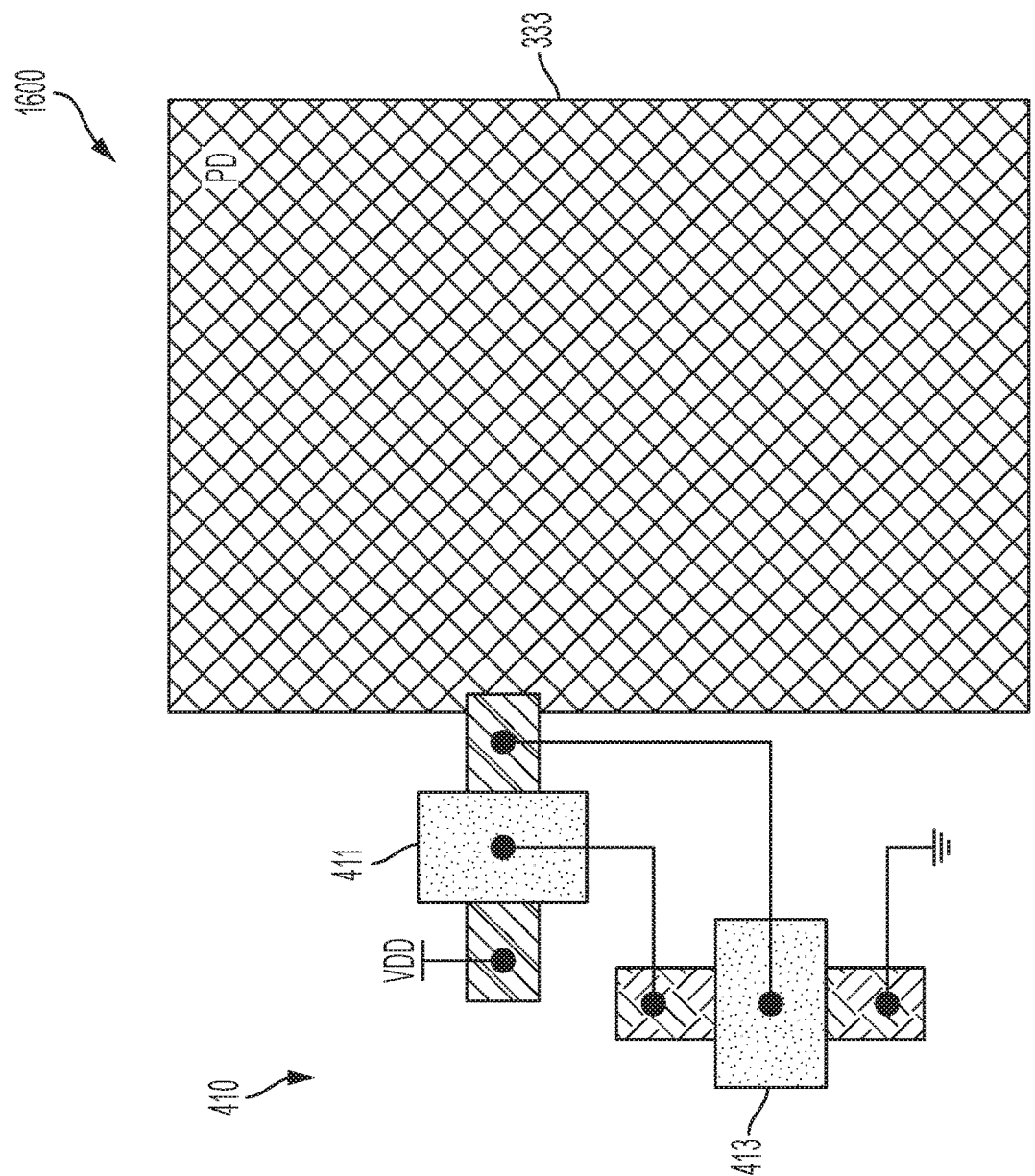
FIG. 16 is a plan view of an example layout for a portion of the converter and the photoelectric conversion region according to at least one example embodiment.

FIG. 16 is a plan view of an example layout 1600 for a portion of the converter 410 and the photoelectric conversion region 333 according to at least one example embodiment. Here, it should be appreciated that FIG. 16 illustrates a 2T configuration for the converter 410 where transistors 412 and 414 are omitted, as described above. As shown, transistor 411 is coupled to one side of the photoelectric conversion region 333 and located at a region that is offset from (e.g., above) a central region of the photoelectric conversion region 333 while transistor 413 is formed on one side of transistor 411 and extends in the second direction. The layout in FIG. 16 may be useful for applications that desire smaller pixels 310. In this case, transistor 411 may have the structure illustrated in FIG. 49.

Figure 17:
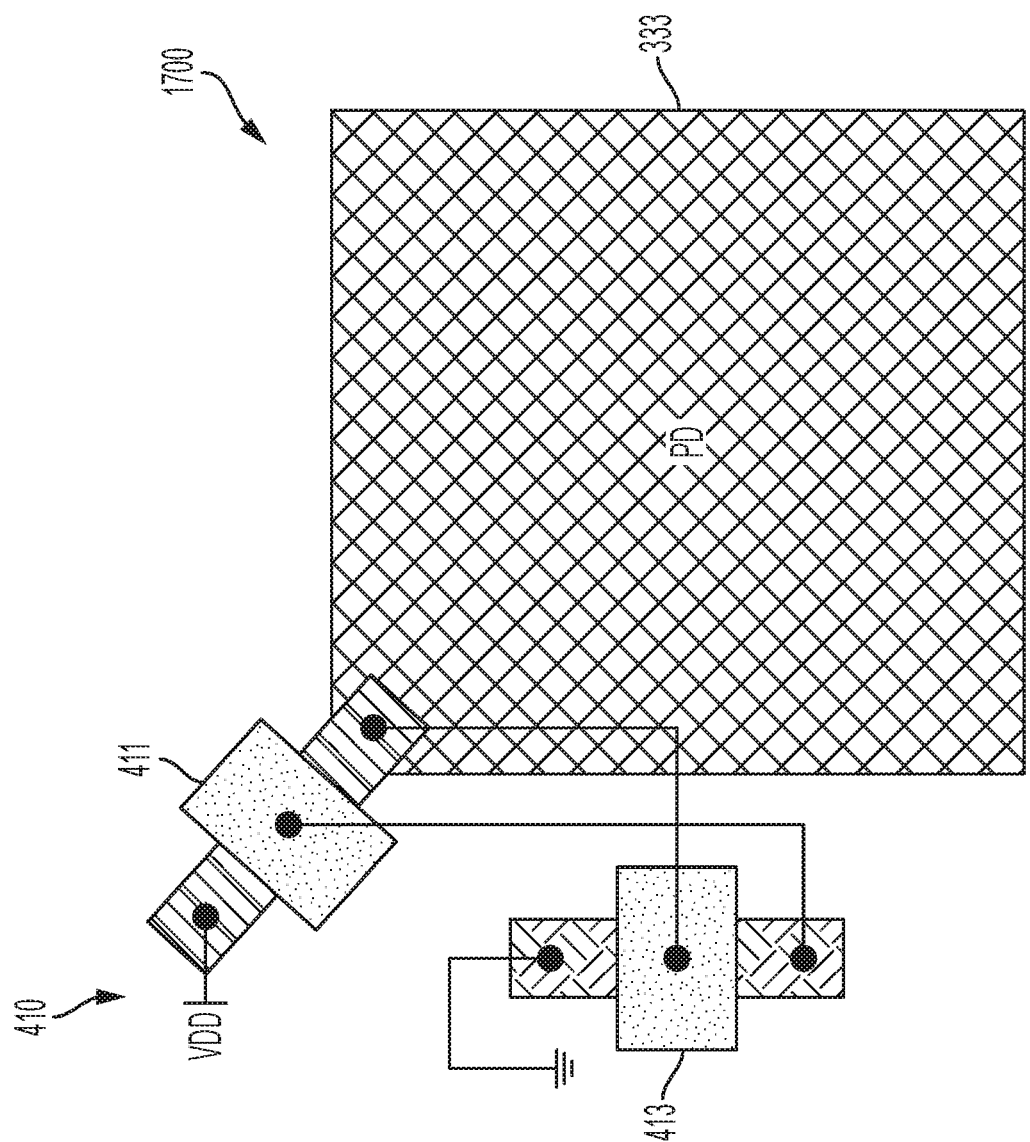
FIG. 17 is a plan view of an example layout for a portion of the converter and the photoelectric conversion region according to at least one example embodiment.

FIG. 17 is a plan view of an example layout 1700 for a portion of the converter 410 and the photoelectric conversion region 333 according to at least one example embodiment. Here, it should be appreciated that FIG. 17 illustrates a 2T configuration for the converter 410 where transistors 412 and 414 are omitted, as described above. As shown in FIG. 17, transistor 413 is located at one side of the photoelectric conversion region 333 and extends in the second direction while transistor 411 is coupled to a corner portion of the photoelectric converter region 333 and extends in a direction that forms an angle with the second direction. In this case, transistor 411 may have the structure illustrated in FIG. 49.

Figure 18:
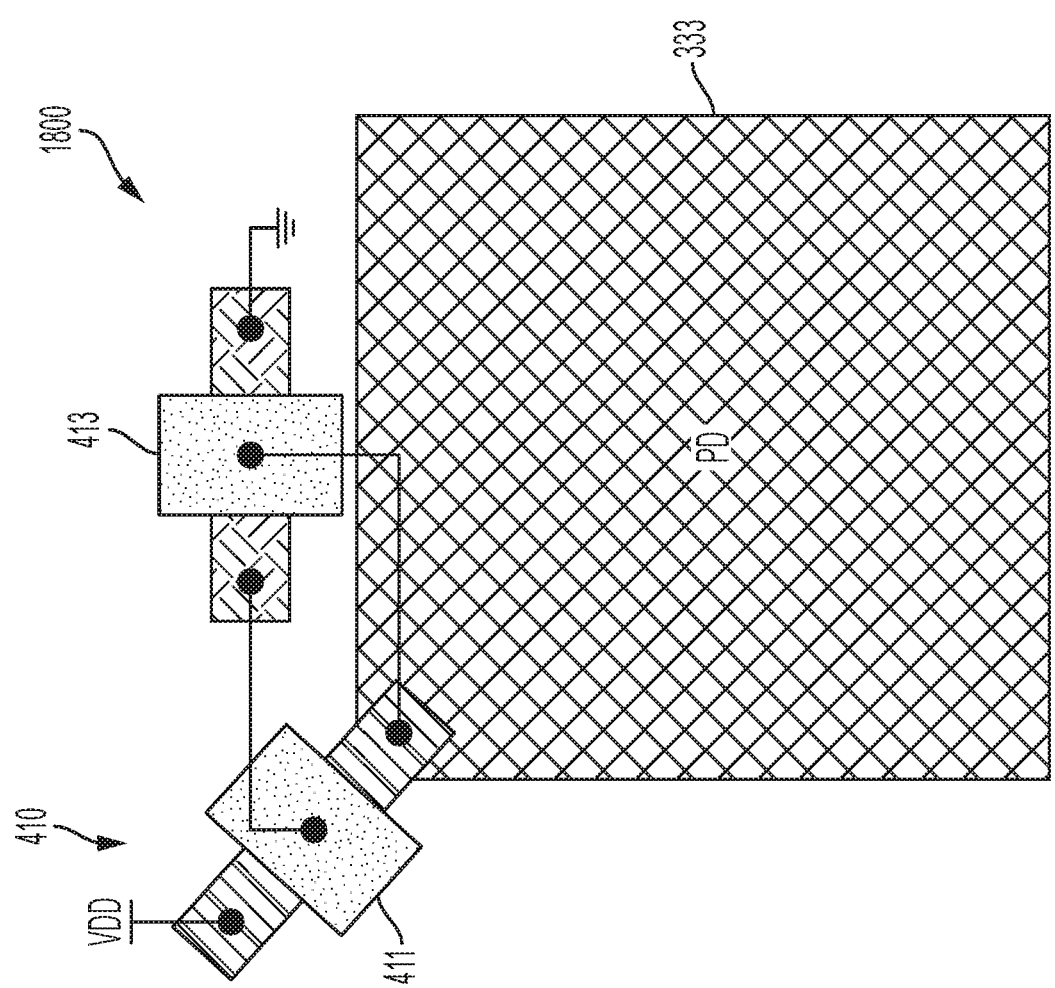
FIG. 18 is a plan view of an example layout for a portion of the converter and the photoelectric conversion region according to at least one example embodiment.

FIG. 18 is a plan view of an example layout 1800 for a portion of the converter 410 and the photoelectric conversion region 333 according to at least one example embodiment. Here, it should be appreciated that FIG. 18 illustrates a 2T configuration for the converter 410 where transistors 412 and 414 are omitted, as described above. As shown in FIG. 18, transistor 413 is located at one side of the photoelectric conversion region 333 and extends in the first direction while transistor 411 is coupled to a corner portion of the photoelectric converter region 333 and extends in a direction that forms an angle with the second direction. In this case, transistor 411 may have the structure illustrated in FIG. 49.

Here, it should be understood that FIGS. 11-18 illustrate layouts from a plan view perspective where the transistors may include some portions formed in a same semiconductor substrate as the photoelectric conversion region 333 and other portions formed in a wiring layer attached to the semiconductor substrate (where the wiring layer and the semiconductor substrate are part of the light-receiving chip 201). For example, sources/drains of the transistors may be formed in a non-light receiving surface of the semiconductor substrate opposite to a light receiving surface of the semiconductor substrate while gates of transistors may be formed in a surface of the wiring layer that is attached to and faces the non-light receiving surface of the semiconductor substrate.

Various example schematics and example layouts for bonding pad configurations for pixels 310 will now be described with reference to FIGS. 19A-48. Here, it should be appreciated that one or more of the layouts described with reference to FIGS. 11-18 may be employed in FIGS. 19A-48, but that various details have been omitted from the figures to clearly illustrate the bonding pad configurations in relation to photoelectric conversion regions 333 and isolation regions RFTI (e.g., rear full trench isolation that penetrates all the way through a semiconductor substrate having the photoelectric conversion regions 333). For example, the transistors depicted in FIGS. 11-18 have been omitted from FIGS. 19A-48, but should be understood to exist in the transistor regions TR, which may include regions of the pixels 310 that are not visible due to the illustration of bonding pads CC. In addition, metal wiring layers (e.g., M1, M2, M3, etc.) have been omitted from the layouts of bonding pad configurations for the convenience of illustration. Further still, each schematic omits the OFG transistor 332 between transistor 411 and the photoelectric conversion region 333. However, the OFG transistor 332 may be included if desired.

Figure 19A:
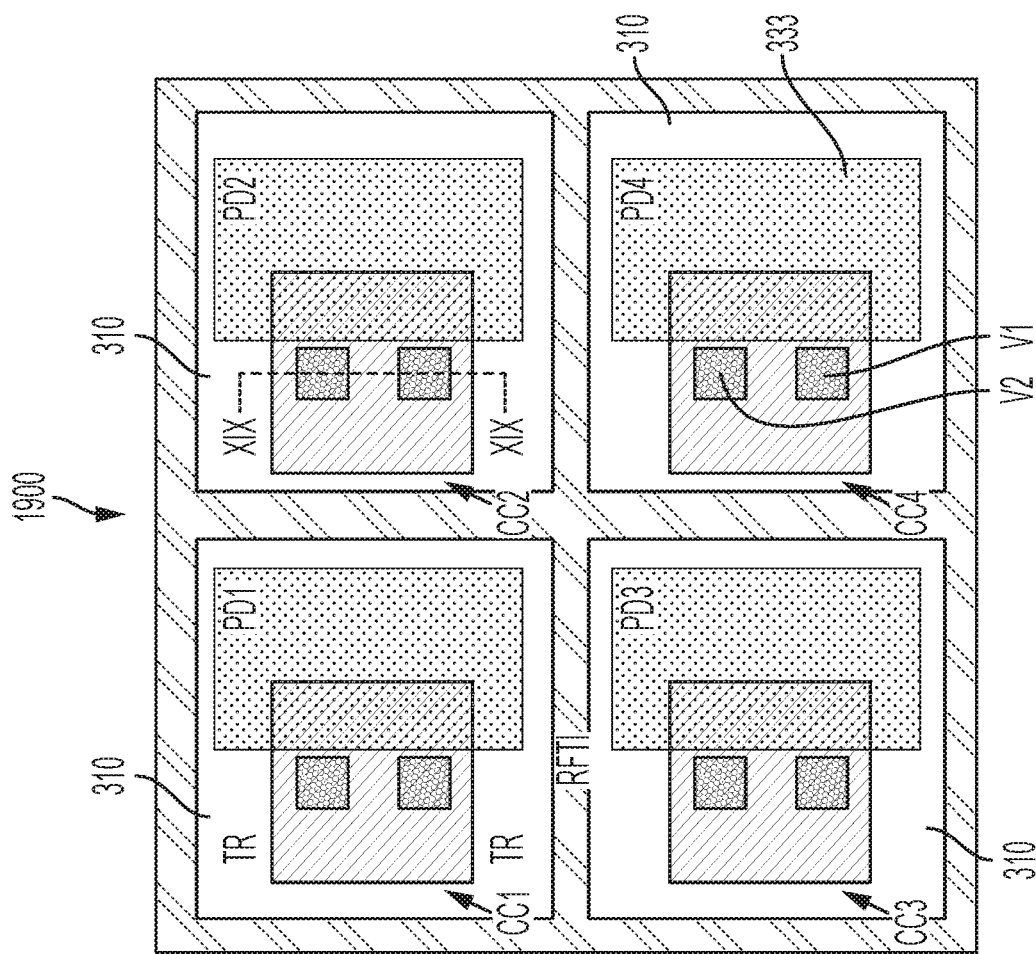
FIG. 19A illustrates an example schematic of the converter in FIG. 5B and an example layout of a bonding pad configuration to electrically connect circuitry in the logic chip to each pixel according to at least one example embodiment.
Figure 19A:
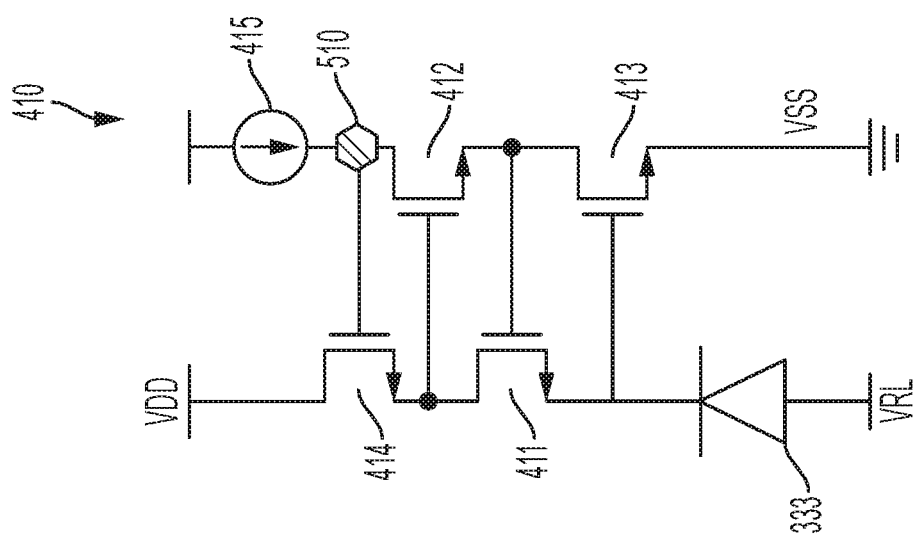

FIG. 19A illustrates an example schematic of the converter 410 for each pixel 310 with a node 510 and an example layout 1900 of a bonding pad configuration to electrically connect circuitry in the logic chip 202 to the node 510 for each pixel 310 according to at least one example embodiment. As shown in FIG. 19A, the node 510 is an output node of the converter 410 (see, for example, FIG. 5). As further shown, the layout 1900 includes pixels 310, where each pixel 310 has a transistor region TR adjacent to a photoelectric conversion region 333, a bonding pad CC (e.g., CC1, CC2, CC3, CC4) for bonding to the logic chip 202, and vias V1 and V2 for making electrical connection between the bonding pad CC and the node 510. As shown in FIG. 19A, each bonding pad CC overlaps at least part of a respective pixel 310 and may have a rectangular shape (e.g., a square shape). For example, an entirety of each bonding pad CC is overlapped by a respective pixel 310. As further shown, the vias V1/V2 may be aligned with one another in the second direction at a central region of each bonding pad CC. Here it should be appreciated that more or fewer vias may be included as desired. The vias V1 and V2 may overlap the transistor region TR, but not the photoelectric conversion region 333. However, example embodiments are not limited thereto, and the relative locations of V1/V2 and the photoelectric conversion region 333 may be altered if desired. FIGS. 19A-48 depict a node VRL, which may represent an electrical contact to the substrate having the photoelectric conversion region 333. The electrical contact may receive a potential, for example, a ground potential GND (or VSS), or a common signal having a negative potential to control parasitic capacitance(s).

FIG. 19A further illustrates an isolation region RFTI that isolates pixels 310 from one another by having a grid shape. Accordingly to at least one example embodiment the isolation region RFTI penetrates through the light-receiving chip 201 (i.e., full trench isolation). However, example embodiments are not limited thereto, and the isolation region RFTI may only partially penetrate the chip 201 (i.e., partial trench isolation).

Figure 19B:
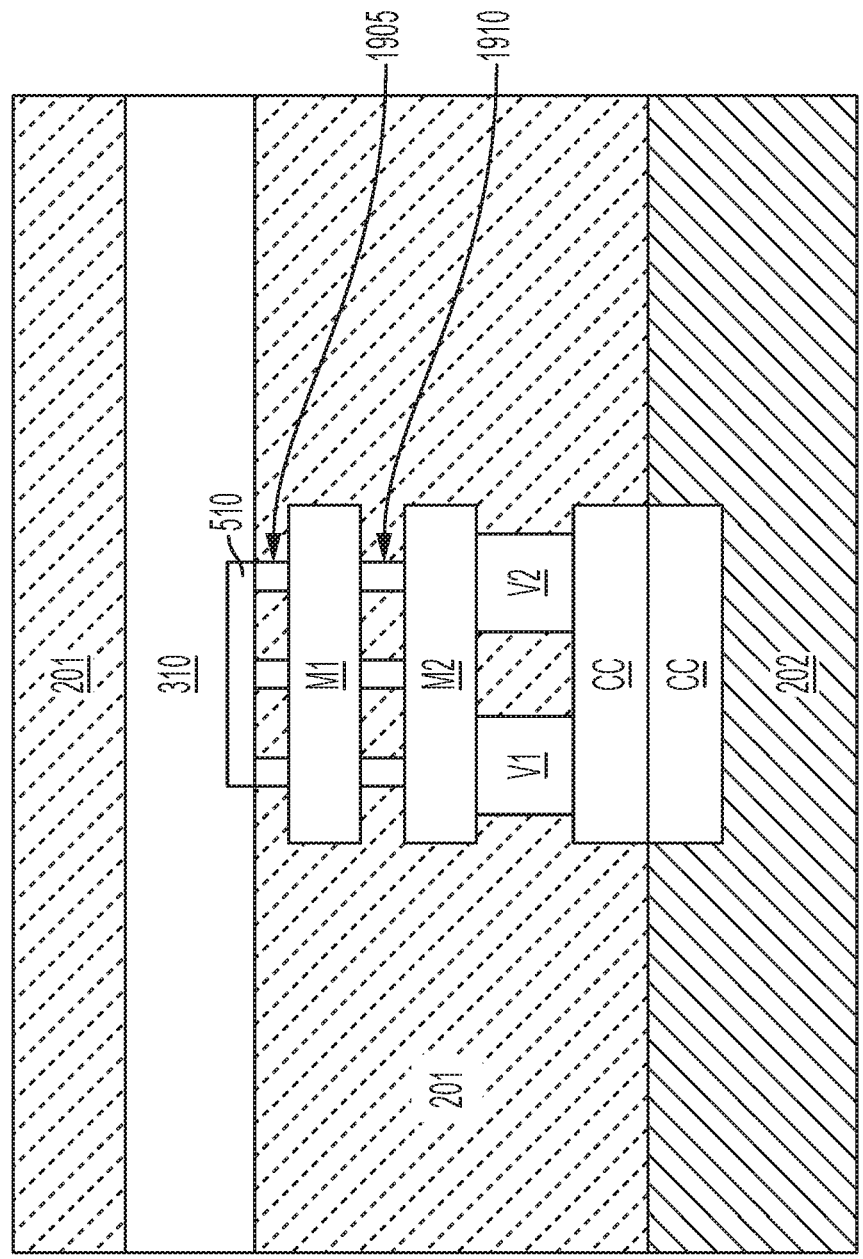
FIG. 19B illustrates a cross sectional view of FIG. 19A taken along line XIX-XIX.

FIG. 19B illustrates a cross sectional view of FIG. 19A taken along line XIX-XIX. FIG. 19B further illustrates the connection of the bonding pad CC in the light-receiving chip 201 to a bonding pad CC2 in the logic chip 202, contacts 1905, vias 1910, as well as one or more wiring layers M1/M2 (e.g., wiring layers comprising metal or other conductor) to make electrical connection to the pixel 310 (e.g., node 510 in FIG. 19A). Here, it should be understood that more or fewer metal wiring layers M1/M2 may exist if desired, and that the wiring layers M1/M2 may be formed in an insulating layer of the chip 201. It should also be understood that the transistors of the converter 410 may be electrically connected to one another through one or more of the wiring layers M1/M2, contacts 1905, and/or vias 1910.

Although not explicitly shown for FIGS. 20-48, it should be appreciated that the same or similar bonding pad structures and metal wiring structures M1/M2/1905 shown in the cross sectional view of FIG. 19B may be applied to the layouts in FIGS. 20-52.

Figure 20:
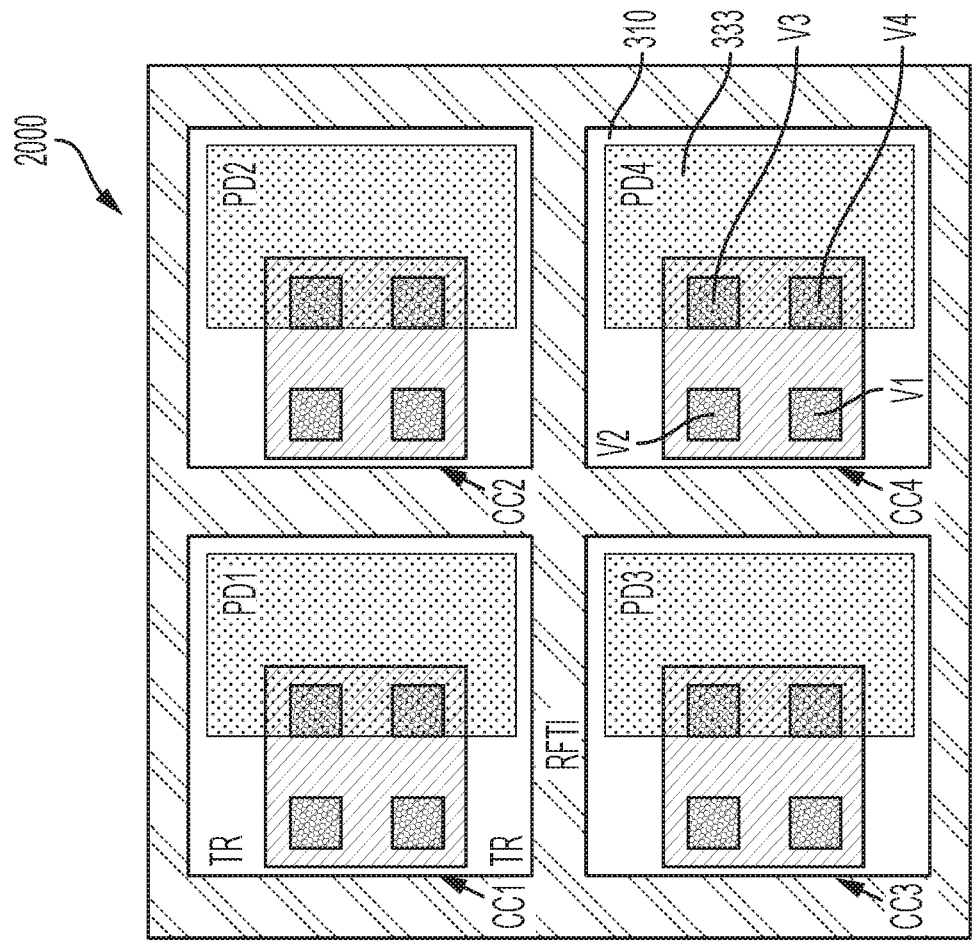
FIG. 20 illustrates an example schematic of the converter in FIG. 5B and an example layout of a bonding pad configuration to electrically connect circuitry in the logic chip to each pixel according to at least one example embodiment.
Figure 20:
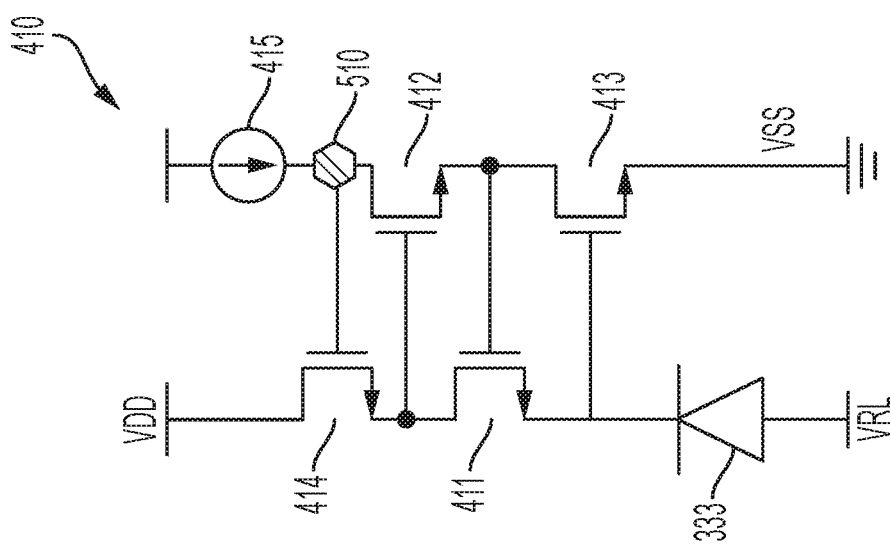

FIG. 20 illustrates an example schematic of the converter 410 for each pixel 310 with a node 510 and an example layout 2000 of a bonding pad configuration to electrically connect circuitry in the logic chip 202 to the node 510 for each pixel 310 according to at least one example embodiment. FIG. 20 is the same as FIG. 19 except that each bonding pad CC includes four vias V1, V2, V3, and V4. As shown, vias V3 and V4 overlap the photoelectric conversion region 333 while vias V1 and V2 overlap the transistor region TR. Additionally, vias V1 and V2 and vias V3 and V4 are aligned with one another in the second direction, while vias V1 and V3 and vias V2 and V4 are aligned with one another in the first direction. This bonding pad configuration may be repeated for all pixels 310a in the array.

Figure 21:
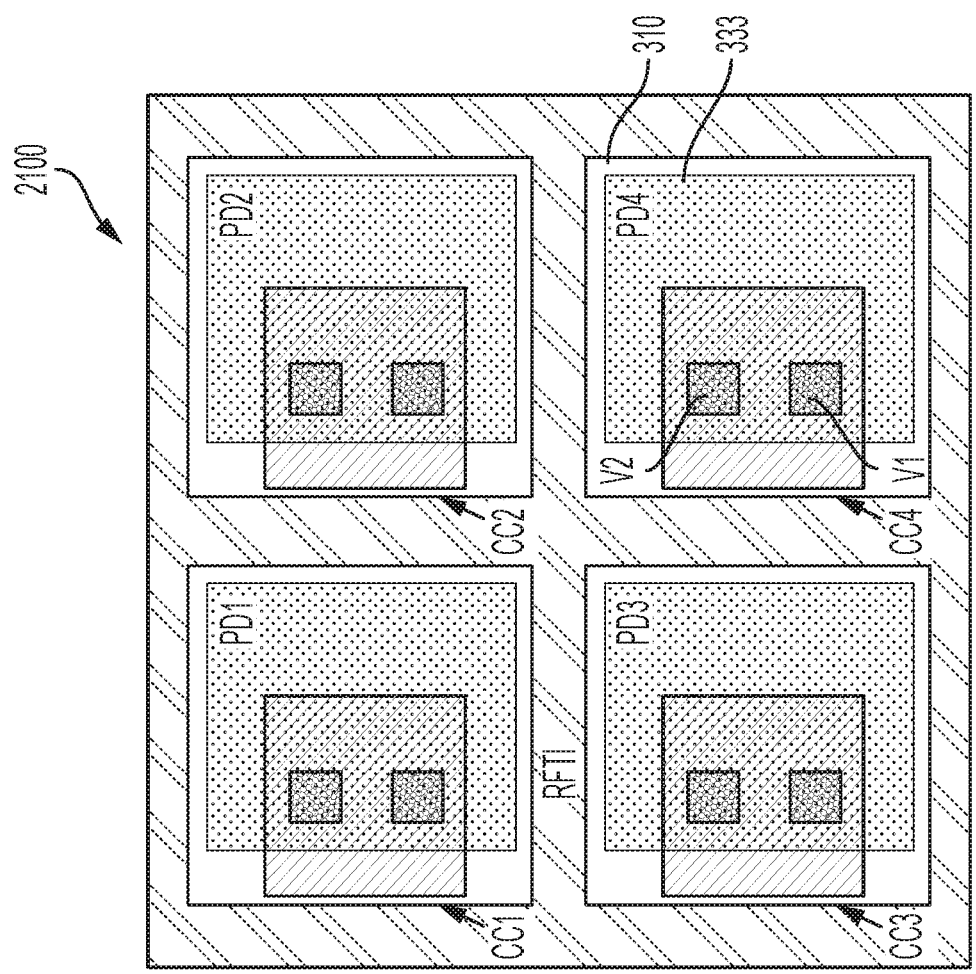
FIG. 21 illustrates an example schematic of the converter in FIG. 5B and an example layout of a bonding pad configuration to electrically connect circuitry in the logic chip to each pixel according to at least one example embodiment.
Figure 21:
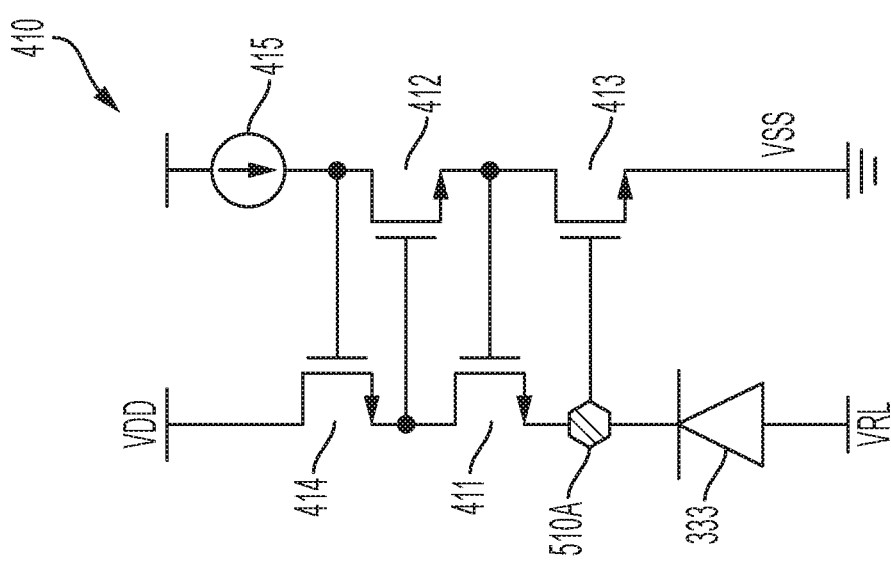

FIG. 21 illustrates an example schematic of the converter 410 for each pixel 310 with a node 510A and an example layout 2100 of a bonding pad configuration to electrically connect circuitry in the logic chip 202 to the node 510A for each pixel 310 according to at least one example embodiment. As shown, node 510A may be a node that stores charge from the photoelectric conversion region 333. FIG. 21 illustrates an embodiment where the node 510A exists in the light-receiving chip 201, but the transistors 411, 412, 413, and/or 414 are formed in the logic chip 202. Thus, the transistor region TR may be omitted to allow the photoelectric conversion regions 333 to be larger than in FIGS. 19A and 20, for example. In this case, the vias V1 and V2 overlap the photoelectric conversion region 333 while the bonding pads CC overlap only a respective pixel 310. In at least one example embodiment, the bonding pads CC have four vias in a same configuration as the vias V1 to V4 in FIG. 20. The above described bonding pad configuration may be repeated for all pixels 310a in the array.

Figure 22:
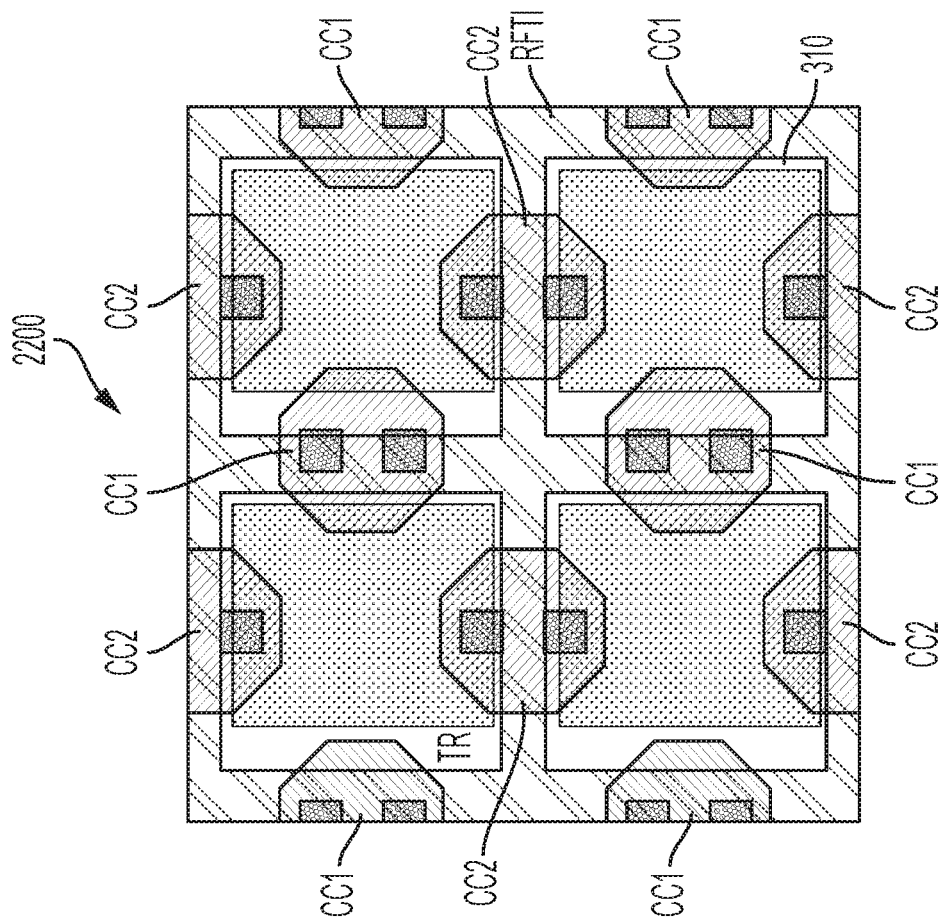
FIG. 22 illustrates an example schematic of the converter in FIG. 5B and an example layout of a bonding pad configuration to electrically connect circuitry in the logic chip to each pixel according to at least one example embodiment.
Figure 22:
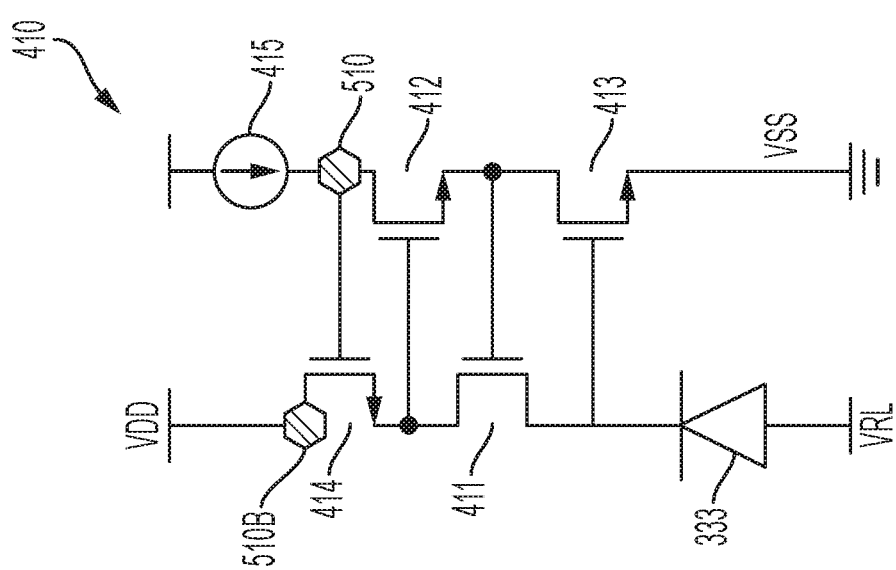

FIG. 22 illustrates an example schematic of the converter 410 for each pixel 310 with a node 510 and a node 510B and an example layout 2200 of a bonding pad configuration to electrically connect circuitry in the logic chip 202 to the nodes 510 and 510B for each pixel 310 according to at least one example embodiment. The node 510B may be a power supply node of the converter 410 that receives a power supply signal VDD. Here, it should be appreciated that bonding pads CC1/CC2 belong to one pixel 310. For example, in each pixel 310, bonding pad CC1 is electrically connected to node 510B while bonding pad CC2 is electrically connected to node 510. However, it should be understood that the electrical connections may be reversed if desired. As shown in FIG. 22, each bonding pad CC may have an octagonal shape. Further, bonding pads CC2 may be aligned with one another in the first and second directions while bonding pads CC1 may be aligned with one another in the first and second directions. Each bonding pad CC2 overlaps two pixels 310 and the isolation region RFTI. For example, vias V1 and V2 of each bonding pad may overlap a portion of the photoelectric conversion region 333 of each pixel 310. Bonding pads CC1 may also overlap portions of two pixels 310 and the isolation region RFTI. This bonding pad configuration may be repeated for all pixels 310a in the array.

FIG. 23 illustrates an example schematic of the converter 410 for each pixel 310 with a node 510 and a node 510B and an example layout 2300 of a bonding pad configuration to electrically connect circuitry in the logic chip 202 to the nodes 510 and 510B for each pixel 310 according to at least one example embodiment. The layout 2300 is similar to the layout 2200 in FIG. 22 except that the bonding pads CC are rectangular shaped. That is, bonding pad CC1 and bonding pad CC2 belong to one pixel 310 (e.g., lower left pixel). Bonding pad CC1 may be electrically connected to node 510 while bonding pad CC2 may be electrically connected to node 510B. However, these electrical connections may be reversed if desired. As shown, bonding pads CC1 overlap portions of adjacent pixels 310 and the isolation region RFTI while bonding pads CC2 also overlap portions of adjacent pixels 310 and the isolation region RFTI. Bonding pads CC1 may be aligned with one another in the first and second directions while bonding pads CC2 may be aligned with one another in the first and second directions. The vias V1 and V2 of each bonding pad may overlap portions of pixels 310 and/or isolation regions RFTI as shown. This bonding pad configuration may be repeated for all pixels 310a in the array.

Figure 24:
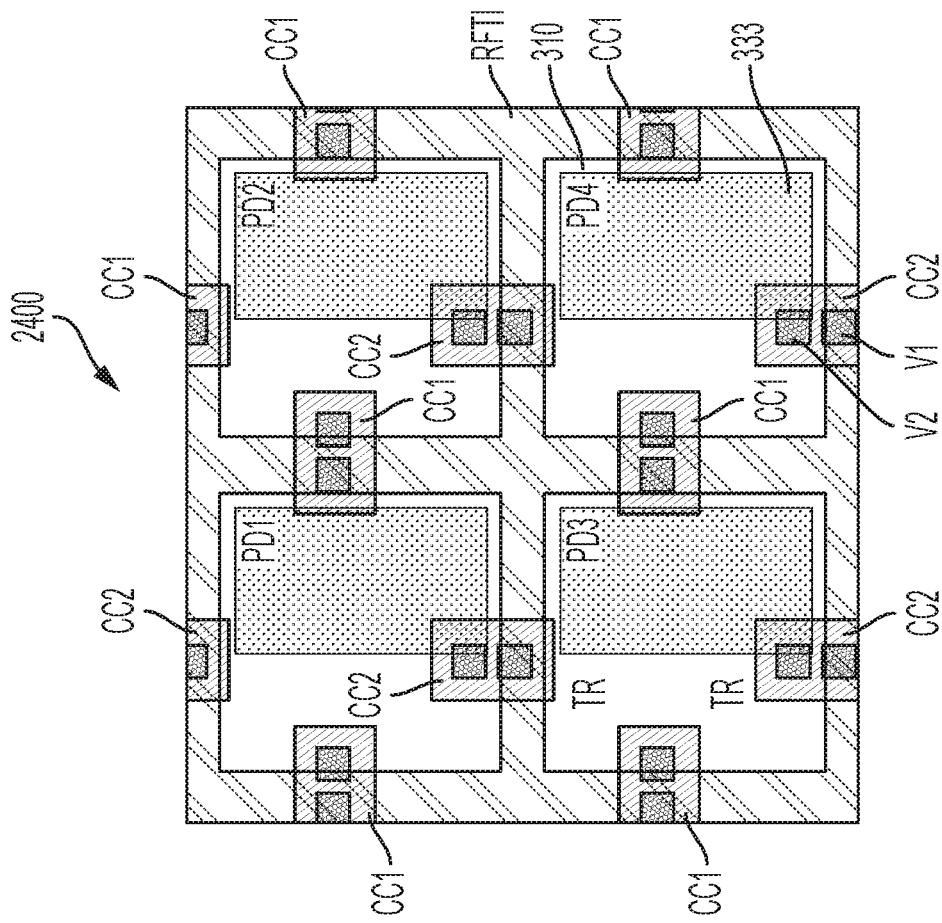
FIG. 24 illustrates an example schematic of the converter in FIG. 5B and an example layout of a bonding pad configuration to electrically connect circuitry in the logic chip to each pixel according to at least one example embodiment.
Figure 24:
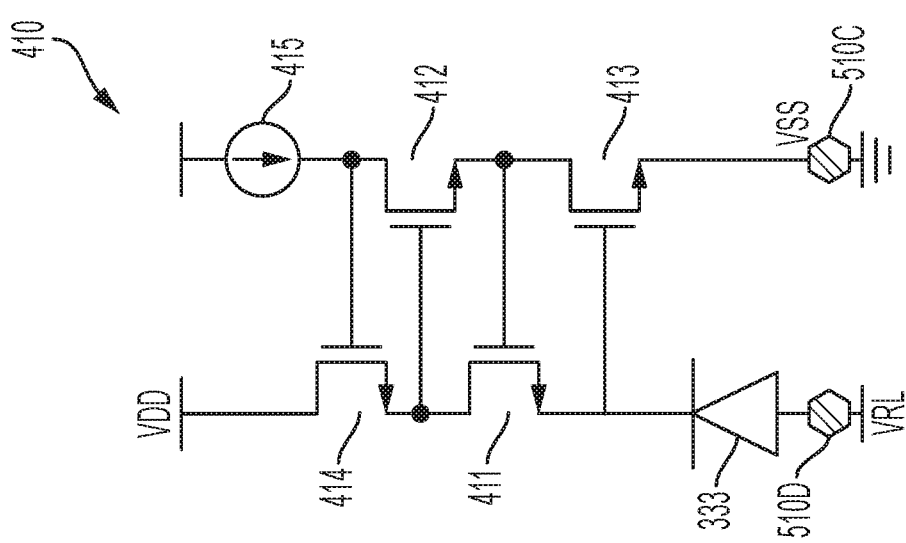

FIG. 24 illustrates an example schematic of the converter 410 for each pixel 310 with a node 510C and a node 510D and an example layout 2400 of a bonding pad configuration to electrically connect circuitry in the logic chip 202 to the nodes 510C and 510D for each pixel 310 according to at least one example embodiment. The node 510C may be a ground node of the converter 410 that receives a ground signal or a common signal while the node 510D may be an anode of the photoelectric conversion region 333. Alternatively, node 510D may be a contact on or in a substrate in which the PD is formed and may receive a potential (e.g., a negative potential). The layout 2400 is the same as the layout 2300 except for the bonding pads CC1 and CC2 in each pixel 310 being electrically connected to nodes 510C and 510D instead of nodes 510 and 510B. For example, for the lower left pixel 310, bonding pad CC1 is electrically connected to a node 510D or a 510C while bonding pad CC2 is electrically connected to the other one of node 510D or 510C. Bonding pads CC1 may be aligned with one another in the first and second directions, and bonding pads CC2 may be aligned with one another in the first and second directions. The same bonding configuration may be repeated for all pixels 310a in the array.

Figure 25:
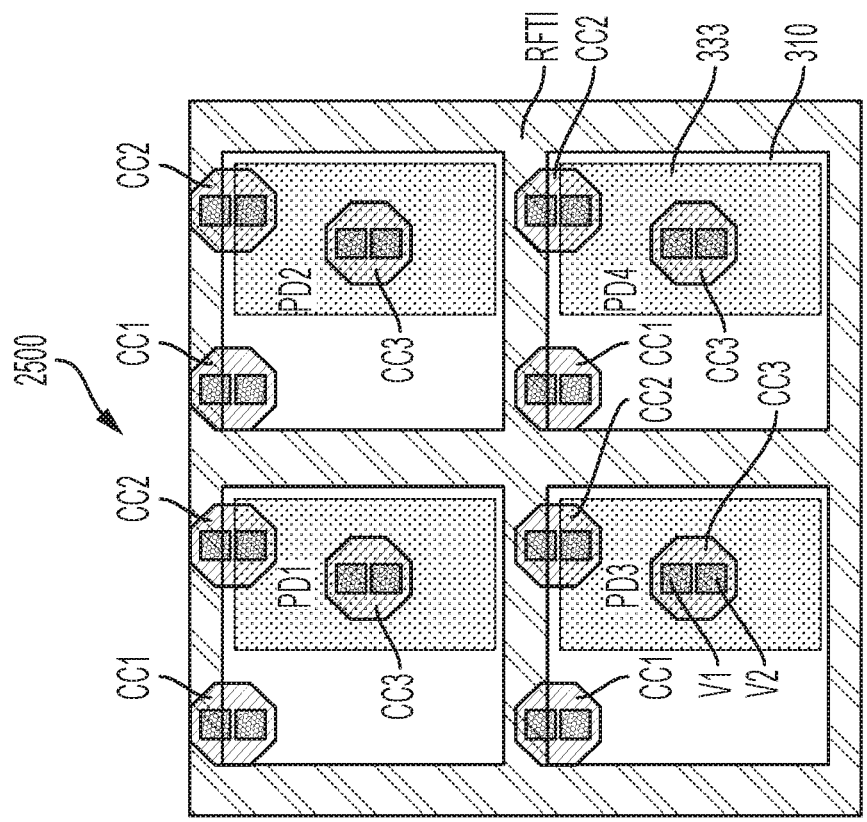
FIG. 25 illustrates an example schematic of the converter in FIG. 5B and an example layout of a bonding pad configuration to electrically connect circuitry in the logic chip to each pixel according to at least one example embodiment.
Figure 25:
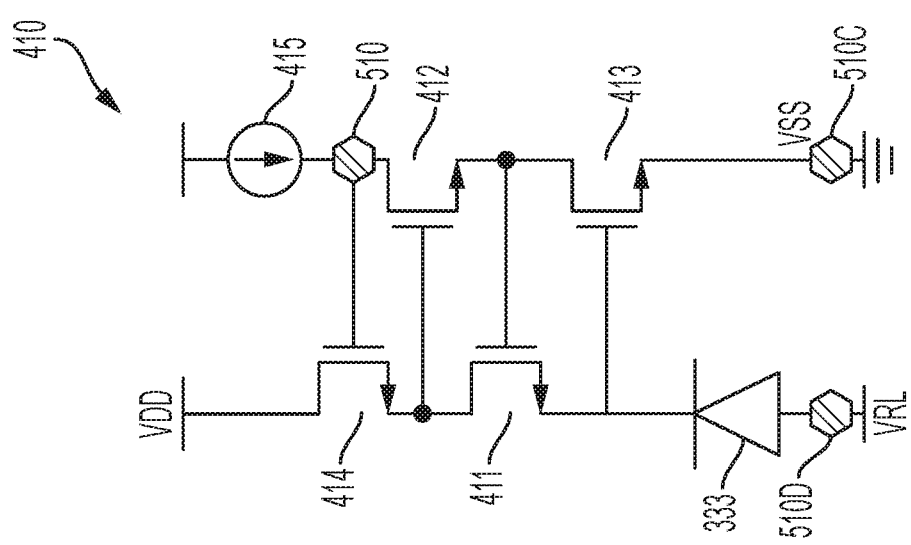

FIG. 25 illustrates an example schematic of the converter 410 for each pixel 310 with a node 510, a node 510C, and a node 510D and an example layout 2500 of a bonding pad configuration to electrically connect circuitry in the logic chip 202 to the nodes 510, 510C, and 510D for each pixel 310 according to at least one example embodiment. As shown, each pixel 310 may include bonding pads CC1 to CC3 for making respective electrical connections between the nodes 510, 510C, and 510D and the logic chip 202. In each pixel, 310, the bonding pad CC1 may be electrically connected to node 510C, bonding pad CC2 may be electrically connected to node 510, and bonding pad CC3 may be electrically connected to node 510D. However, the electrical connections of bonding pads to nodes in each pixel 310 may be altered as desired. As shown in FIG. 25, bonding pad CC1 may overlap part of a pixel 310 and the isolation region RFTI, bonding pad CC2 may overlap part of the photoelectric conversion region 333 and the isolation region RFTI, and bonding pad CC3 may be entirely overlapped by the photoelectric conversion region 333. Bonding pads CC1 and CC2 may be aligned with one another in the first direction, while bonding pads CC1 and CC2 of adjacent pixels may be aligned with one another in the second direction. Bonding pads CC3 for adjacent pixels 310 may be aligned with one another in the first direction and the second direction. The via V2 of bonding pad CC2 may overlap the photoelectric conversion region 333 while via V1 does not overlap the photoelectric conversion region 333. In at least one example embodiment, sizes of the bonding pads CC1 to CC3 may be smaller than shown relative to the photoelectric region 333, and as such, a relative distance between each bonding pad may be smaller than shown. This bonding pad configuration may be repeated for all pixels 310a in the array.

Figure 26:
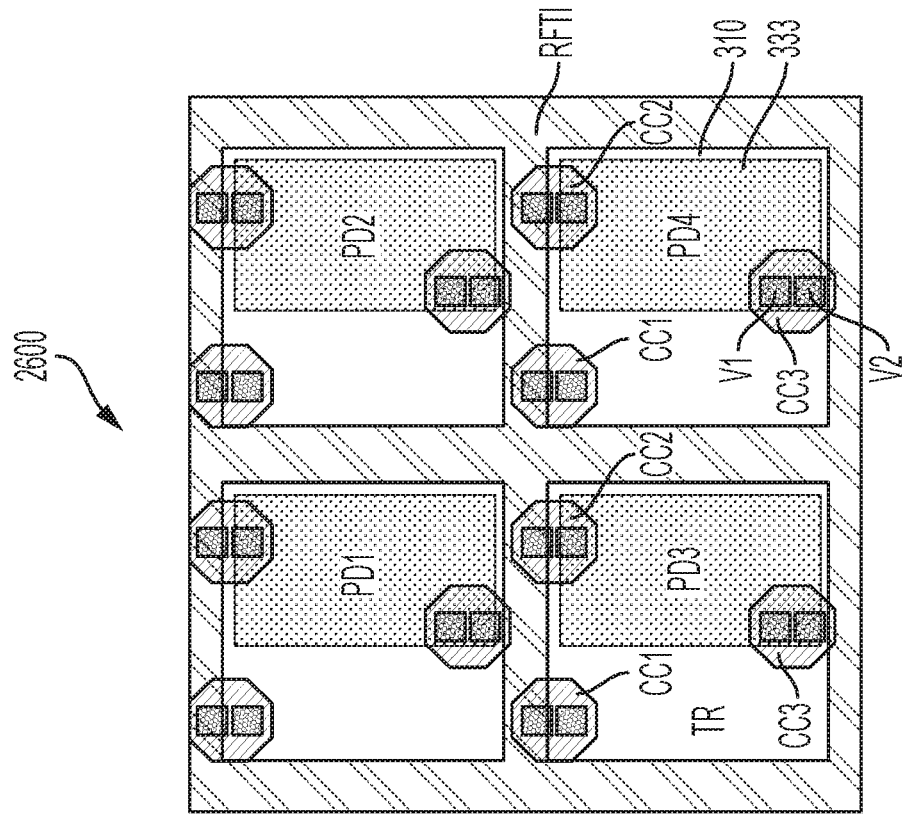
FIG. 26 illustrates an example schematic of the converter in FIG. 5B and an example layout of a bonding pad configuration to electrically connect circuitry in the logic chip to each pixel according to at least one example embodiment.
Figure 26:
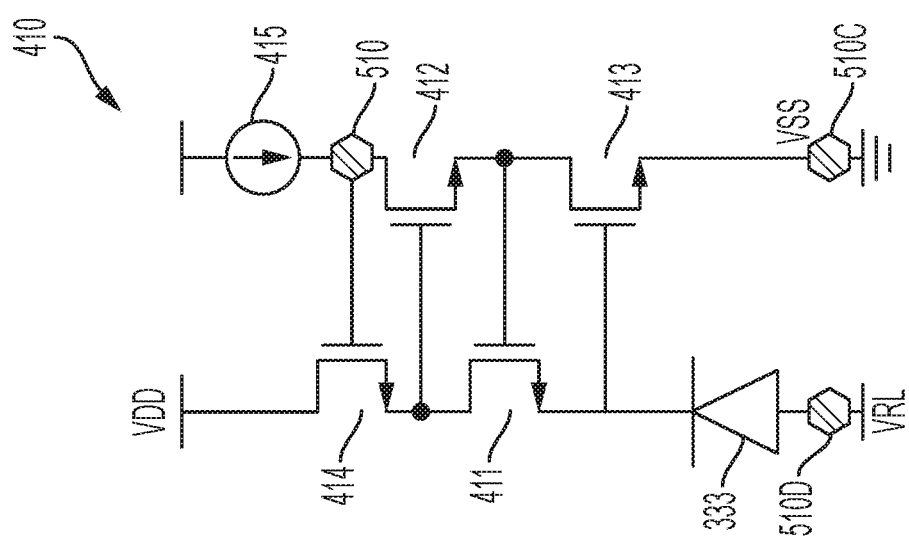

FIG. 26 illustrates an example schematic of the converter 410 for each pixel 310 with a node 510, a node 510C, and a node 510D and an example layout 2600 of a bonding pad configuration to electrically connect circuitry in the logic chip 202 to the nodes 510, 510C, and 510D for each pixel 310 according to at least one example embodiment. FIG. 26 is the same as FIG. 25 except that bonding pad CC3 in each pixel 310 is located in a lower region of the pixel 310 so as to overlap the photoelectric conversion region 333, the transistor region TR, and part of the isolation region RFTI. As shown, vias V1 and V2 for bonding pad CC3 may be overlapped by the photoelectric conversion region 333. This bonding pad configuration may be repeated for all pixels 310a in the array.

Figure 27:
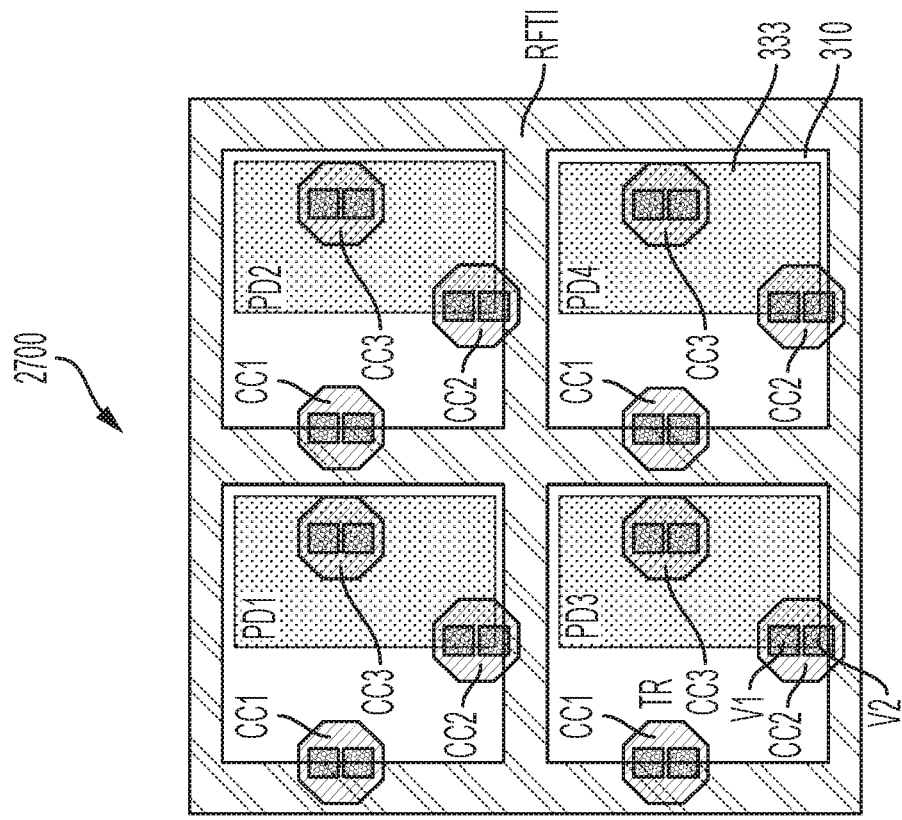
FIG. 27 illustrates an example schematic of the converter in FIG. 5B and an example layout of a bonding pad configuration to electrically connect circuitry in the logic chip to each pixel according to at least one example embodiment.
Figure 27:
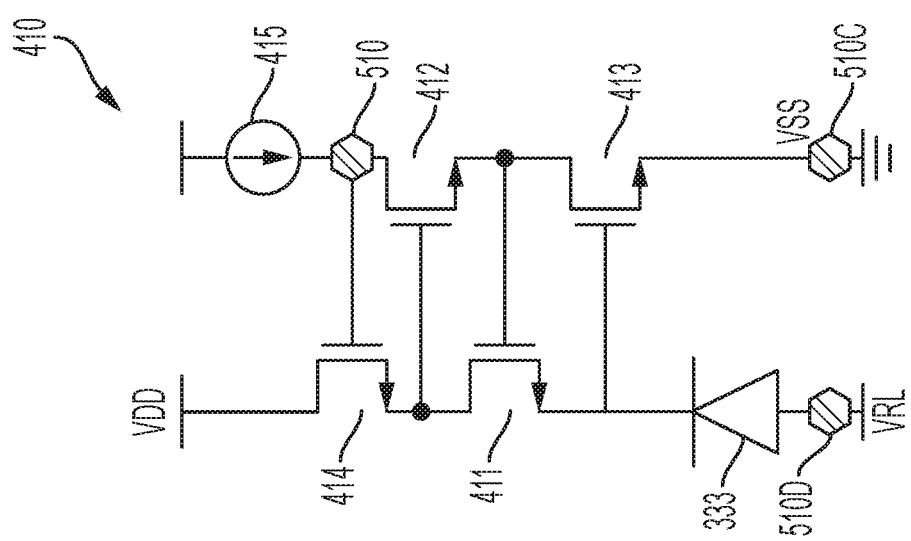

FIG. 27 illustrates an example schematic of the converter 410 for each pixel 310 with a node 510, a node 510C, and a node 510D and an example layout 2700 of a bonding pad configuration to electrically connect circuitry in the logic chip 202 to the nodes 510, 510C, and 510D for each pixel 310 according to at least one example embodiment. FIG. 27 is the same as FIG. 26 except that the bonding pads CC1 and CC3 have been moved closer to a central region of each pixel 310. As shown, bonding pad CC1 may overlap a portion of the transistor region TR and the isolation region RFTI while bonding pad CC3 may be entirely overlapped by the photoelectric conversion region 333. As shown, the vias V1 and V2 of CC1 may overlap both the transistor region TR and isolation region RFTI. This bonding pad configuration may be repeated for all pixels 310a in the array.

FIG. 28 illustrates an example schematic of the converter 410 for each pixel 310 with a node 510, a node 510B, and a node 510D and an example layout 2800 of a bonding pad configuration to electrically connect circuitry in the logic chip 202 to the nodes 510, 510B, and 510D for each pixel 310 according to at least one example embodiment. FIG. 28 is similar to FIG. 26 except that one of the bonding pads is electrically connected to node 510B instead of node 510C, and the bonding pad CC3 is in a different location. In at least one example embodiment, the bonding pad CC1 is electrically connected to the power supply node 510B, the bonding pad CC2 is electrically connected to the node 510D, and bonding pad CC3 is electrically connected to node 510. However, the electrical connections may be altered if desired. As shown, bonding pads CC1 and CC2 are aligned with one another in the first and second directions, while bonding pads CC3 are aligned with one another in the second direction but offset from bonding pads CC2 in the first direction. This bonding pad configuration may be repeated for all pixels 310a in the array.

FIG. 29 illustrates an example schematic of the converter 410 for each pixel 310 with a node 510, a node 510B, and a node 510D and an example layout 2900 of a bonding pad configuration to electrically connect circuitry in the logic chip 202 to the nodes 510, 510B, and 510D for each pixel 310 according to at least one example embodiment. FIG. 29 is the same as FIG. 28 except that the locations of bonding pads CC3 are in a lower central region of each pixel 310. As shown, a bonding pad CC3 may overlap portions of the photoelectric conversion region 333, the transistor region TR, and the isolation region RFTI. This bonding pad configuration may be repeated for all pixels 310a in the array.

FIG. 30 illustrates an example schematic of the converter 410 for each pixel 310 with a node 510, a node 510B, and a node 510D and an example layout 3000 of a bonding pad configuration to electrically connect circuitry in the logic chip 202 to the nodes 510, 510B, and 510D for each pixel 310 according to at least one example embodiment. FIG. 30 is the same as FIG. 29 except for the locations of bonding pads CC1 and CC2 are different. For example, bonding pads CC1 and CC2 are closer to bonding pads CC3 in each pixel 310. As shown, the entirety of a bonding pad CC3 may be overlapped by the photoelectric conversion region 333, while a bonding pad CC1 may overlap the transistor region TR and the isolation region RFTI with the vias V1 and V2 overlapping both the transistor region TR and the isolation region RFTI. This bonding pad configuration may be repeated for all pixels 310a in the array.

FIG. 31 illustrates an example schematic of the converter 410 for each pixel 310 with a node 510B, a node 510C, and a node 510D and an example layout 3100 of a bonding pad configuration to electrically connect circuitry in the logic chip 202 to the nodes 510B, 510C, and 510D for each pixel 310 according to at least one example embodiment. For each pixel 310, bonding pad CC1 may electrically connect to node 510B, bonding pad CC2 may electrically connect to node 510C, and bonding pad CC3 may electrically connect to node 510D. However, the electrical connections between nodes and bonding pads may be altered as desired. As shown, bonding pad CC1 may overlap the isolation region RFTI and the transistor region TR, bonding pad CC2 may overlap the isolation region RFTI and the photoelectric conversion region 333, and bonding pad CC3 overlaps the photoelectric conversion region 333. The vias V1 and V2 of each bonding pad may overlap portions of the layout 3100 as shown. Bonding pads CC1 and CC2 may be aligned with one another in the first and second directions, and bonding pads CC3 may be aligned with one another in the first and second directions. This bonding pad configuration may be repeated for all pixels 310a in the array.

FIG. 32 illustrates an example schematic of the converter 410 for each pixel 310 with a node 510B, a node 510C, and a node 510D and an example layout 3200 of a bonding pad configuration to electrically connect circuitry in the logic chip 202 to the nodes 510B, 510C, and 510D for each pixel 310 according to at least one example embodiment. FIG. 32 is the same as FIG. 31 except for the location of bonding pads CC3 being different. As shown, bonding pads CC3 are located at a lower region of each pixel 310 and overlap the photoelectric conversion region 333, the transistor region TR and the isolation region RFTI. This bonding pad configuration may be repeated for all pixels 310a in the array.

Figure 33:
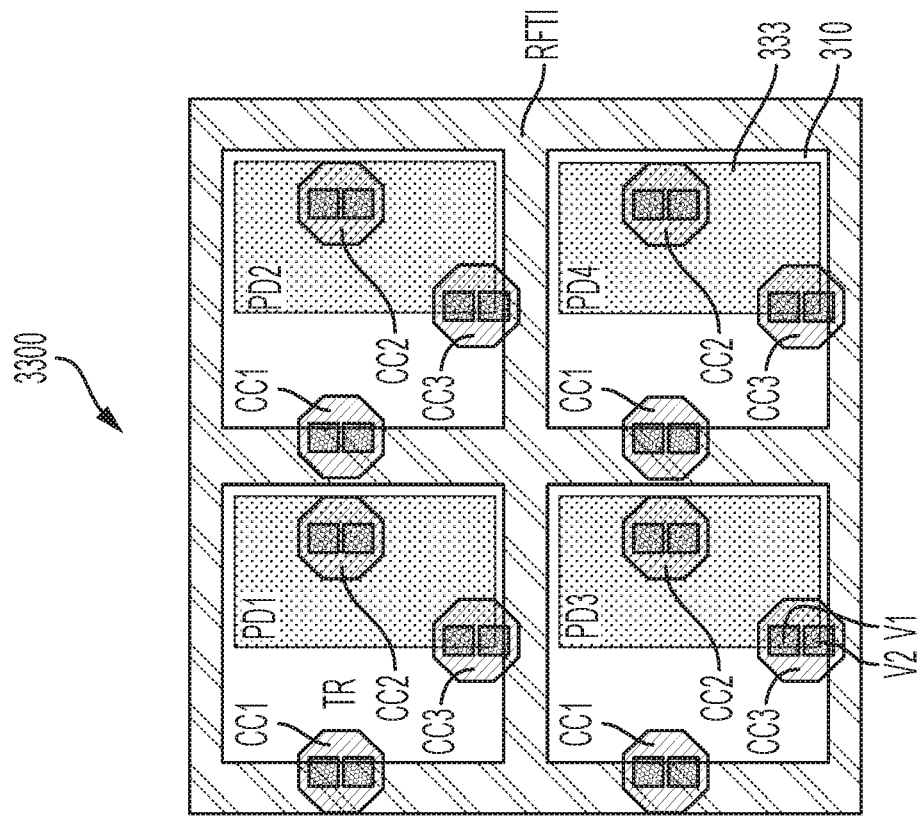
FIG. 33 illustrates an example schematic of the converter in FIG. 5B and an example layout of a bonding pad configuration to electrically connect circuitry in the logic chip to each pixel according to at least one example embodiment.
Figure 33:
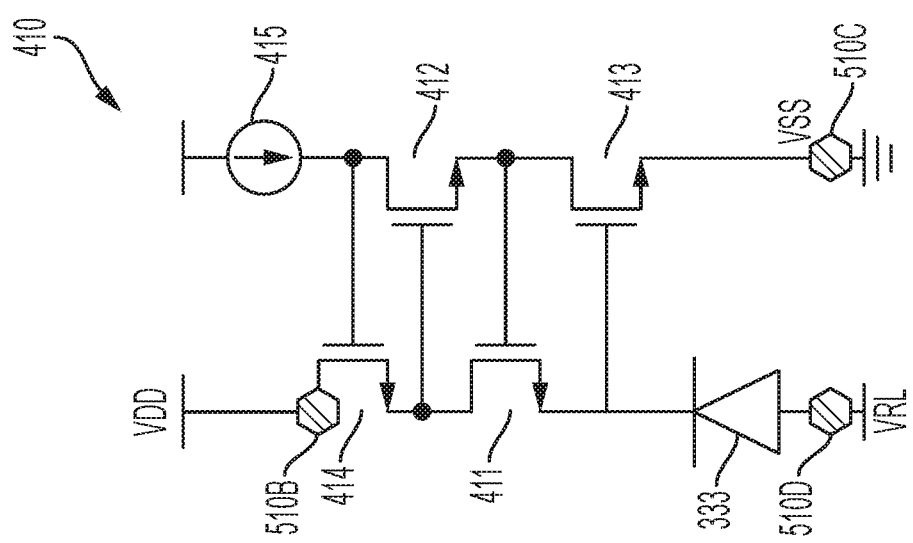

FIG. 33 illustrates an example schematic of the converter 410 for each pixel 310 with a node 510B, a node 510C, and a node 510D and an example layout 3300 of a bonding pad configuration to electrically connect circuitry in the logic chip 202 to the nodes 510B, 510C, and 510D for each pixel 310 according to at least one example embodiment. FIG. 33 is the same as FIG. 32 except that bonding pads CC1 and CC2 are closer to bonding pad CC3 in each pixel 310. As shown, bonding pad CC1 may overlap the transistor region and the isolation region RFTI, and bonding pad CC2 may be entirely overlapped by the photoelectric conversion region 333. Vias V1 and V2 of bonding pad CC1 may overlap the transistor region TR and the isolation region RFTI.

Figure 34:
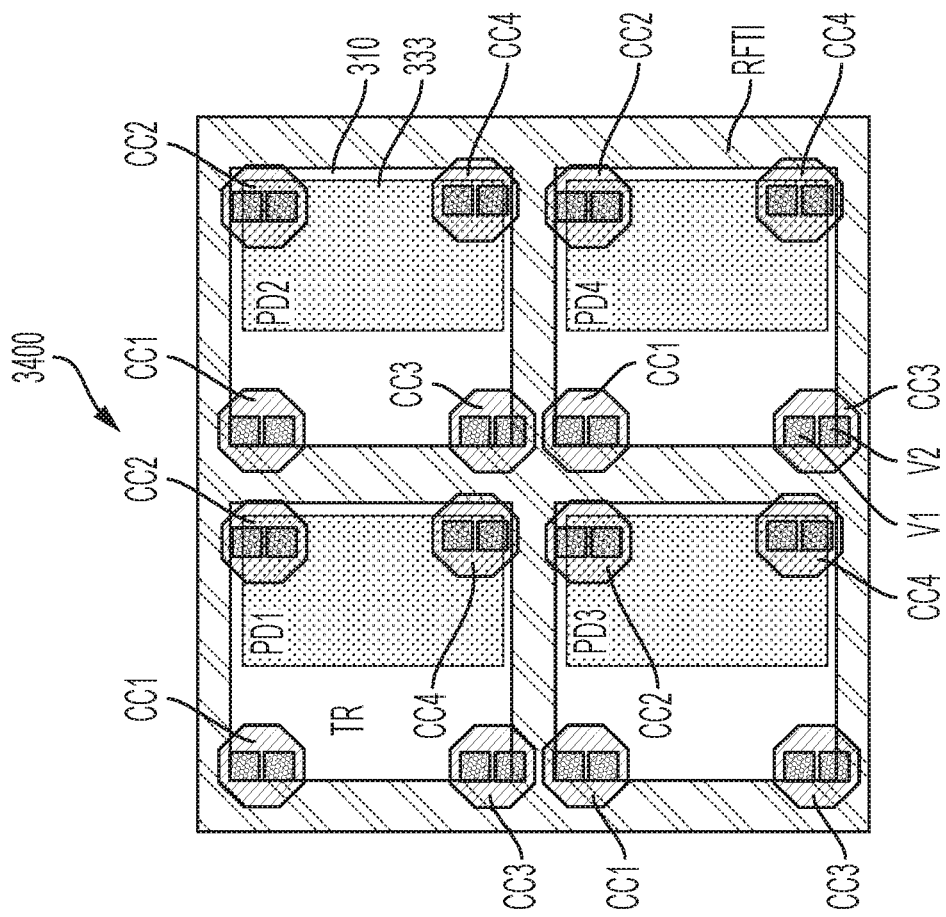
FIG. 34 illustrates an example schematic of the converter in FIG. 5B and an example layout of a bonding pad configuration to electrically connect circuitry in the logic chip to each pixel according to at least one example embodiment.
Figure 34:
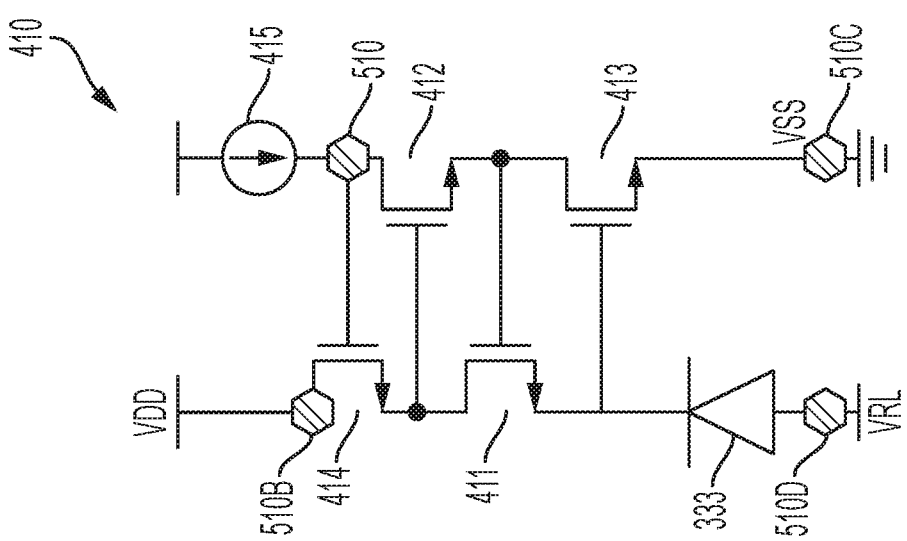

FIG. 34 illustrates an example schematic of the converter 410 for each pixel 310 with a node 510, a node 510B, a node 510C, and a node 510D and an example layout 3400 of a bonding pad configuration to electrically connect circuitry in the logic chip 202 to the nodes 510, 510B, 510C, and 510D for each pixel 310 according to at least one example embodiment. As shown in FIG. 34, bonding pads CC1, CC2, CC3, CC4 may be located at corner portions of each pixel 310. In one embodiment, bonding pad CC1 is electrically connected to node 510B, bonding pad CC2 is electrically connected to node 510, bonding pad CC3 is electrically connected to bonding pad node 510C, and bonding pad CC4 is electrically connected to node 510D. However, the electrically connections may be altered as desired. As shown, bonding pads CC1 and CC3 are aligned with one another in the second direction, bonding pads CC2 and CC4 are aligned with one another in the second direction, bonding pads CC1 and CC2 are aligned with one another in the first direction, and bonding pads CC3 and CC4 are aligned with one another in the first direction. As also shown, bonding pads CC1 and CC3 overlap the transistor region TR and the isolation region RFTI while bonding pads CC2 and CC4 overlap the photoelectric conversion region 333 and the isolation region RFTI. Vias V1 and V2 of each bonding pad CC overlap portions of transistor region TR, isolation region RFTI, and/or photoelectric conversion region 333, as illustrated. This bonding pad configuration may be repeated for all pixels 310a in the array.

Figure 35:
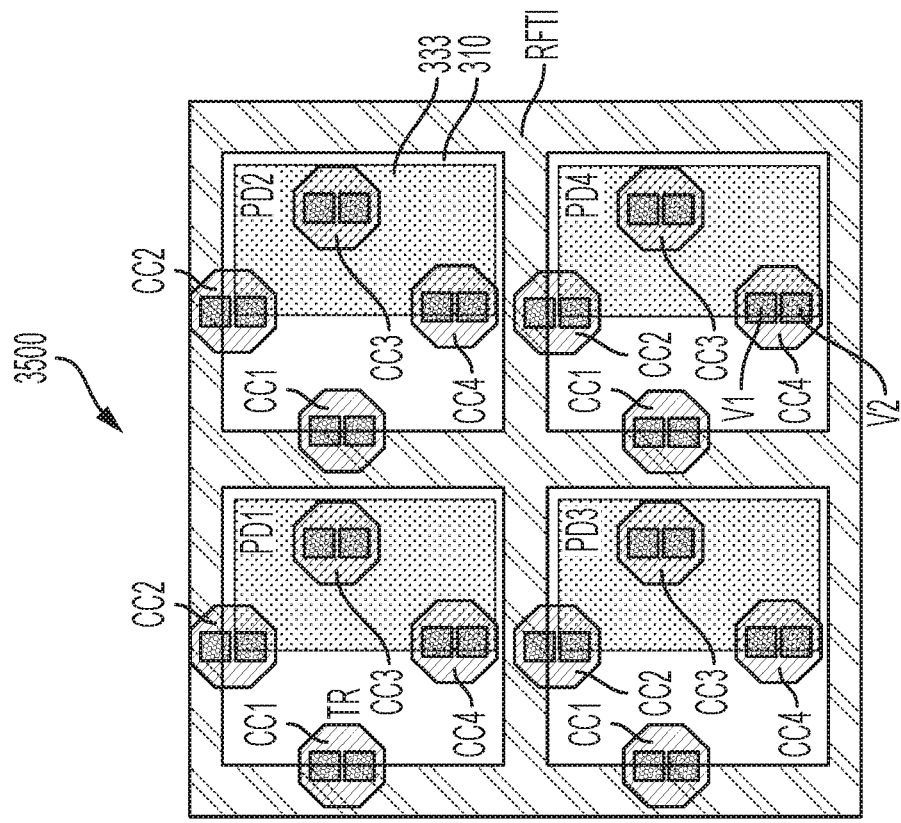
FIG. 35 illustrates an example schematic of the converter in FIG. 5B and an example layout of a bonding pad configuration to electrically connect circuitry in the logic chip to each pixel according to at least one example embodiment.
Figure 35:
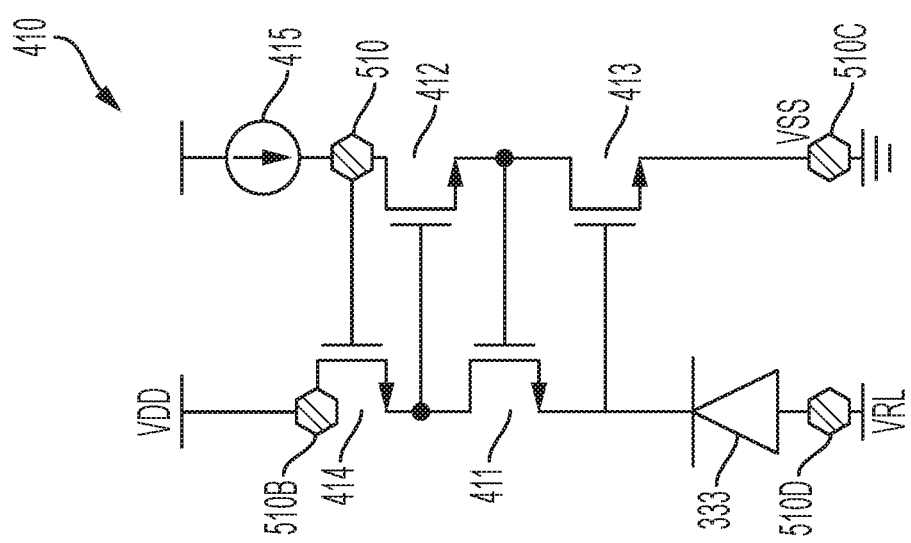

FIG. 35 illustrates an example schematic of the converter 410 for each pixel 310 with a node 510, a node 510B, a node 510C, and a node 510D and an example layout 3500 of a bonding pad configuration to electrically connect circuitry in the logic chip 202 to the nodes 510, 510B, 510C, and 510D for each pixel 310 according to at least one example embodiment. FIG. 35 is the same as FIG. 34 except that the bonding pads CC1 to CC4 for each pixel 310 are in a diamond configuration instead of a rectangle configuration, so that bonding pads CC1 and CC3 are aligned with one another in the first direction and so bonding pads CC1 (and CC3) of vertically adjacent pixels are aligned with one another in the second direction. Bonding pads CC2 and CC4 are aligned with one another in the second direction, and bonding pads CC2 (and CC4) of horizontally adjacent pixels are aligned with one another in the first direction. Bonding pad CC1 may overlap the isolation region RFTI and the transistor region TR, and bonding bad CC2 may overlap the transistor region TR, the isolation region RFTI, and the photoelectric conversion region 333. Bonding pad CC3 may be entirely overlapped by the photoelectric conversion region 333, and bonding pad CC4 may overlap the photoelectric conversion region 333 and the transistor region TR. This bonding pad configuration may be repeated for all pixels 310a in the array.

Figure 36:
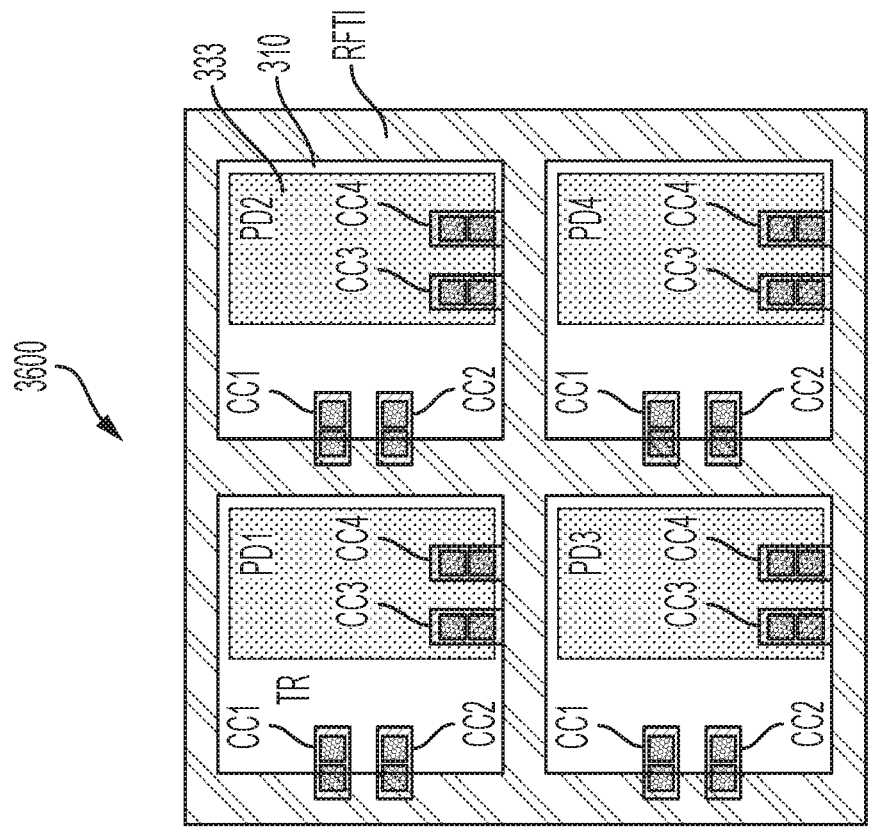
FIG. 36 illustrates an example schematic of the converter in FIG. 5B and an example layout of a bonding pad configuration to electrically connect circuitry in the logic chip to each pixel according to at least one example embodiment.
Figure 36:
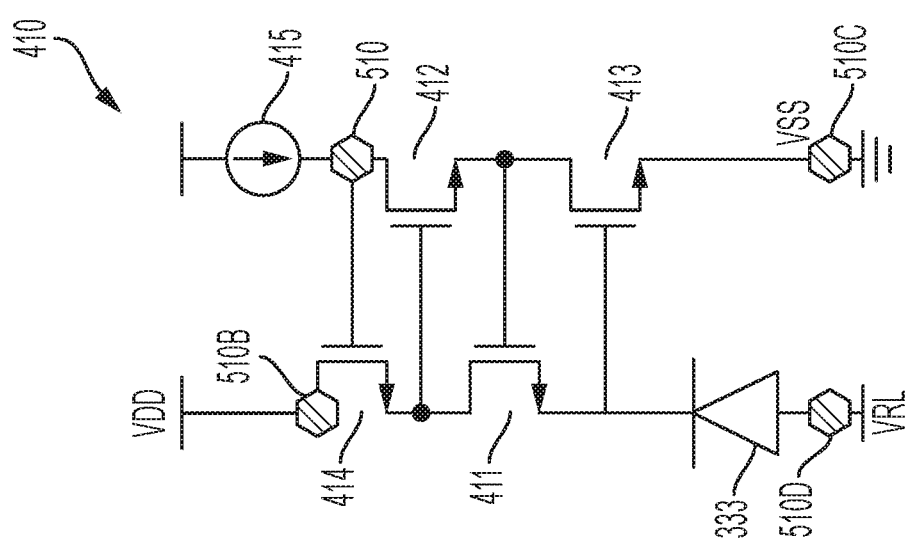

FIG. 36 illustrates an example schematic of the converter 410 for each pixel 310 with a node 510, a node 510B, a node 510C, and a node 510D and an example layout 3600 of a bonding pad configuration to electrically connect circuitry in the logic chip 202 to the nodes 510, 510B, 510C, and 510D for each pixel 310 according to at least one example embodiment. FIG. 36 is the same as FIG. 35 except that the shapes of bonding pads CC1 to CC4 are rectangular, the locations of CC1 to CC4 are different, and the size of bonding pads CC1 to CC4 may be smaller with a smaller distance between them. As shown, CC1 and CC2 may be at a same side of the photoelectric conversion region 333, while CC3 and CC4 may be at a same other side of the photoelectric conversion region 333. As shown, bonding pads CC1 and CC2 are aligned with one another in the second direction and aligned with bonding pads CC1 and CC2 of a neighboring pixel 310 in the first direction. Bonding pads CC3 and CC4 are aligned with one another in the first direction and are aligned with bonding pads CC3 and CC4 of a neighboring pixel 310 in the second direction. Bonding pads CC1 and CC2 may overlap the isolation region RFTI and the transistor region TR, while bonding pads CC3 and CC4 overlap the photoelectric conversion region 333. This bonding pad configuration may be repeated for all pixels 310a in the array.

Here, it should be appreciated that FIGS. 20-36 describe various layouts where the converter 410 has a 4T configuration. FIGS. 37-51 will now be described and are directed to example embodiments where the converter 410 has a 2T configuration, which may allow for a smaller transistor region TR, and thus, a larger photoelectric conversion region 333 than the 4T configuration.

Figure 37:
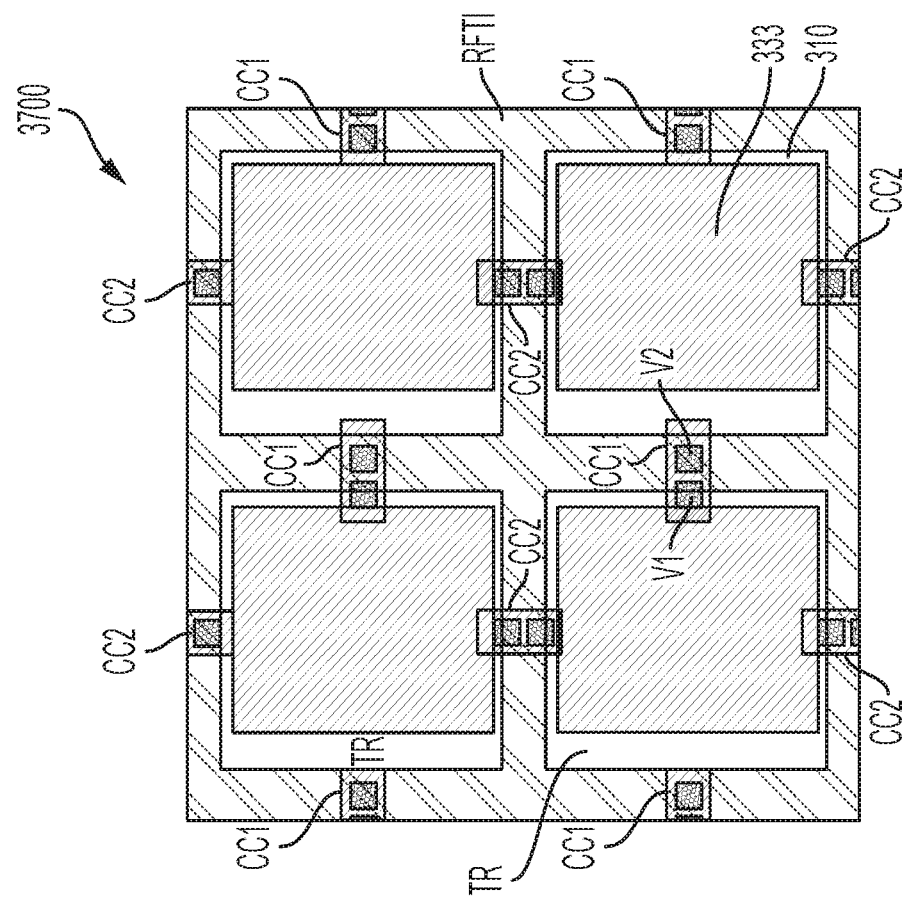
FIG. 37 illustrates an example schematic of the converter in FIG. 5B and an example layout of a bonding pad configuration to electrically connect circuitry in the logic chip to each pixel according to at least one example embodiment.
Figure 37:
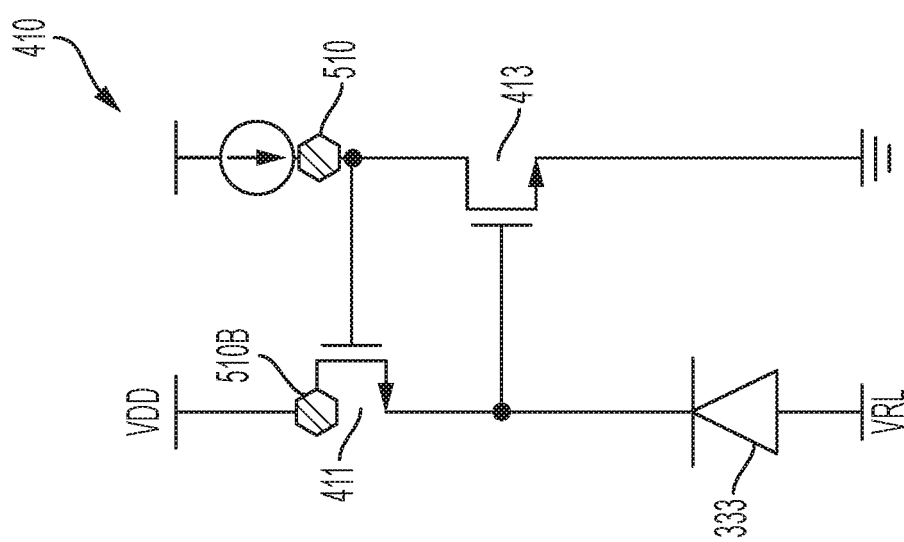

FIG. 37 illustrates an example schematic of the converter 410 for each pixel 310 with a node 510 and a node 510B, and an example layout 3700 of a bonding pad configuration to electrically connect circuitry in the logic chip 202 to the nodes 510 and 510B for each pixel 310 according to at least one example embodiment. As shown, each pixel 310 has two associated bonding pads CC1 and CC2. Bonding pad CC1 may be electrically connected to node 510B and bonding pad CC2 may be electrically connected to node 510. As in FIGS. 20-36, node 510 is an output node of the converter 410 and node 510B is a power supply node of the converter 410 that receives a power supply signal VDD. As shown, bonding pads CC1 and CC2 overlap two pixels 310 and the isolation region RFTI. Further, bonding pads CC1 of neighboring pixels 312 may be aligned with one another in the first and second direction, while bonding pads CC2 of neighboring pixels 312 may be aligned with one another in the first and second direction. This bonding pad configuration may be repeated for all pixels 310a in the array.

Figure 38:
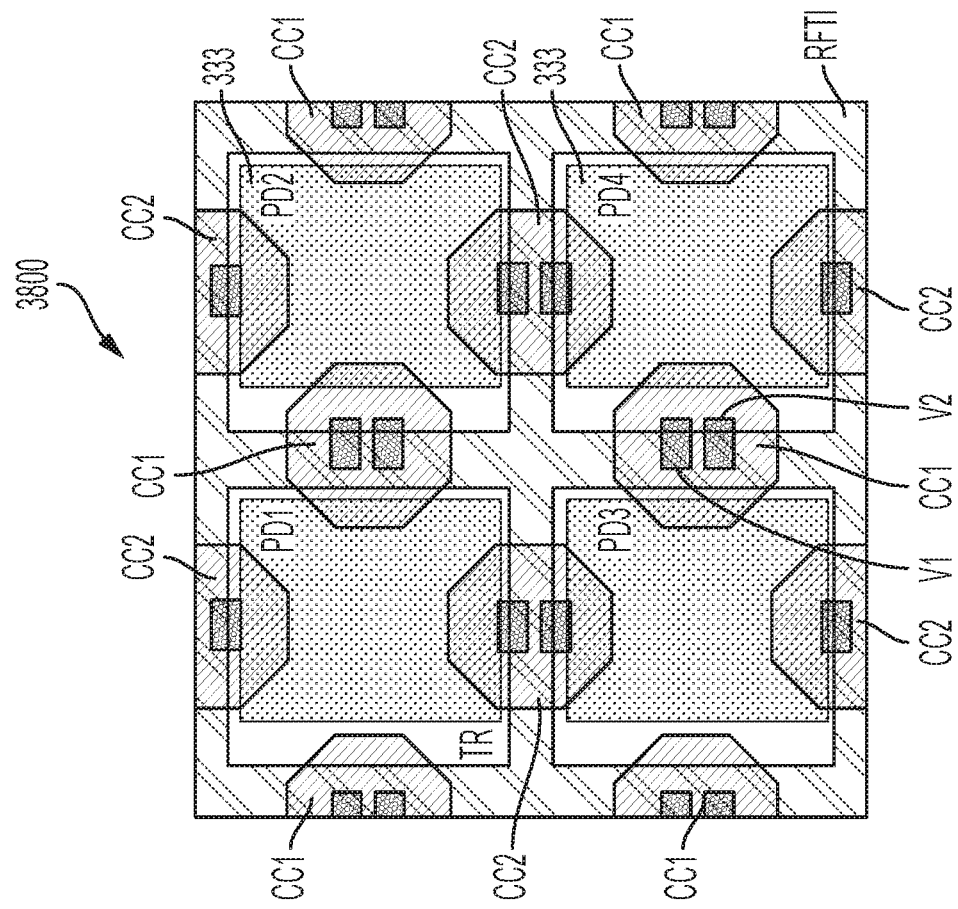
FIG. 38 illustrates an example schematic of the converter in FIG. 5B and an example layout of a bonding pad configuration to electrically connect circuitry in the logic chip to each pixel according to at least one example embodiment.
Figure 38:
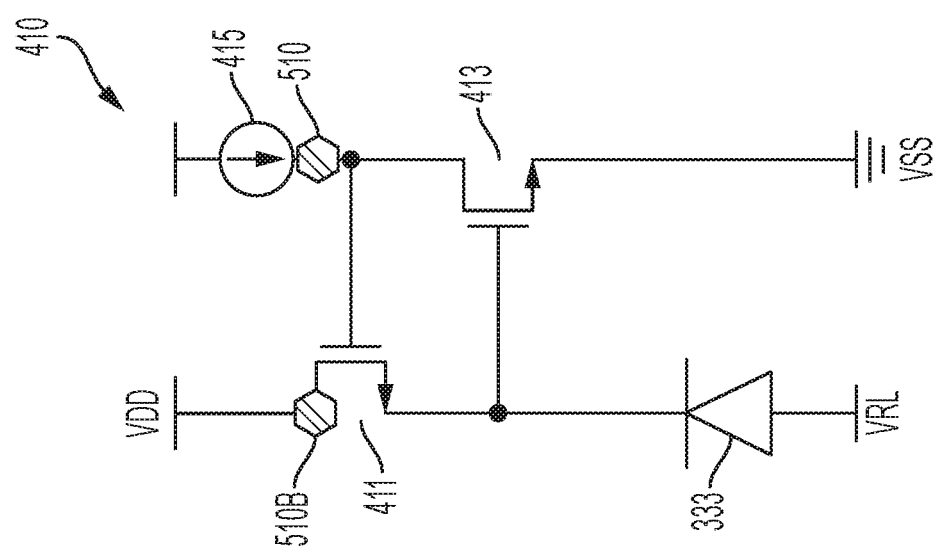

FIG. 38 illustrates an example schematic of the converter 410 for each pixel 310 with a node 510 and a node 510B and an example layout 3800 of a bonding pad configuration to electrically connect circuitry in the logic chip 202 to the nodes 510 and 510B for each pixel 310 according to at least one example embodiment. FIG. 38 is the same as FIG. 37 except that the bonding pads CC1 and CC2 are different shapes and/or sizes. For example, the bonding pads CC1/CC2 have an octagonal shape. As further shown, bonding pads CC1 and CC2 overlap photoelectric conversion regions 333 of neighboring pixels 310 and the isolation region RFTI. This bonding pad configuration may be repeated for all pixels 310a in the array.

Figure 39:
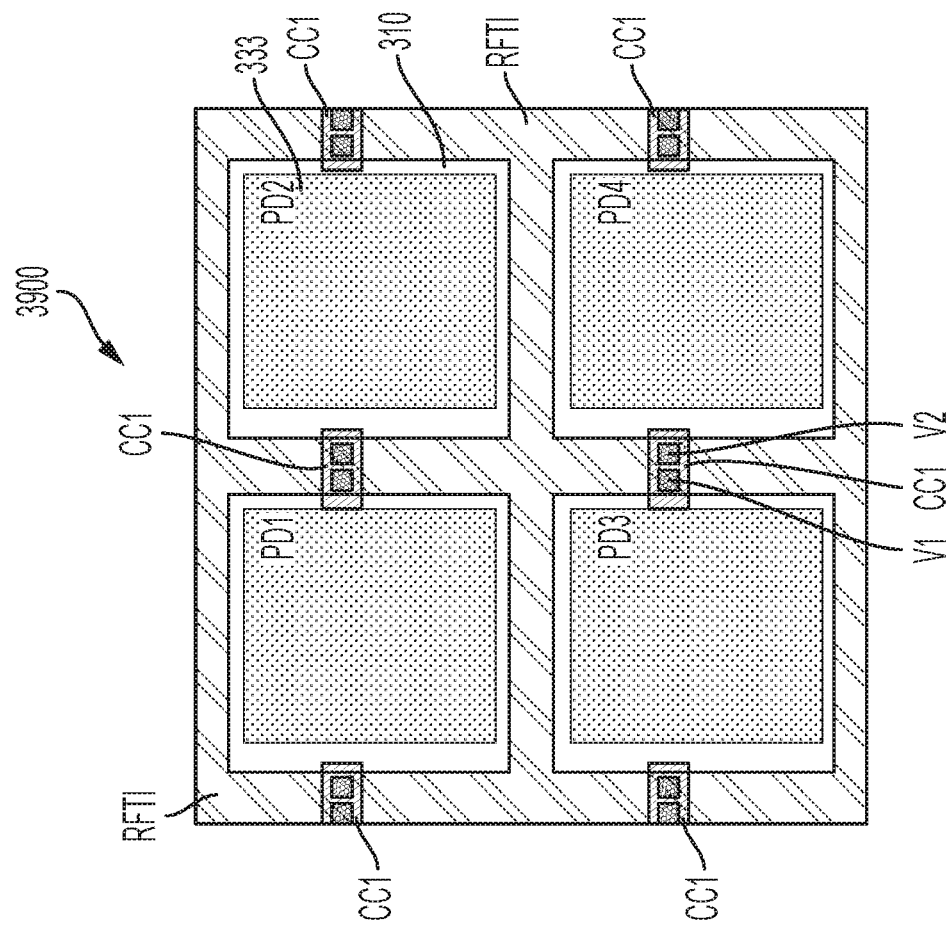
FIG. 39 illustrates an example schematic of the converter in FIG. 5B and an example layout of a bonding pad configuration to electrically connect circuitry in the logic chip to each pixel according to at least one example embodiment.
Figure 39:
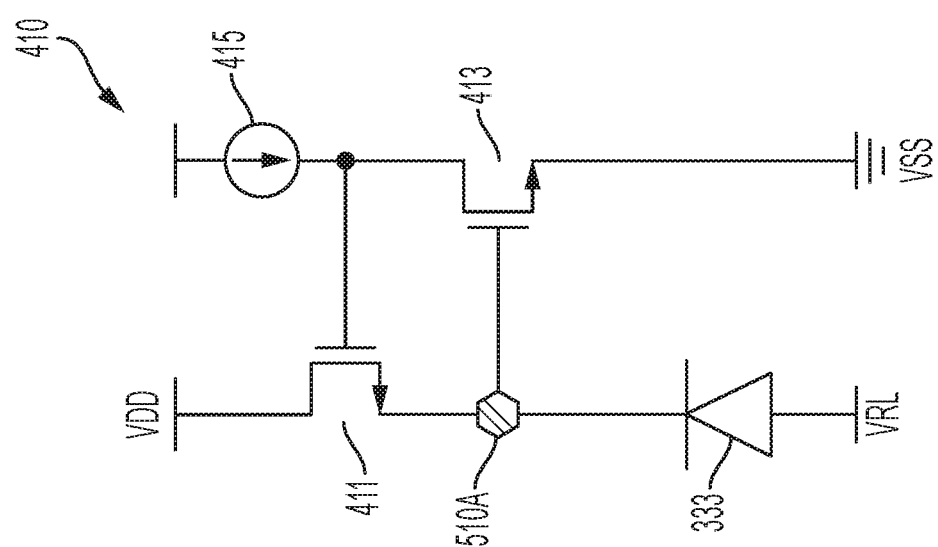

FIG. 39 illustrates an example schematic of the converter 410 for each pixel 310 with a node 510A and an example layout 3900 of a bonding pad configuration to electrically connect circuitry in the logic chip 202 to the node 510A for each pixel 310 according to at least one example embodiment. As shown, node 510A may be a node that stores charge from the photoelectric conversion region 333. FIG. 39 illustrates an embodiment where the node 510A exists in the light-receiving chip 201, but the transistors 411 and/or 413 are formed in the logic chip 202. Thus, the transistor region TR may be omitted to allow the photoelectric conversion regions 333 to be larger than in FIGS. 37 and 38, for example. In this case, bonding pads CC1 for neighboring pixels 310 may be aligned with one another in the first direction and the second direction and may overlap portions of neighboring pixels 310 and the isolation region RFTI. This bonding pad configuration may be repeated for all pixels 310a in the array.

Figure 40:
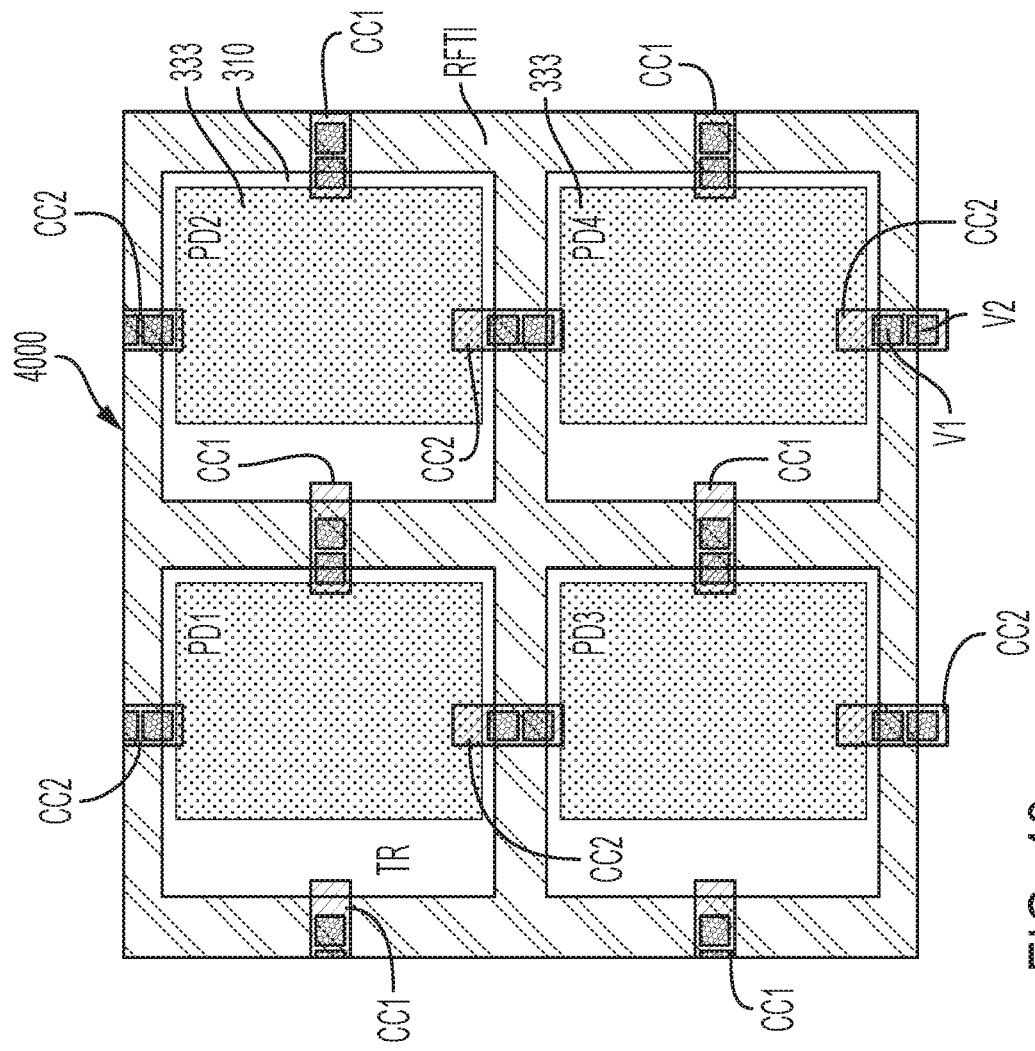
FIG. 40 illustrates an example schematic of the converter in FIG. 5B and an example layout of a bonding pad configuration to electrically connect circuitry in the logic chip to each pixel according to at least one example embodiment.
Figure 40:
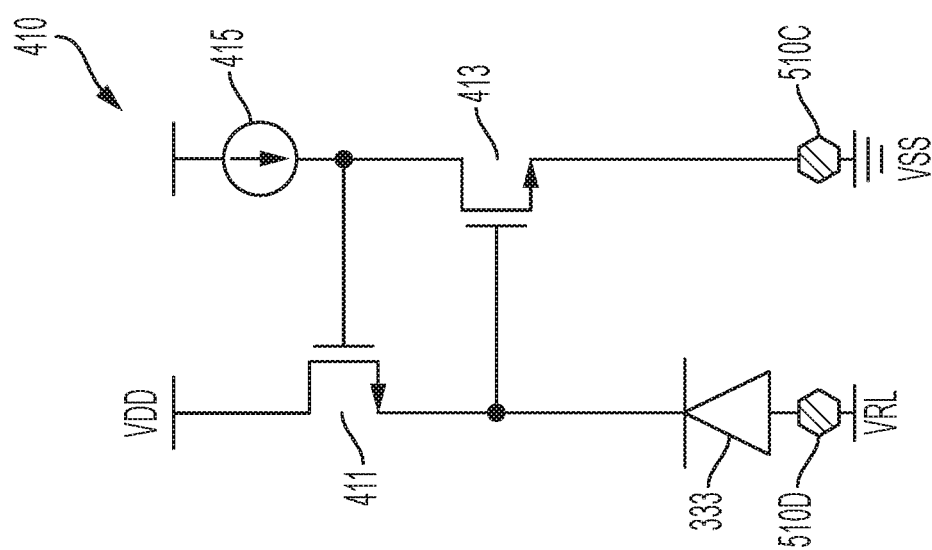

FIG. 40 illustrates an example schematic of the converter 410 for each pixel 310 with a node 510C and a node 510D and an example layout 4000 of a bonding pad configuration to electrically connect circuitry in the logic chip 202 to the nodes 510C and 510D for each pixel 310 according to at least one example embodiment. Bonding pad CC1 may be electrically connected to node 510D and bonding pad CC2 may be electrically connected to node 510C. However, the electrical connections may be reversed as desired. The layout of the bonding pads CC1 and CC2 may be the same as in FIG. 37. This bonding pad configuration may be repeated for all pixels 310a in the array.

Figure 41:
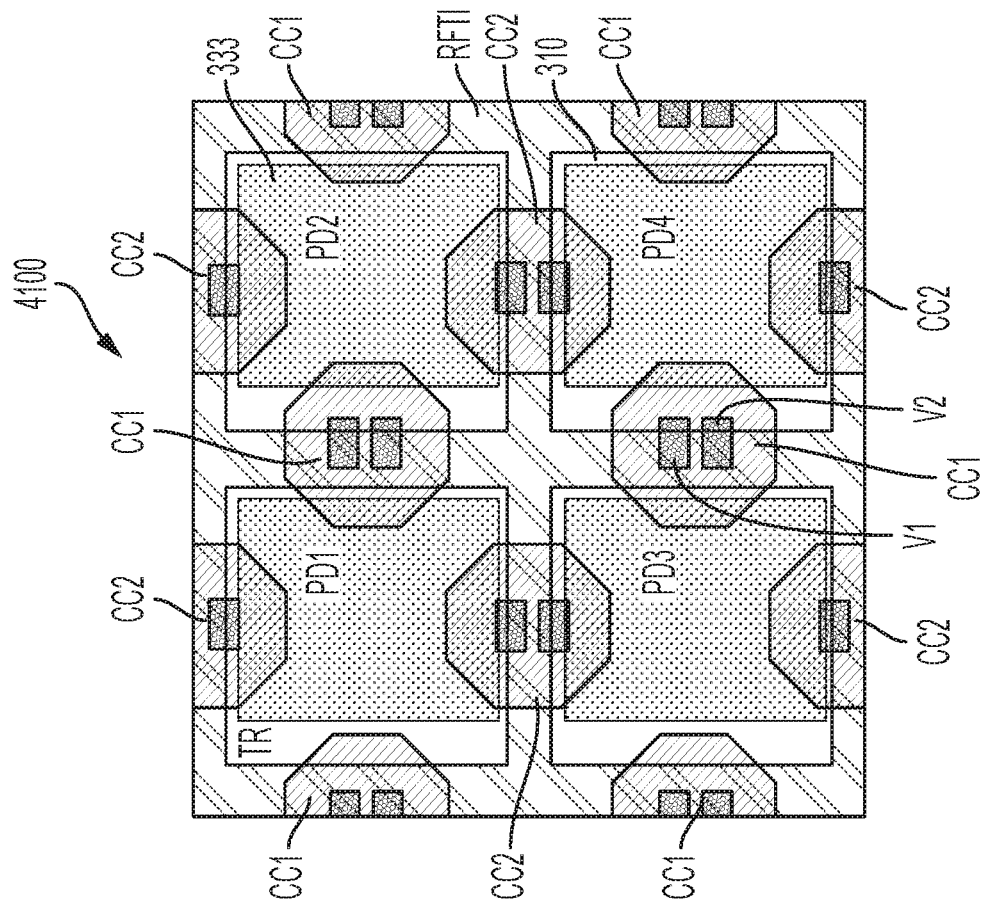
FIG. 41 illustrates an example schematic of the converter in FIG. 5B and an example layout of a bonding pad configuration to electrically connect circuitry in the logic chip to each pixel according to at least one example embodiment.
Figure 41:
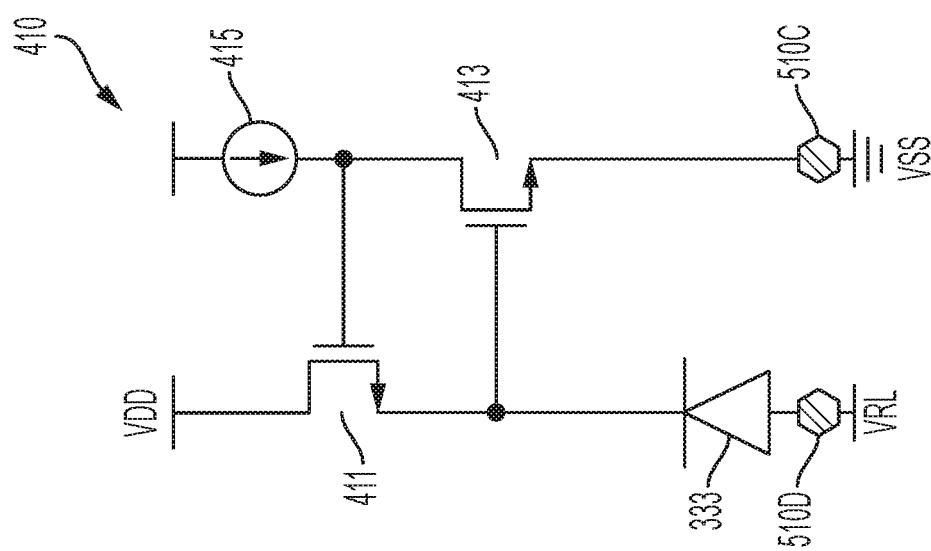

FIG. 41 illustrates an example schematic of the converter 410 for each pixel 310 with a node 510C and a node 510D and an example layout 4100 of a bonding pad configuration to electrically connect circuitry in the logic chip 202 to the nodes 510C and 510D for each pixel 310 according to at least one example embodiment. FIG. 41 is the same as FIG. 38 except that the bonding pads CC1 and CC2 are electrically connected to nodes 510C and 510D. For example, bonding pad CC1 is electrically connected to node 510D, and bonding pad CC2 is electrically connected to node 510C. However, these electrical connections may be reversed as desired. This bonding pad configuration may be repeated for all pixels 310a in the array.

Figure 42:
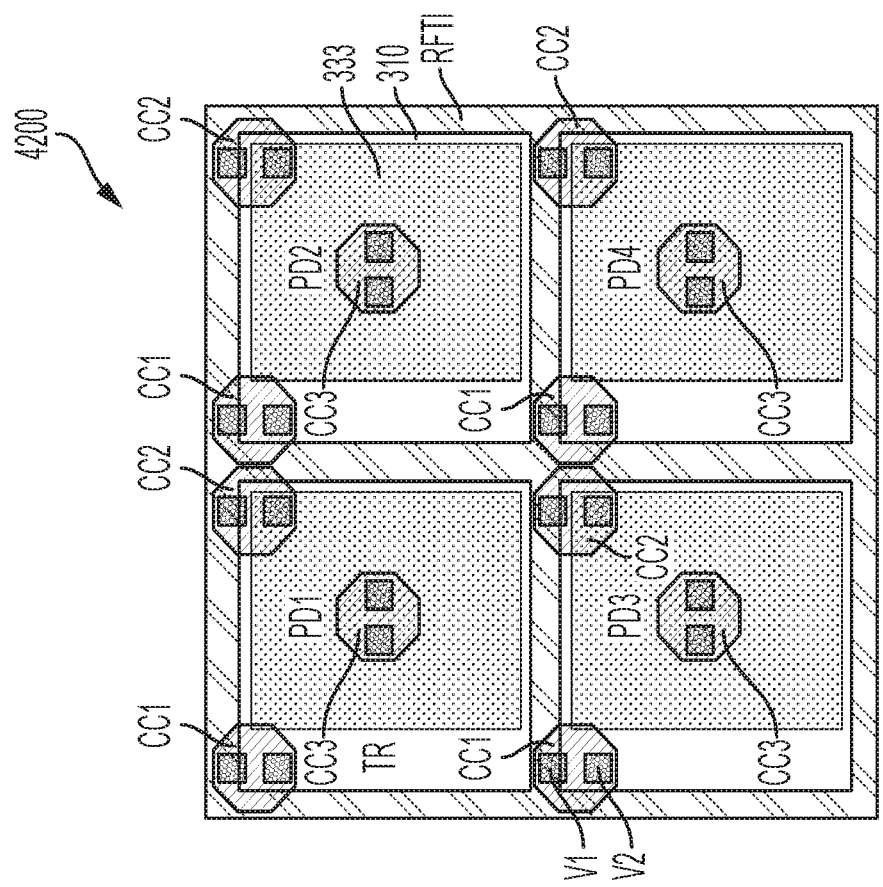
FIG. 42 illustrates an example schematic of the converter in FIG. 5B and an example layout of a bonding pad configuration to electrically connect circuitry in the logic chip to each pixel according to at least one example embodiment.
Figure 42:
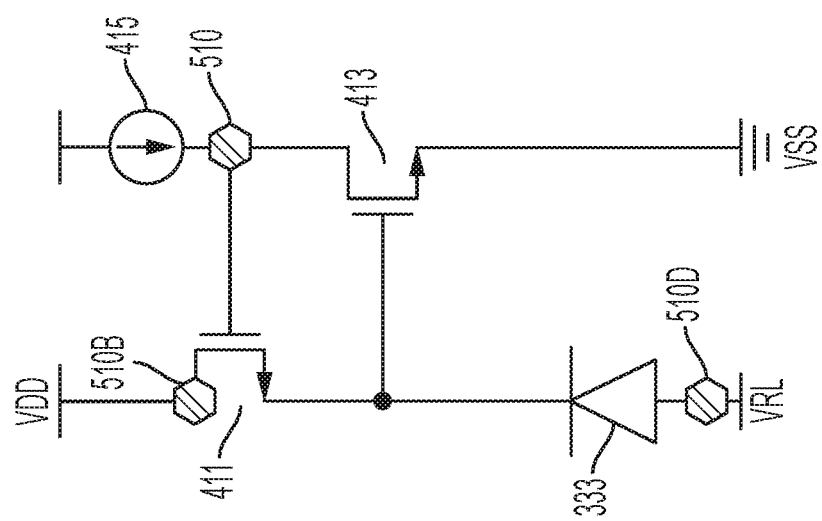

FIG. 42 illustrates an example schematic of the converter 410 for each pixel 310 with a node 510, a node 510B, and a node 510D and an example layout 4200 of a bonding pad configuration to electrically connect circuitry in the logic chip 202 to the nodes 510, 510B, and 510D for each pixel 310 according to at least one example embodiment. In at least one example embodiment, the bonding pad CC1 is electrically connected to node 510B, bonding pad CC2 is electrically connected to node 510, and bonding pad CC3 is electrically connected to node 510D. As shown, bonding pads CC1 and CC2 are located at corners of a pixel 310 while bonding pad CC3 is entirely overlapped by the photoelectric conversion region 333. As also shown, bonding CC1 overlaps the isolation region RFTI and the transistor region TR while bonding pad CC2 overlaps the isolation region RFTI and the photoelectric conversion region 333. Via V1 in bonding pads CC1 and CC2 may overlap the isolation region RFTI. Via V2 in bonding pad CC1 may overlap the transistor region TR while via V2 in bonding pad CC2 may overlap the photoelectric conversion region 333. As shown bonding pads CC1 and CC2 are aligned with one another in the first and second directions, while bonding pads CC3 are aligned with one another in the first and second directions. This bonding pad configuration may be repeated for all pixels 310a in the array.

Figure 43:
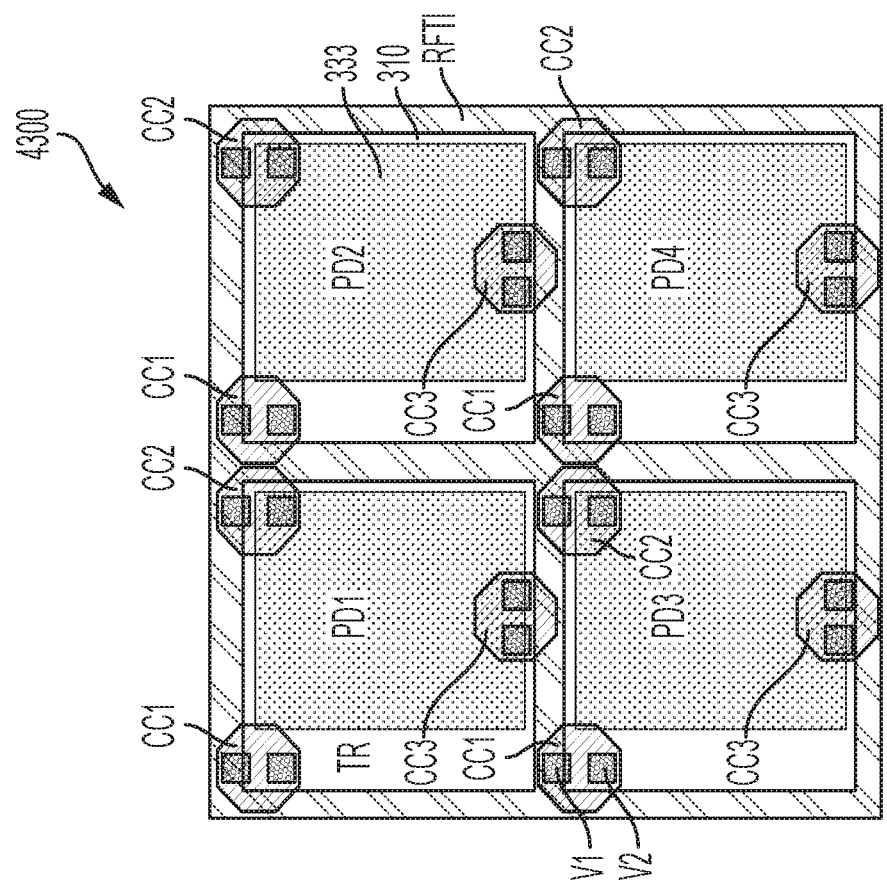
FIG. 43 illustrates an example schematic of the converter in FIG. 5B and an example layout of a bonding pad configuration to electrically connect circuitry in the logic chip to each pixel according to at least one example embodiment.
Figure 43:
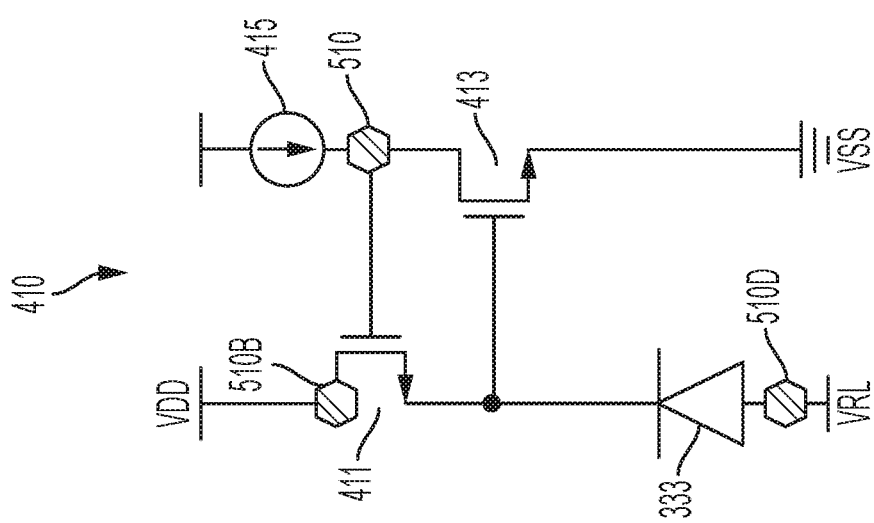

FIG. 43 illustrates an example schematic of the converter 410 for each pixel 310 with a node 510, a node 510B, and a node 510D and an example layout 4300 of a bonding pad configuration to electrically connect circuitry in the logic chip 202 to the nodes 510, 510B, and 510D for each pixel 310 according to at least one example embodiment. FIG. 43 is the same as FIG. 42 except for the location of bonding pad CC3, which is at a lower region of each pixel 310 so as to overlap the photoelectric conversion region 333 and the isolation region RFTI. This bonding pad configuration may be repeated for all pixels 310a in the array.

Figure 44:
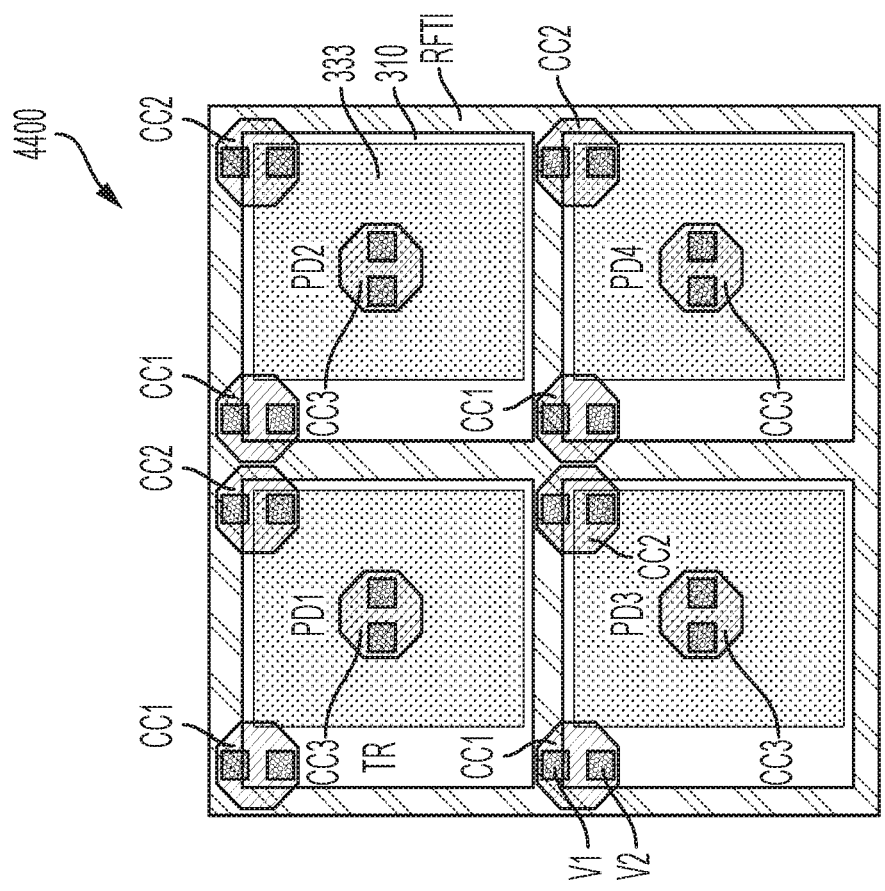
FIG. 44 illustrates an example schematic of the converter in FIG. 5B and an example layout of a bonding pad configuration to electrically connect circuitry in the logic chip to each pixel according to at least one example embodiment.
Figure 44:
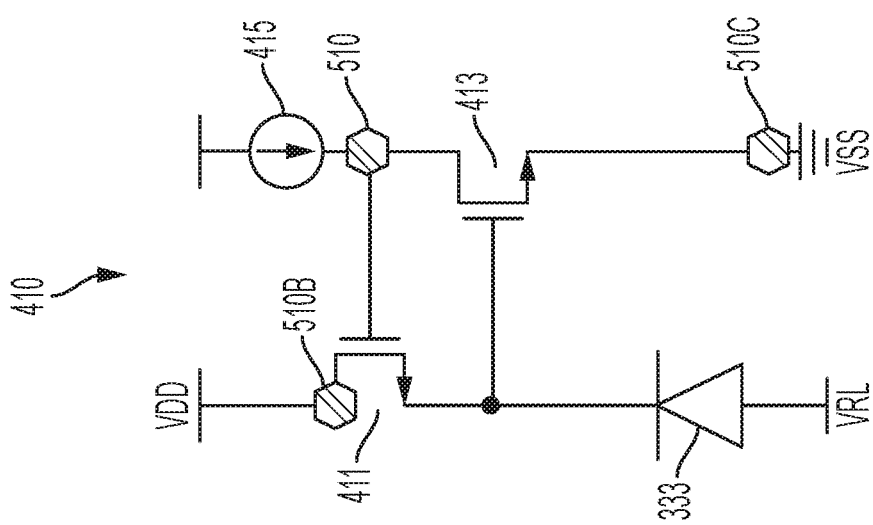

FIG. 44 illustrates an example schematic of the converter 410 for each pixel 310 with a node 510, a node 510B, and a node 510C and an example layout 4400 of a bonding pad configuration to electrically connect circuitry in the logic chip 202 to the nodes 510, 510B, and 510C for each pixel 310 according to at least one example embodiment. FIG. 44 is the same as FIG. 42 except that one of the bonding pads CC1 to CC3 is electrically connected to node 510C instead of 510D. For example, bonding pad CC1 is electrically connected to node 510B, bonding pad CC2 is electrically connected to node 510, and bonding pad CC3 is electrically connected to node 510C. However, these electrical connections may be altered as desired. This bonding pad configuration may be repeated for all pixels 310a in the array.

Figure 45:
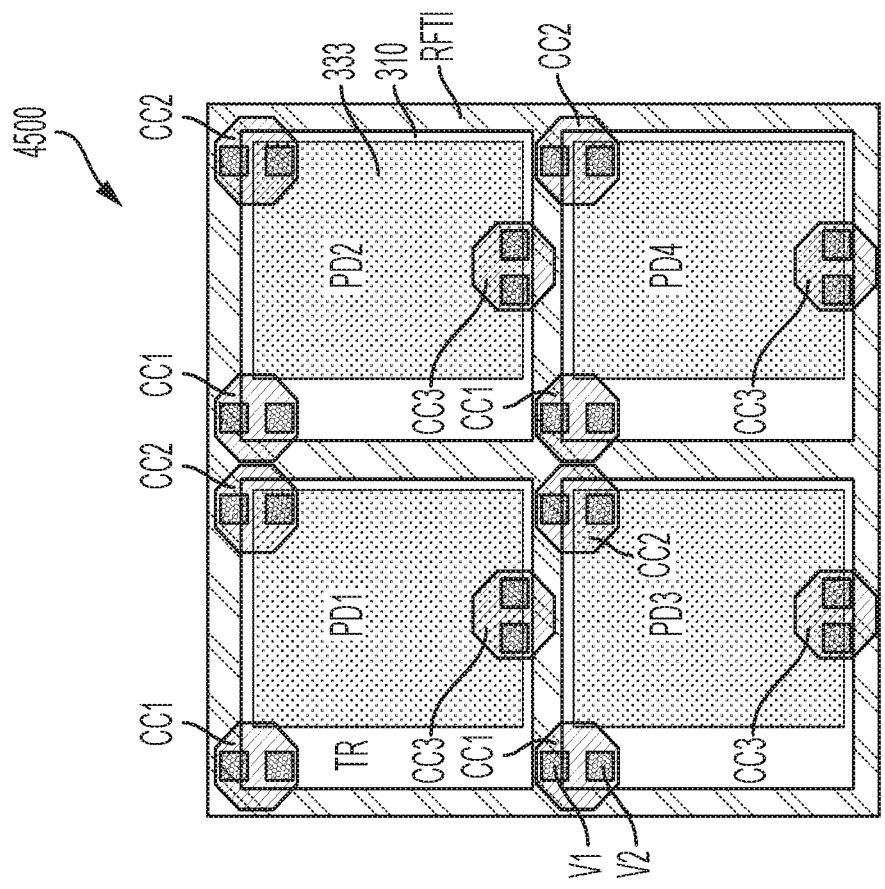
FIG. 45 illustrates an example schematic of the converter in FIG. 5B and an example layout of a bonding pad configuration to electrically connect circuitry in the logic chip to each pixel according to at least one example embodiment.
Figure 45:
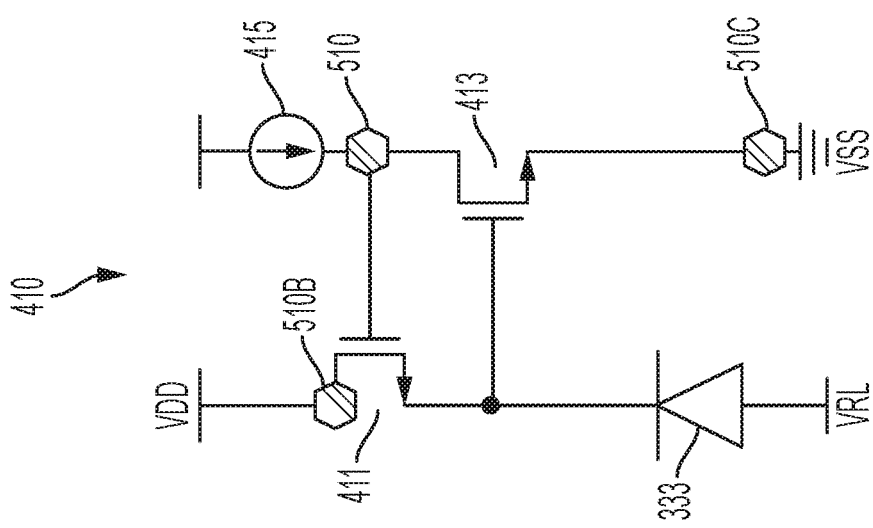

FIG. 45 illustrates an example schematic of the converter 410 for each pixel 310 with a node 510, a node 510B, and a node 510C and an example layout 4500 of a bonding pad configuration to electrically connect circuitry in the logic chip 202 to the nodes 510, 510B, and 510C for each pixel 310 according to at least one example embodiment. FIG. 45 is the same as FIG. 43 except that one of the bonding pads CC1 to CC3 is electrically connected to node 510C instead of 510D. For example, bonding pad CC1 is electrically connected to node 510B, bonding pad CC2 is electrically connected to node 510, and bonding pad CC3 is electrically connected to node 510C. However, these electrical connections may be altered as desired. This bonding pad configuration may be repeated for all pixels 310a in the array.

Figure 46:
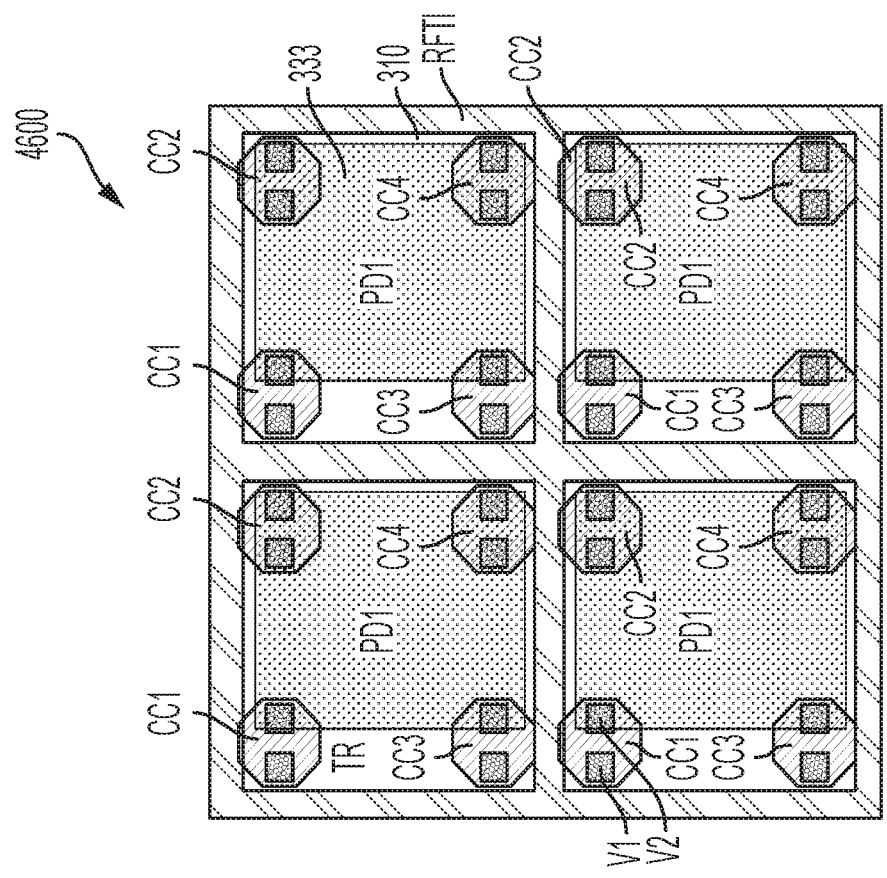
FIG. 46 illustrates an example schematic of the converter in FIG. 5B and an example layout of a bonding pad configuration to electrically connect circuitry in the logic chip to each pixel according to at least one example embodiment.
Figure 46:
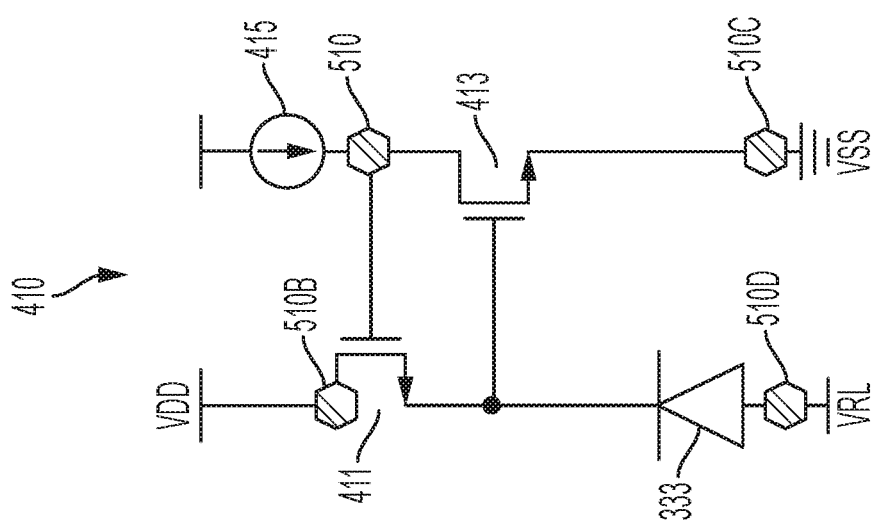

FIG. 46 illustrates an example schematic of the converter 410 for each pixel 310 with a node 510, a node 510B, a node 510C, and a node 510D and an example layout 4600 of a bonding pad configuration to electrically connect circuitry in the logic chip 202 to the nodes 510, 510B, 510C, and 510D for each pixel 310 according to at least one example embodiment. As shown, bonding pads CC1 to CC4 for each pixel 310 are located at corners of each pixel 310. Bonding pad CC1 may be electrically connected to node 510B, bonding pad CC2 may be electrically connected to node 510, bonding pad CC3 may be electrically connected to node 510C, and bonding pad CC4 may be electrically connected to node 510D. However, these electrical connections may be altered as desired. As shown, bonding pads CC1 and CC3 may overlap the transistor region TR and the photoelectric conversion region 333. Bonding pads CC2 and CC4 may overlap the photoelectric conversion region and the isolation region RFTI. The bonding pads CC1 and CC3 (and CC2 and CC4) may be aligned with one another in the second direction. The bonding pads CC1 and CC2 (and CC3 and CC4) may be aligned with one another in the first direction. This bonding pad configuration may be repeated for all pixels 310a in the array.

Figure 47:
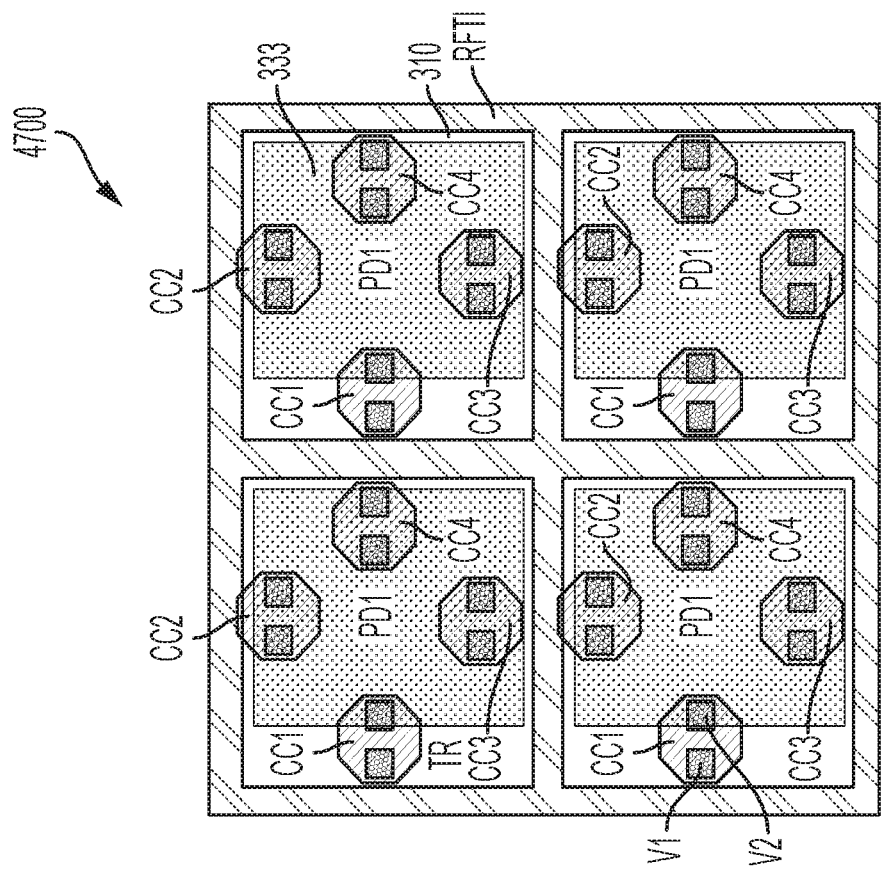
FIG. 47 illustrates an example schematic of the converter in FIG. 5B and an example layout of a bonding pad configuration to electrically connect circuitry in the logic chip to each pixel according to at least one example embodiment.
Figure 47:
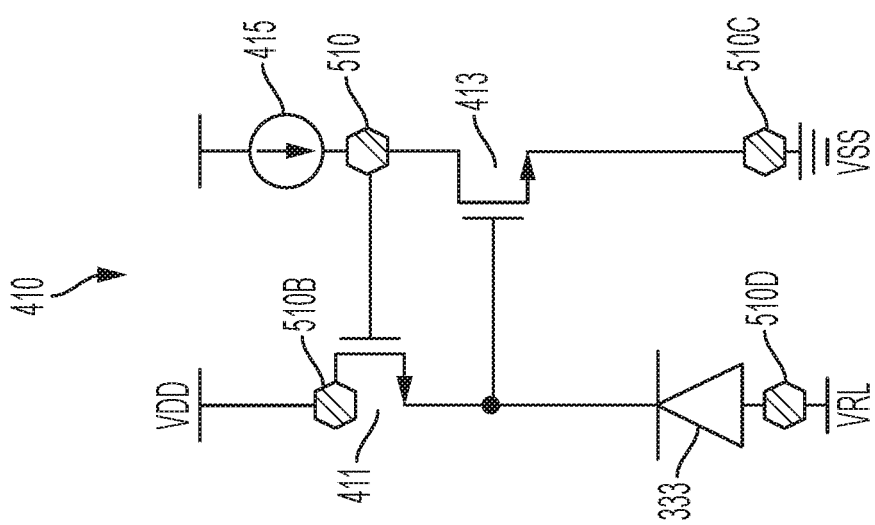

FIG. 47 illustrates an example schematic of the converter 410 for each pixel 310 with a node 510, a node 510B, a node 510C, and a node 510D and an example layout 4700 of a bonding pad configuration to electrically connect circuitry in the logic chip 202 to the nodes 510, 510B, 510C, and 510D for each pixel 310 according to at least one example embodiment. FIG. 47 is the same as FIG. 46 except that locations of the bonding pads CC1 to CC4 for each pixel are in a diamond configuration instead of a rectangular configuration. As shown, bonding pads CC1 to CC4 are located within a pixel 310. This bonding pad configuration may be repeated for all pixels 310a in the array.

Figure 48:
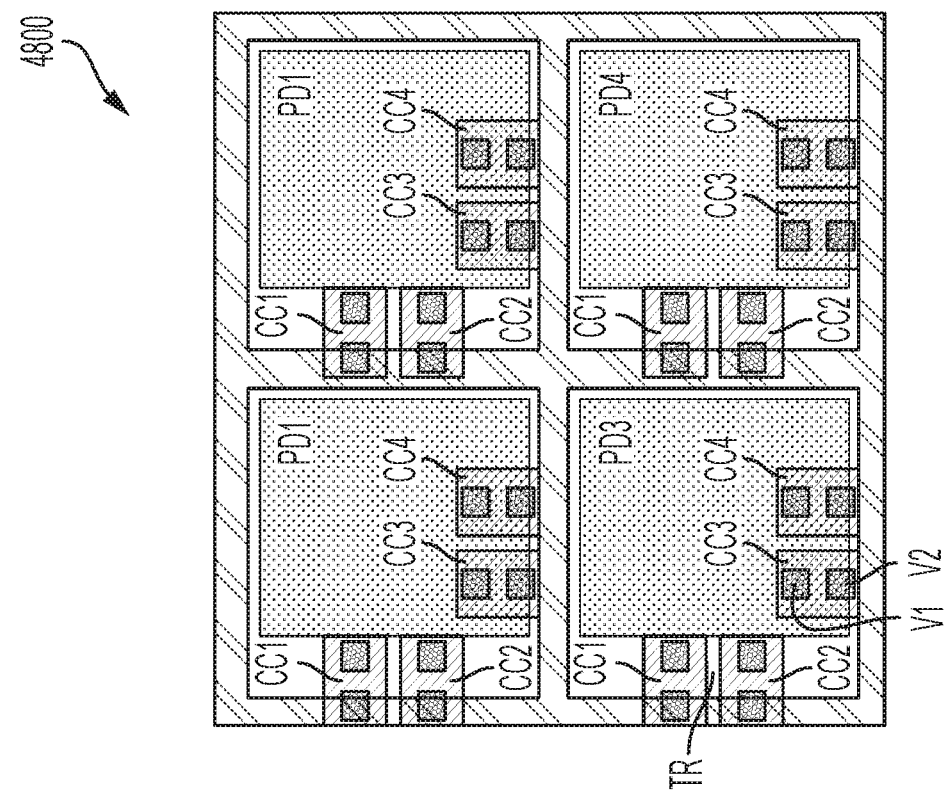
FIG. 48 illustrates an example schematic of the converter in FIG. 5B and an example layout of a bonding pad configuration to electrically connect circuitry in the logic chip to each pixel according to at least one example embodiment.
Figure 48:
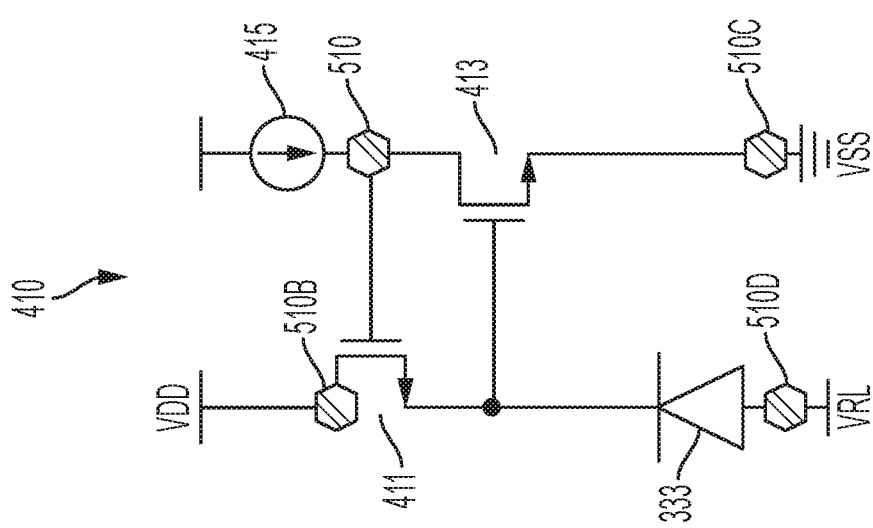

FIG. 48 illustrates an example schematic of the converter 410 for each pixel 310 with a node 510, a node 510B, a node 510C, and a node 510D and an example layout 4800 of a bonding pad configuration to electrically connect circuitry in the logic chip 202 to the nodes 510, 510B, 510C, and 510D for each pixel 310 according to at least one example embodiment. FIG. 48 is the same as FIG. 47 except that the locations and shapes of bonding pads CC1 to CC4 are different. For example, the shapes and bonding pad locations are the same as in FIG. 36.

Figure 49:
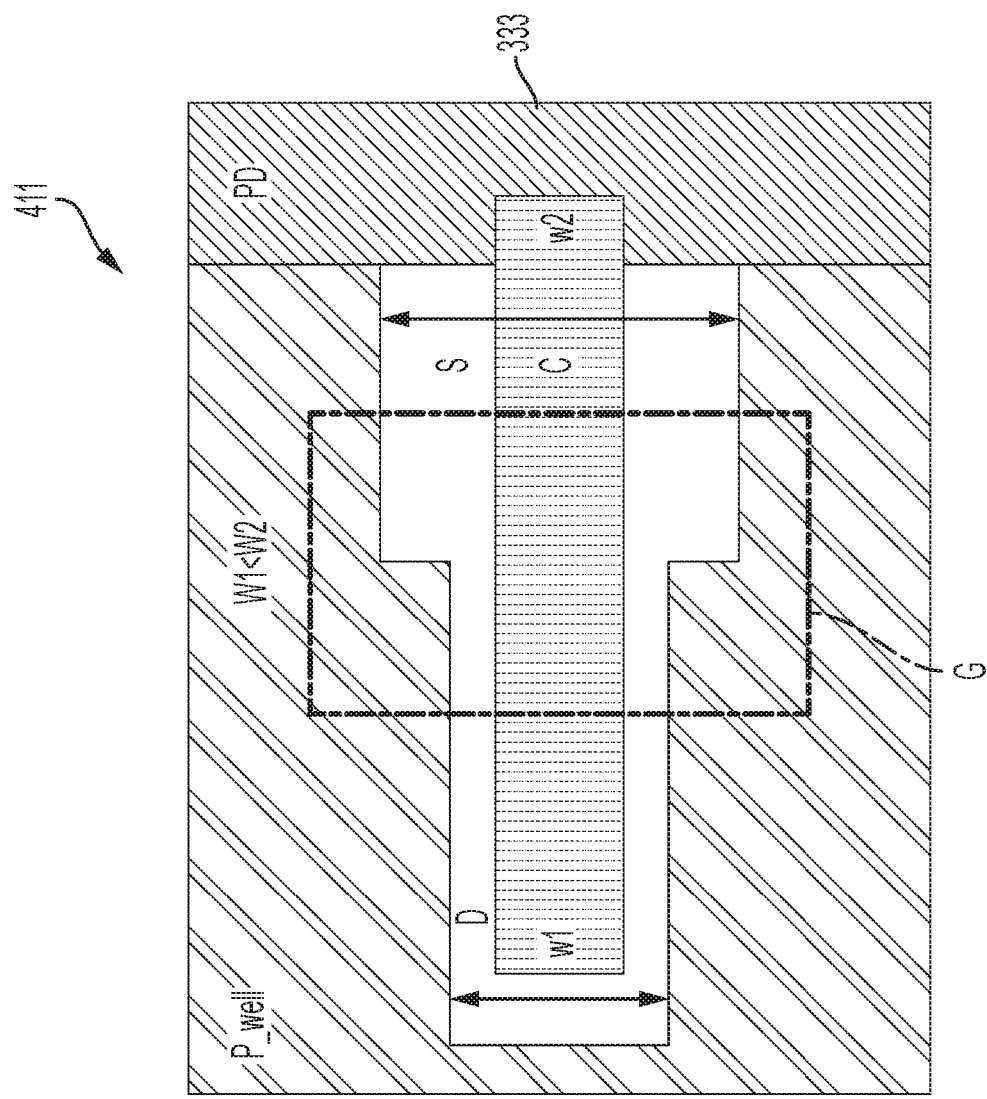
FIG. 49 illustrates an example structure of a transistor according to at least one example embodiment.

FIG. 49 illustrates an example structure of the transistor 411 according to at least one example embodiment. As illustrated in FIG. 49, a portion of the transistor 411 (e.g., a source S) that is coupled to the photoelectric conversion region 333 has a larger width W2 than a portion comprising the drain D of the transistor 411 having a width W1. FIG. 49 further illustrates that the portion at width W2 may extend underneath the gate G of the transistor 411. This structure for the transistor 411 may reduce dark current.

Figure 50:
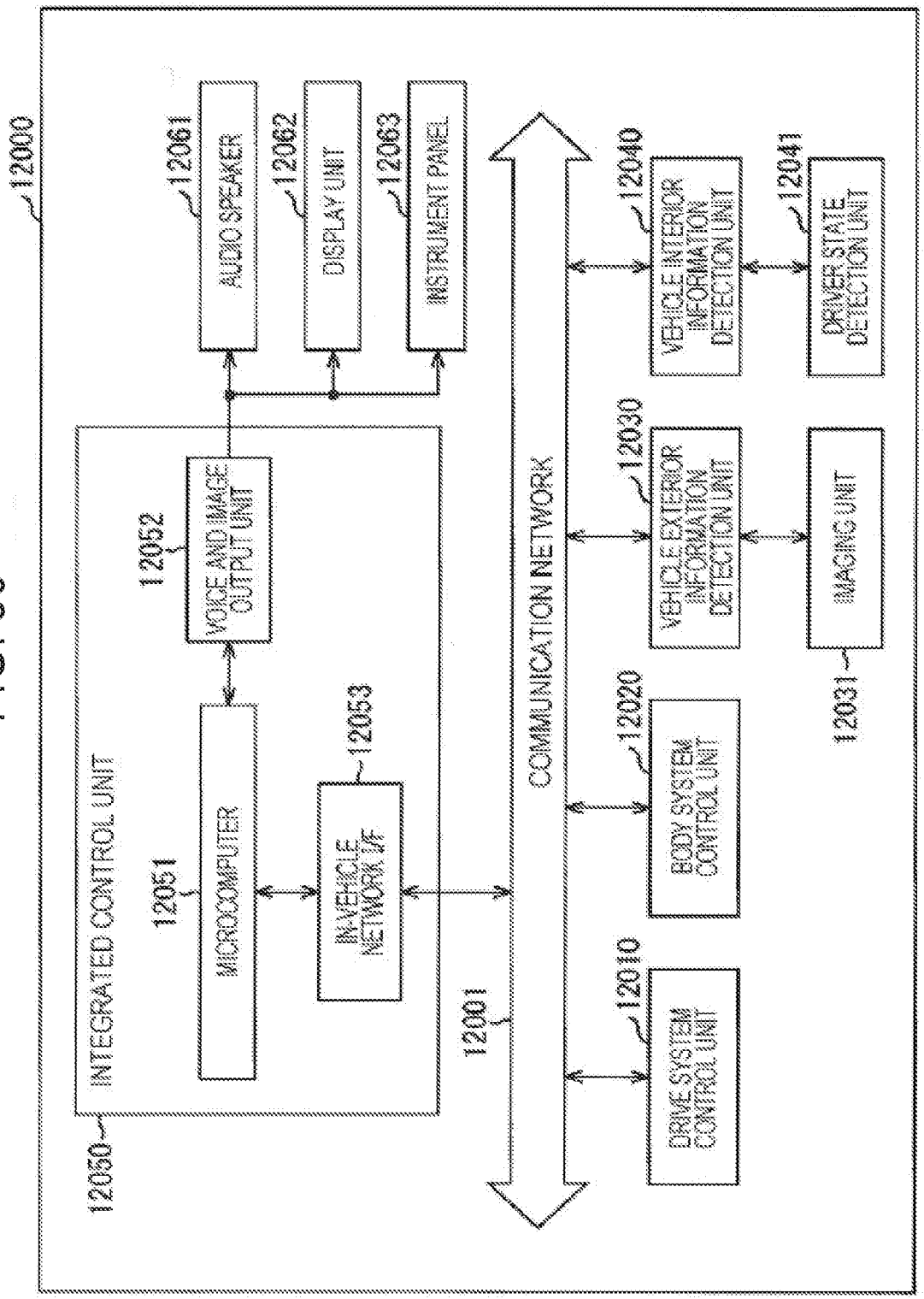
FIG. 50 is a block diagram illustrating an example of a schematic configuration of a vehicle control system.

FIG. 50 is a block diagram illustrating a schematic configuration example of a vehicle control system that is an example of a moving body control system to which the technology according to the present disclosure is applicable.

A vehicle control system 12000 includes a plurality of electronic control units which are connected to each other through a communication network 12001. In the example illustrated in FIG. 50, the vehicle control system 12000 includes a drive system control unit 12010, a body system control unit 12020, a vehicle exterior information detection unit 12030, a vehicle interior information detection unit 12040, and an integrated control unit 12050. In addition, as a functional configuration of the integrated control unit 12050, a microcomputer 12051, a voice and image output unit 12052, and an in-vehicle network I/F (interface) 12053 are illustrated in the drawing.

The drive system control unit 12010 controls an operation of a device relating to the drive system of the vehicle in accordance with various programs. For example, the drive system control unit 12010 functions as a control device of a drive force generation device such as an internal combustion engine and a drive motor which generate a drive force of the vehicle, a drive force transmission mechanism that transmits the drive force to wheels, a steering mechanism that adjusts a steering angle of the vehicle, and a braking device that generates a braking force of the vehicle, and the like.

The body system control unit 12020 controls an operation of various devices which are mounted to a vehicle body in accordance with various programs. For example, the body system control unit 12020 functions as a control device of a keyless entry system, a smart key system, a power window device, and various lamps such as a head lamp, a back lamp, a brake lamp, a blinker, and a fog lamp. In this case, an electric wave that is transmitted from a portable device that substitutes for a key, or signals of various switches can be input to the body system control unit 12020. The body system control unit 12020 receives input of the electric wave or the signals, and controls a door lock device, a power window device, a lamp, and the like of the vehicle.

The vehicle exterior information detection unit 12030 detects information regarding an outer side of the vehicle on which the vehicle control system 12000 is mounted. For example, an imaging unit 12031 is connected to the vehicle exterior information detection unit 12030. The vehicle exterior information detection unit 12030 allows the imaging unit 12031 to capture a vehicle exterior image, and receives the captured image. The vehicle exterior information detection unit 12030 may perform object detection processing of a person, a vehicle, an obstacle, a sign, a character on a load, or the like or distance detection processing on the basis of the image that is received.

The imaging unit 12031 is an optical sensor that receives light and outputs an electric signal corresponding to a light-reception amount. The imaging unit 12031 may output the electric signal as an image or as distance measurement information. In addition, light received by the imaging unit 12031 may be visible light, or invisible light such as infrared rays.

The vehicle interior information detection unit 12040 detects vehicle interior information. For example, a driver state detection unit 12041 that detects a driver state is connected to the vehicle interior information detection unit 12040. For example, the driver state detection unit 12041 includes a camera that images a driver, and the vehicle interior information detection unit 12040 may calculate the degree of fatigue or the degree of concentration of a driver on the basis of detection information that is input from the driver state detection unit 12041, or may determine whether or not the driver drowses.

The microcomputer 12051 calculates a control target value of the drive force generation device, the steering mechanism, or the braking device on the basis of vehicle interior or exterior information that is acquired by the vehicle exterior information detection unit 12030 or the vehicle interior information detection unit 12040, and can output a control command to the drive system control unit 12010. For example, the microcomputer 12051 can perform a cooperative control to realize a function of an advanced driver assistance system (ADAS) which includes collision avoidance or impact mitigation of the vehicle, following travel based on an inter-vehicle distance, vehicle speed maintenance travel, vehicle collision alarm, vehicle lane deviation alarm, and the like.

In addition, the microcomputer 12051 can perform a cooperative control for automatic driving and the like in which the vehicle autonomously travels without depending on an operation of a driver by controlling the drive force generation device, the steering mechanism, the braking device, and the like on the basis of information in the vicinity of the vehicle which is acquired by the vehicle exterior information detection unit 12030 or the vehicle interior information detection unit 12040.

In addition, the microcomputer 12051 can output a control command to the body system control unit 12020 on the basis of the vehicle exterior information acquired by the vehicle exterior information detection unit 12030. For example, the microcomputer 12051 can perform a cooperative control to realize glare protection such as switching of a high beam into a low beam by controlling the head lamp in correspondence with a position of a preceding vehicle or an oncoming vehicle which is detected by the vehicle exterior information detection unit 12030.

The voice and image output unit 12052 transmits at least one output signal between a voice and an image to an output device capable of visually or aurally notifying a passenger in a vehicle or an outer side of the vehicle of information. In the example in FIG. 50, as the output device, an audio speaker 12061, a display unit 12062, and an instrument panel 12063 are exemplified. For example, the display unit 12062 may include at least one of an on-board display or a head-up display.

Figure 51:
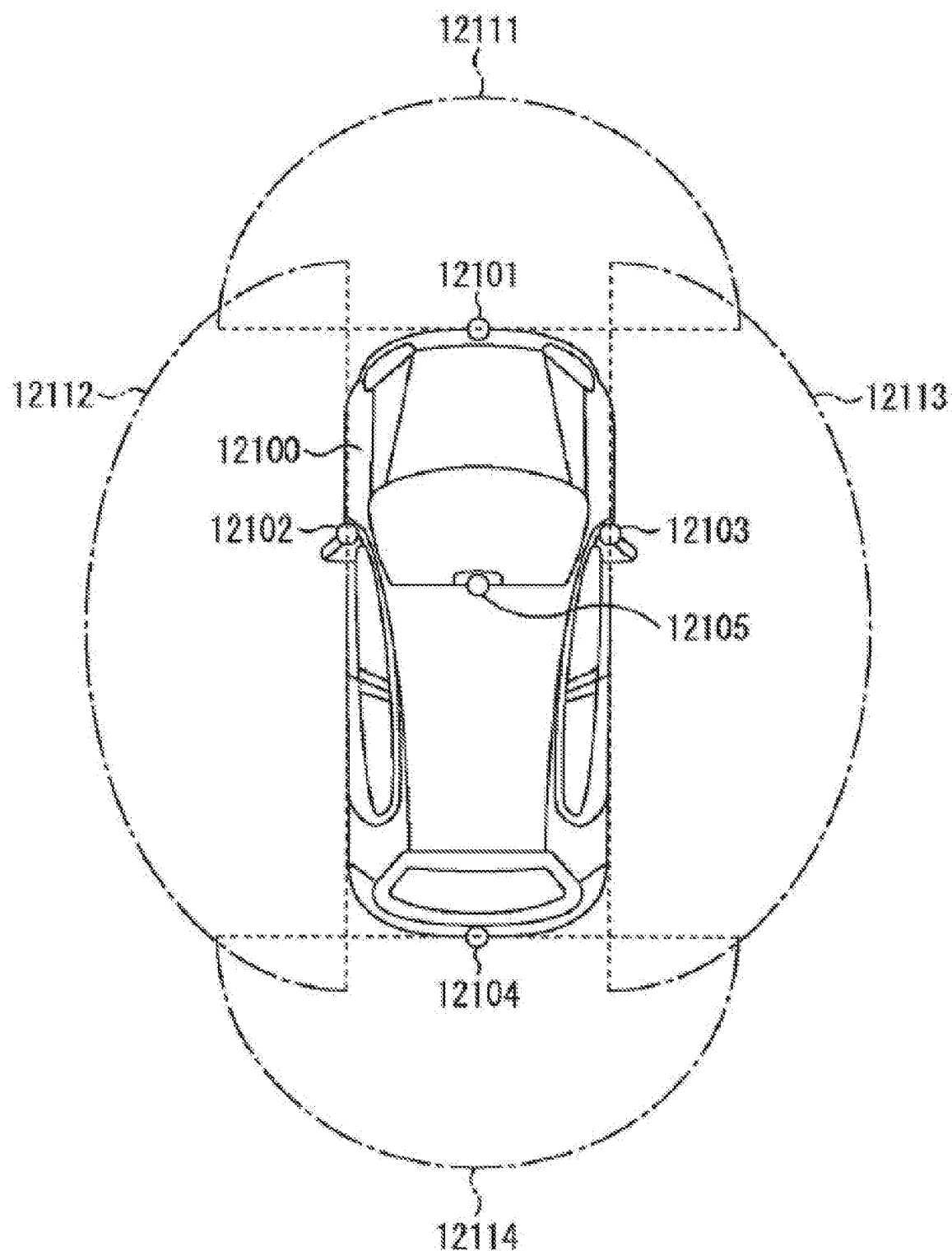
FIG. 51 is a view illustrating an example of an installation position of an out-of-vehicle information detection unit and an imaging unit.

FIG. 51 is a view illustrating an example of an installation position of the imaging unit 12031.

In FIG. 51, as the imaging unit 12031, imaging units 12101, 12102, 12103, 12104, and 12105 are provided.

For example, the imaging units 12101, 12102, 12103, 12104, and 12105 are installed at positions such as a front nose, a side-view mirror, a rear bumper, a back door, and an upper side of a windshield in a vehicle room, of the vehicle 12100. The imaging unit 12101 provided at the front nose, and the imaging unit 12105 that is provided on an upper side of the windshield in a vehicle room mainly acquire images on a forward side of the vehicle 12100. The imaging units 12102 and 12103 which are provided in the side-view mirror mainly acquire images on a lateral side of the vehicle 12100. The imaging unit 12104 that is provided in the rear bumper or the back door mainly acquires images on a backward side of the vehicle 12100. The imaging unit 12105 that is provided on an upper side of the windshield in the vehicle room can be mainly used to detect a preceding vehicle, a pedestrian, an obstacle, a traffic signal, a traffic sign, a vehicle lane, and the like.

Furthermore, FIG. 51 illustrates an example of a photographing range of the imaging units 12101 to 12104. An image capturing range 12111 represents an image capturing range of the imaging unit 12101 that is provided in the front nose, image capturing ranges 12112 and 12113 respectively represent image capturing ranges of the imaging units 12102 and 12103 which are provided in the side-view mirrors, an image capturing range 12114 represents an image capturing range of the imaging unit 12104 that is provided in the rear bumper or the back door. For example, when a plurality of pieces of image data captured by the imaging units 12101 to 12104 are superimposed on each other, it is possible to obtain an overlooking image when the vehicle 12100 is viewed from an upper side.

At least one of the imaging units 12101 to 12104 may have a function of acquiring distance information. For example, at least one of the imaging units 12101 to 12104 may be a stereo camera including a plurality of imaging elements, or may be an imaging element that includes pixels for phase difference detection.

For example, the microcomputer 12051 can extract a three-dimensional object, which is a closest three-dimensional object, particularly, on a proceeding path of the vehicle 12100 and travels in approximately the same direction as that of the vehicle 12100 that travels at a predetermined velocity (for example, 0 km/h or greater), as a preceding vehicle by obtaining distances to respective three-dimensional objects in the image capturing ranges 12111 to 12114 and a variation of the distances with the passage of time (relative velocity to the vehicle 12100) on the basis of the distance information obtained from the imaging units 12101 to 12104. In addition, the microcomputer 12051 can set a distance between vehicles to be secured in advance in front of the preceding vehicle to perform automatic brake control (also including a following stop control), an automatic acceleration control (also including a following acceleration control), and the like. As described above, it is possible to perform a cooperative control for automatic driving in which a vehicle autonomously travels without depending on an operation by a driver, and the like.

For example, the microcomputer 12051 can extract three-dimensional object data relating to a three-dimensional object by classifying a plurality of pieces of the three-dimensional object data into data of a two-wheel vehicle, data of typical vehicle, data of a large-sized vehicle, data of pedestrian, and data of other three-dimensional objects such as an electric pole on the basis of the distance information obtained from the imaging units 12101 to 12104, and can use the three-dimensional object data for automatic obstacle avoidance. For example, the microcomputer 12051 discriminates obstacles at the periphery of the vehicle 12100 into an obstacle that is visually recognized by a driver of the vehicle 12100 and an obstacle that is difficult for the driver to visually recognize. In addition, the microcomputer 12051 determines collision risk indicating the degree of danger of collision with each of the obstacles. In a situation in which the collision risk is equal to or greater than a set value, and collision may occur, the microcomputer 12051 can assist driving for collision avoidance by outputting an alarm to the driver through the audio speaker 12061 or the display unit 12062, or by performing compulsory deceleration or avoidance steering through the drive system control unit 12010.

At least one of the imaging units 12101 to 12104 may be an infrared camera that detects infrared rays. For example, the microcomputer 12051 can recognize a pedestrian by determining whether or not the pedestrian exists in images captured by the imaging units 12101 to 12104. For example, the pedestrian recognition is performed by a procedure of extracting a specific point in the images captured by the imaging units 12101 to 12104 as an infrared camera, and a procedure of performing pattern matching processing for a series of specific points indicating a contour line of an object to determine whether or not the object is a pedestrian. When the microcomputer 12051 determines that a pedestrian exists on the images captured by the imaging units 12101 to 12104, and recognizes the pedestrian, the voice and image output unit 12052 controls the display unit 12062 to overlap and display a quadrangular contour line for emphasis on the pedestrian who is recognized. In addition, the voice and image output unit 12052 may control the display unit 12062 to display an icon indicating the pedestrian or the like at a desired position.

Hereinbefore, description has been given of an example of the vehicle control system to which the technology according to the present disclosure is applicable. The technology according to the present disclosure is applicable to the imaging unit 12031, the driver state detection unit 12041, and the like among the above-described configurations.

Hereinbefore, embodiments of the present disclosure have been described, but the technical range of the present disclosure is not limited to the above-described embodiments, and various modifications can be made in a range not departing from the gist of the present disclosure. In addition, constituent elements in other embodiments and modification examples may be appropriately combined.

In addition, the effects in the embodiments described in this specification are illustrative only, and other effects may exist without limitation.

Furthermore, the present technology can employ the following configurations.

(1) An imaging device, comprising:
    a first pixel including:
    a first photoelectric conversion region disposed in a first substrate and that converts incident light into first electric charges;
    a first readout circuit including a first converter that converts the first electric charges into a first logarithmic voltage signal; and
    at least one bonding pad on the first substrate and in electrical contact with the first converter, the at least one bonding pad overlapping at least part of the first pixel.

(2)
The imaging device of (1), wherein the first converter includes a first portion disposed in the first substrate, wherein the first portion includes a transistor coupled to the first photoelectric conversion region, and wherein, in a plan view, a source of the transistor is wider than a drain of the transistor.

(3)
The imaging device of one or more of (1) to (2), further comprising:
    a second substrate bonded to the first substrate via the at least one bonding pad, wherein the first converter includes a second portion disposed in the second substrate.

(4)
The imaging device of one or more of (1) to (3), wherein the first portion includes a node coupled to the photoelectric conversion region, and wherein the second portion includes a plurality of transistors coupled to the node through the at least one first bonding pad.

(5)
The imaging device of one or more of (1) to (4), further comprising:
    a plurality of vias disposed in the first substrate and in electrical contact with the at least one bonding pad and the first converter.

(6)
The imaging device of one or more of (1) to (5), wherein the first converter is disposed in the first substrate, and wherein at least one bonding pad includes a first bonding pad in electrical contact with a first node of the first converter, and a second bonding pad in electrical contact with a second node of the first converter.

(7)
The imaging device of one or more of (1) to (6), wherein the first node is a power supply node of the first converter that receives a power supply signal, and wherein the second node is an output node of the first converter that outputs an output signal to another component of the first readout circuit.

(8)
The imaging device of one or more of (1) to (7), wherein the at least one bonding pad includes a third bonding pad in electrical contact with a third node of the first converter, and wherein the third node is an anode of the photoelectric conversion region or a ground node of the first converter that receives a ground signal or a common signal.

(9)
The imaging device of one or more of (1) to (8), wherein the first node is an anode of the photoelectric conversion region, and wherein the second node is a ground node of the first converter that receives a ground signal or a common signal.

(10)
The imaging device of one or more of (1) to (9), wherein the at least one bonding pad includes a third bonding pad in electrical contact with a third node of the first converter, and wherein the third node is power supply node of the first converter that receives a power supply signal or an output node of the first converter that outputs an output signal to another component of the first readout circuit.

(11)
The imaging device of one or more of (1) to (10), wherein the at least one bonding pad includes a third bonding pad in electrical contact with a third node of the first converter, and a fourth bonding pad in electrical contact with a fourth node of the first converter.

(12)
The imaging device of one or more of (1) to (11), wherein the third node is a power supply node of the first converter that receives a power supply voltage, and wherein the fourth node is output node of the first converter that outputs an output signal to another component of the first readout circuit.

(13)
The imaging device of one or more of (1) to (12), further comprising:
a second readout circuit, wherein the first readout circuit controls the second readout circuit.

(14)
An imaging device, comprising:
a first pixel including:
a first photoelectric conversion region disposed in a first substrate and that converts incident light into first electric charges;
a first readout circuit including a first converter that converts the first electric charges into a first logarithmic voltage signal; and
at least one first bonding pad on the first substrate and in electrical contact with the first converter, the at least one first bonding pad overlapping at least part of the first pixel; and
a second pixel adjacent to the first pixel and including:
a second photoelectric conversion region disposed in the first substrate and that converts incident light into second electric charges;
a second readout circuit including a second converter that converts the second electric charges into a second logarithmic voltage signal; and
at least one second bonding pad on the first substrate and in electrical contact with the second converter, the at least one second bonding pad overlapping at least part of the second pixel.

(15)
The imaging device of (14), further comprising:
an isolation region disposed in the first substrate between the first pixel and the second pixel.

(16)
The imaging device of one or more of (14) to (15), wherein the at least one first bonding pad includes a first plurality of bonding pads electrically connected to respective first nodes of the first converter, and wherein the at least one second bonding pad includes a second plurality of bonding pads electrically connected to respective second nodes of the second converter.

(17)
The imaging device of one or more of (1) to (16), wherein one of the second plurality of bonding pads overlaps the at least part of the second pixel and the isolation region.

(18)
The imaging device of one or more of (1) to (17), wherein the one of the second plurality of bonding pads overlaps part of the first pixel.

(19)
An imaging device, comprising:
a first pixel including:
a first photoelectric conversion region disposed in a first substrate and that converts incident light into first electric charges;
a first readout circuit including a first converter that converts the first electric charges into a first logarithmic voltage signal; and
a plurality of first bonding pads on the first substrate and in electrical contact with respective nodes of the first converter, each of the plurality of first bonding pads overlapping at least part of the first pixel.

(20)
The imaging device of (19), wherein the respective nodes of the first converter include two or more of a power supply node that receives a power supply voltage, an output node that outputs an output signal to another component of the first readout circuit, an anode of the first photoelectric conversion region, and a ground node that receives a ground signal or a common signal.

It is claimed:
1. An imaging device, comprising:
a first pixel including:
a first photoelectric conversion region disposed in a first substrate and that converts incident light into first electric charges; and
a first readout circuit including a first converter that converts the first electric charges into a first logarithmic voltage signal;
at least one bonding pad on the first substrate and in electrical contact with the first converter, the at least one bonding pad overlapping at least part of the first pixel; and
a second readout circuit, wherein the first readout circuit controls the second readout circuit.

2. The imaging device of claim 1, wherein the first converter includes a first portion disposed in the first substrate, wherein the first portion includes a transistor coupled to the first photoelectric conversion region, and wherein, in a plan view, a source of the transistor is wider than a drain of the transistor.

3. The imaging device of claim 2, further comprising:
a second substrate bonded to the first substrate via the at least one bonding pad, wherein the first converter includes a second portion disposed in the second substrate.

4. The imaging device of claim 3, wherein the first portion includes a node coupled to the photoelectric conversion region, and wherein the second portion includes a plurality of transistors coupled to the node through the at least one first bonding pad.

5. The imaging device of claim 1, further comprising:
a plurality of vias disposed in the first substrate and in electrical contact with the at least one bonding pad and the first converter.

6. The imaging device of claim 1, wherein the first converter is disposed in the first substrate, and wherein at least one bonding pad includes a first bonding pad in electrical contact with a first node of the first converter, and a second bonding pad in electrical contact with a second node of the first converter.

7. The imaging device of claim 6, wherein the first node is a power supply node of the first converter that receives a power supply signal, and wherein the second node is an output node of the first converter that outputs an output signal to another component of the first readout circuit.

8. The imaging device of claim 7, wherein the at least one bonding pad includes a third bonding pad in electrical contact with a third node of the first converter, and wherein the third node is an anode of the photoelectric conversion region or a ground node of the first converter that receives a ground signal or a common signal.

9. The imaging device of claim 6, wherein the first node is an anode of the photoelectric conversion region, and wherein the second node is a ground node of the first converter that receives a ground signal or a common signal.

10. The imaging device of claim 9, wherein the at least one bonding pad includes a third bonding pad in electrical contact with a third node of the first converter, and wherein the third node is a power supply node of the first converter that receives a power supply signal or an output node of the first converter that outputs an output signal to another component of the first readout circuit.

11. The imaging device of claim 9, wherein the at least one bonding pad includes a third bonding pad in electrical contact with a third node of the first converter, and a fourth bonding pad in electrical contact with a fourth node of the first converter.

12. The imaging device of claim 11, wherein the third node is a power supply node of the first converter that receives a power supply voltage, and wherein the fourth node is output node of the first converter that outputs an output signal to another component of the first readout circuit.

13. An imaging device, comprising:
a first pixel including:
a first photoelectric conversion region disposed in a first substrate and that converts incident light into first electric charges; and
a first readout circuit including a first converter that converts the first electric charges into a first logarithmic voltage signal;
at least one first bonding pad on the first substrate and in electrical contact with the first converter, the at least one first bonding pad overlapping at least part of the first pixel;
a second pixel adjacent to the first pixel and including:
a second photoelectric conversion region disposed in the first substrate and that converts incident light into second electric charges; and
a second readout circuit including a second converter that converts the second electric charges into a second logarithmic voltage signal; and
at least one second bonding pad on the first substrate and in electrical contact with the second converter, the at least one second bonding pad overlapping at least part of the second pixel,
wherein the first converter includes a first portion disposed in the first substrate,
wherein the first portion includes a transistor coupled to the first photoelectric conversion region, and
wherein, in a plan view, a source of the transistor is wider than a drain of the transistor.

14. The imaging device of claim 13, further comprising:
an isolation region disposed in the first substrate between the first pixel and the second pixel.

15. The imaging device of claim 14, wherein the at least one first bonding pad includes a first plurality of bonding pads electrically connected to respective first nodes of the first converter, and wherein the at least one second bonding pad includes a second plurality of bonding pads electrically connected to respective second nodes of the second converter.

16. The imaging device of claim 15, wherein one of the second plurality of bonding pads overlaps the at least part of the second pixel and the isolation region.

17. The imaging device of claim 16, wherein the one of the second plurality of bonding pads overlaps part of the first pixel.

18. An imaging device, comprising:
a first pixel including:
a first photoelectric conversion region disposed in a first substrate and that converts incident light into first electric charges; and
a first readout circuit including a first converter that converts the first electric charges into a first logarithmic voltage signal; and
a plurality of bonding pads on the first substrate and in electrical contact with respective nodes of the first converter, each of the plurality of bonding pads overlapping at least part of the first pixel,
wherein the respective nodes include a first node and a second node,
wherein the first converter is disposed in the first substrate, and
wherein the plurality of bonding pads includes a first bonding pad in electrical contact with the first node of the first converter, and a second bonding pad in electrical contact with the second node of the first converter.

19. The imaging device of claim 18, wherein the first and second nodes of the first converter include two of a power supply node that receives a power supply voltage, an output node that outputs an output signal to another component of the first readout circuit, an anode of the first photoelectric conversion region, or a ground node that receives a ground signal or a common signal.

* * * * *